US012598937B2

(12) United States Patent
Lo et al.

(10) Patent No.: US 12,598,937 B2
(45) Date of Patent: Apr. 7, 2026

(54) EPITAXIAL FORMATION WITH TREATMENT AND SEMICONDUCTOR DEVICES RESULTING THEREFROM

(71) Applicant: Taiwan Semiconductor Manufacturing Co., Ltd., Hsinchu (TW)

(72) Inventors: Yi-Chen Lo, Zhubei (TW); Ding-Kang Shih, New Taipei (TW); Tsungyu Hung, Hsinchu (TW); Chia-Ling Pai, Taichung (TW); Pang-Yen Tsai, Jhubei (TW); Li-Te Lin, Hsinchu (TW); Pinyen Lin, Rochester, NY (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 442 days.

(21) Appl. No.: 18/171,508

(22) Filed: Feb. 20, 2023

(65) Prior Publication Data

US 2024/0282569 A1 Aug. 22, 2024

(51) Int. Cl.
H10D 84/00 (2025.01)
H01L 21/02 (2006.01)
(Continued)

(52) U.S. Cl.
CPC .. H01L 21/02068 (2013.01); H01L 21/76843 (2013.01); H01L 21/76861 (2013.01);
(Continued)

(58) Field of Classification Search
CPC ............... H10D 84/013; H10D 84/017; H01L 21/02057; H01L 21/02068; H01L 21/76861; H01L 21/76814
See application file for complete search history.

(56) References Cited

U.S. PATENT DOCUMENTS 11,876,020 B2    1/2024   Schwarzenbach et al.
2012/0280277 A1  11/2012  Scheiper et al.
(Continued)

FOREIGN PATENT DOCUMENTS

TW         202018825 A      5/2020

OTHER PUBLICATIONS

Ishii Y. et al., "Anisotropic selective etching between SiGe and Si," Japanese Journal of Applied Physics, vol. 57, 06JC04 (2018), May 22, 2018, 5 pages.

*Primary Examiner* — Reema Patel
(74) *Attorney, Agent, or Firm* — Slater Matsil, LLP

(57) ABSTRACT

In an embodiment, a method includes forming a first semiconductor fin and a second semiconductor fin over a frontside of a substrate; etching a first recess in the first semiconductor fin and a second recess in the second semiconductor fin; forming a first epitaxial region in the first recess and first epitaxial nodules along sidewalls of the first recess; forming a second epitaxial region in the second recess and second epitaxial nodules along sidewalls of the second recess; flowing first precursors to remove the first epitaxial nodules; depositing an interlayer dielectric over the first epitaxial region and the second epitaxial region; etching a first opening in the interlayer dielectric to expose the first epitaxial region; forming a first epitaxial cap on the first epitaxial region and third epitaxial nodules over the interlayer dielectric; and flowing second precursors to remove the third epitaxial nodules.

20 Claims, 74 Drawing Sheets

(51) Int. Cl.

| | |
|---|---|
| *H01L 21/768* | (2006.01) |
| *H10D 30/01* | (2025.01) |
| *H10D 30/43* | (2025.01) |
| *H10D 62/13* | (2025.01) |
| *H10D 64/01* | (2025.01) |
| *H10D 84/01* | (2025.01) |
| *H10D 84/03* | (2025.01) |
| *H10D 84/85* | (2025.01) |
| *H01L 23/522* | (2006.01) |

(52) U.S. Cl.
CPC ........... *H10D 30/014* (2025.01); *H10D 30/43* (2025.01); *H10D 62/151* (2025.01); *H10D 64/01* (2025.01); *H10D 84/017* (2025.01); *H10D 84/0186* (2025.01); *H10D 84/038* (2025.01); *H10D 84/85* (2025.01); *H01L 23/5226* (2013.01)

(56)               References Cited

U.S. PATENT DOCUMENTS

| | | | |
|---|---|---|---|
| 2017/0179248 A1 | 6/2017 | Pawlak | |
| 2021/0265349 A1 | 8/2021 | Chung et al. | |
| 2022/0293415 A1* | 9/2022 | Lin ..................... | H10D 30/024 |

* cited by examiner

1

EPITAXIAL FORMATION WITH TREATMENT AND SEMICONDUCTOR DEVICES RESULTING THEREFROM

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional challenges arise that may be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
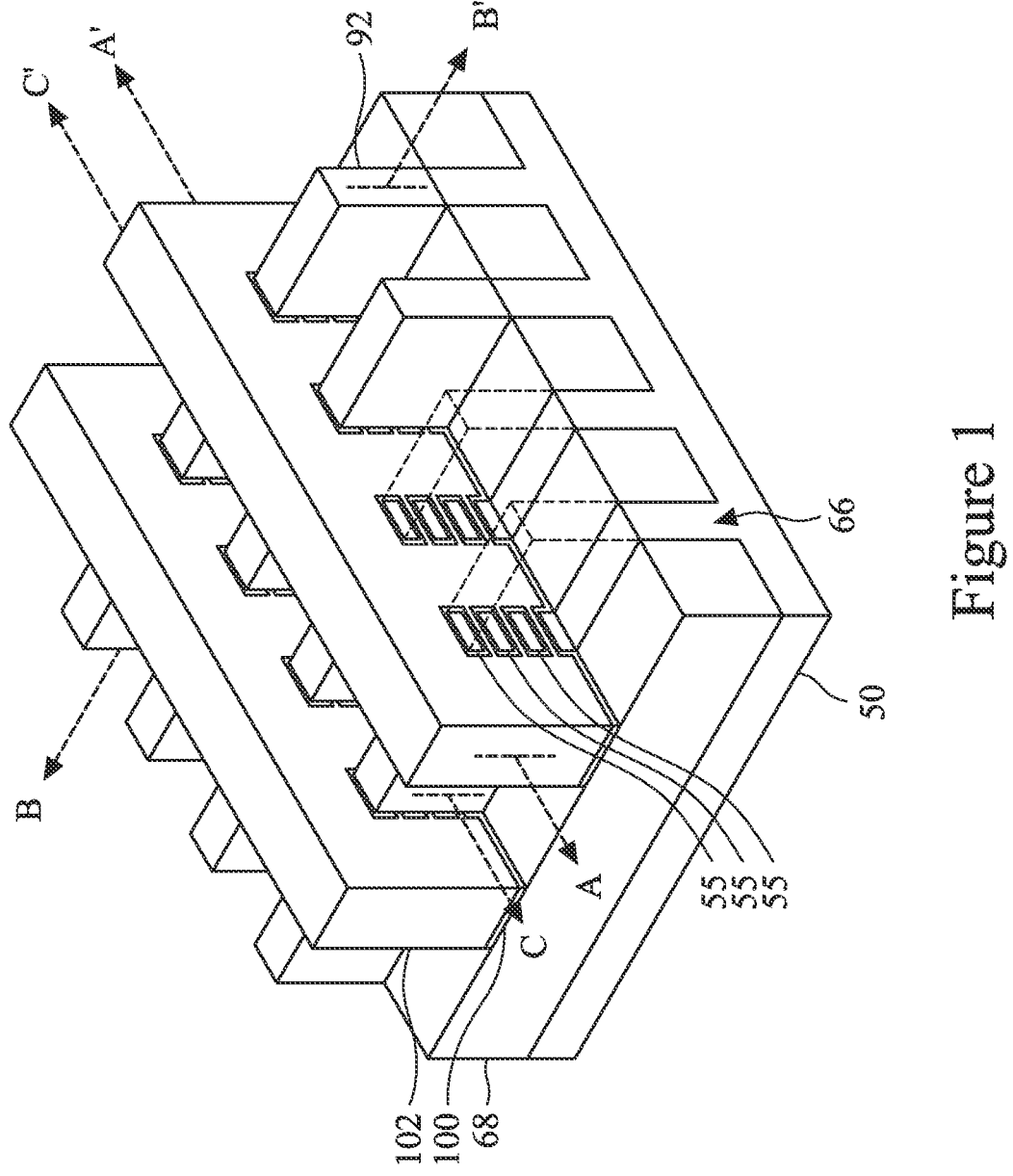
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods for forming a die comprising semiconductor devices, such as nanostructure field-effect transistors (nano-FETs). The methods include forming stacks of semiconductor layers over a front-side of a substrate, etching those stacks, and forming epitaxial source/drain regions therein. In particular, deposition of a crystalline semiconductor material to form of the epitaxial source/drain regions may result in nodules of the semiconductor material depositing in other locations in a non-crystalline (e.g., amorphous and/or polycrystalline) form. One or more cleaning processes may be performed to remove the nodules in such a way that avoids etching or damaging the epitaxial source/drain regions and other exposed features. Gate structures may then be formed over the stacks of semiconductor layers to form transistor structures. In addition, subsequent epitaxial growth processes may also result in nodules, similarly as discussed above. One or more similar cleaning processes may be performed to remove the nodules while preventing damage to the epitaxial source/drain regions and other exposed features. Various embodiments may be applied, however, to other epitaxial processes discussed herein or otherwise as well as to dies comprising other types of transistors (e.g., fin field effect transistors (FinFETs), planar transistors, or the like) in lieu of or in combination with the nano-FETs.

The embodiments may include fabrication of the die at a wafer level, such that active devices such as the transistors are formed along a front-side of a substrate (e.g., a semiconductor substrate), and a front-side interconnect structure may be formed over and electrically connected to the active devices on the front-side. In some embodiments, a back-side interconnect structure may be formed on a back-side of the semiconductor substrate (or after removal of some or all of the semiconductor substrate) and electrically connected to the active devices.

FIG. 1 illustrates an example of nano-FETs (e.g., nanowire FETs, nanosheet FETs (Nano-FETs), or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102. Source/drain region(s) 92 may refer to a source or a drain, individually or collectively dependent upon the context.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is perpendicular to cross-section A-A' and is parallel to a longitudinal axis of a fin 66 of the nano-FET and in a direction of, for example, a current flow between the epitaxial source/drain regions 92 of the nano-FET. Cross-section C-C' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 30C are cross-sectional views of intermediate stages in the manufacturing of nano-FETs, in accordance with some embodiments. FIGS. 2 through 5, 6A, 14A, 15A, 16A, 17A, 18A, 19A, 20A, 21A, 22A, 23A, 24A, 25A, 26A, 27A, 28A, 29A, and 30A illustrate reference cross-section A-A' illustrated in FIG. 1. FIGS. 6B, 7B, 8B, 9B, 10B, 11B, 11C, 12B, 12D, 13B, 13D, 13E, 13F, 14B, 15B, 16B, 17B, 18B, 19B, 20B, 21B, 22B, 23B, 24B, 25B, 26B, 27B, 28B, 29B, and 30B illustrate reference cross-section B-B' illustrated in FIG. 1. FIGS. 7A, 8A, 9A, 10A, 11A, 12A, 12C, 13A, 13C, 14C, 19C, 20C, 21C, 22C, 23C, 24C, 25C, 26C, 27C, 28C, 29C, and 30C illustrate reference cross-section C-C' illustrated in FIG. 1.

Figure 2:
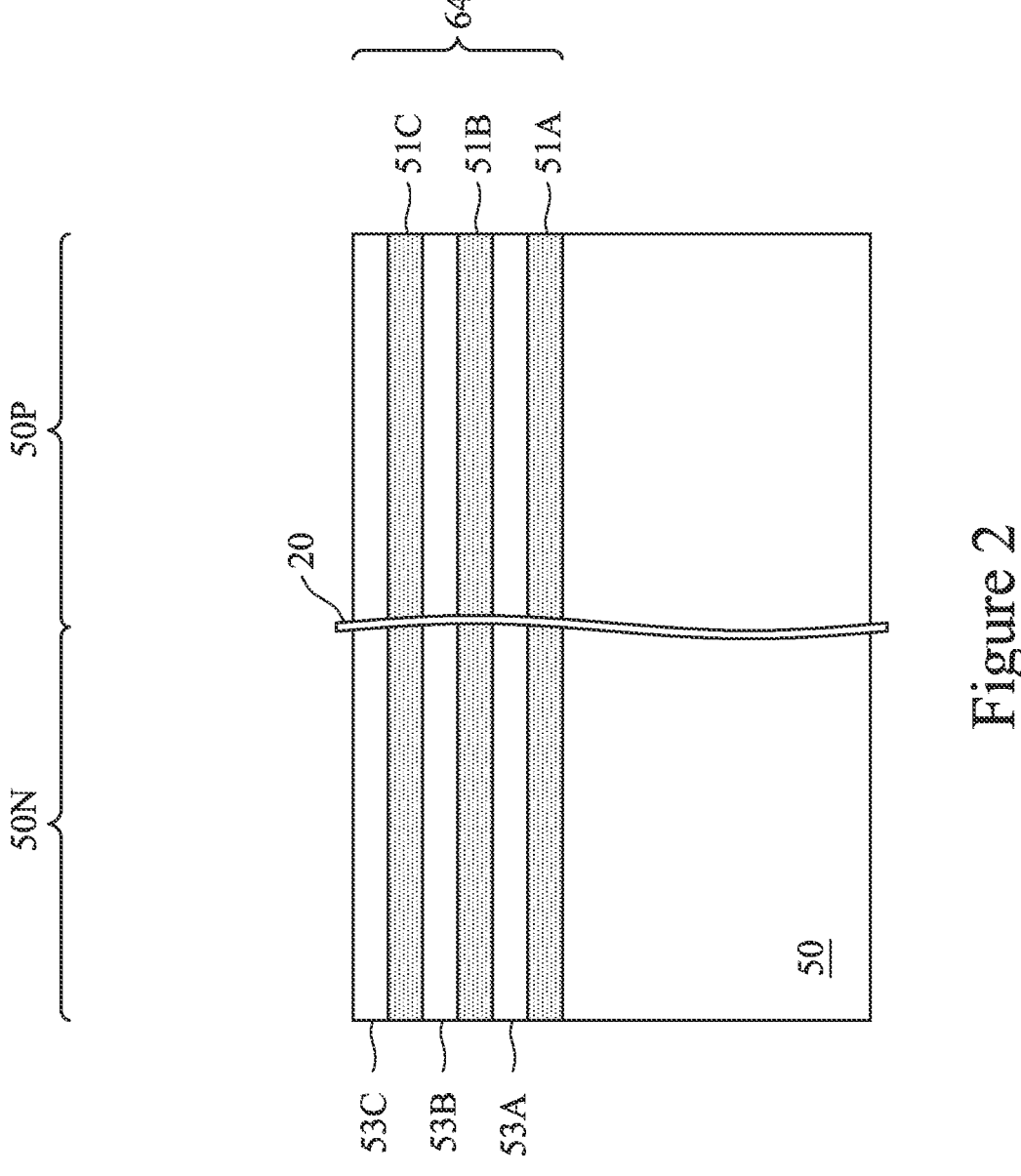
FIGS. 2, 3, 4, 5, 6A, 6B, 7A, 7B 8A, 8B, 9A, 9B, 10A, 10B, 11A, 11B, 11C, 12A, 12B, 12C, 12D, 13A, 13B, 13C, 13D, 13E, 13F, 14A, 14B, 14C, 15A, 15B, 16A, 16B, 17A, 17B, 18A, 18B, 19A, 19B, 19C, 20A, 20B, 20C, 21A, 21B, 21C, 22A, 22B, 22C, 23A, 23B, 23C, 24A, 24B, 24C, 25A, 25B, 25C, 26A, 26B, 26C, 27A, 27B, 27C, 28A, 28B, 28C, 29A, 29B, and 29C are cross-sectional views of intermediate stages in the manufacturing of nano-FETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. In accordance with some embodiments, the substrate 50 is an SOI substrate. Generally, an SOI substrate is a layer of a semiconductor material formed on an insulator layer (see, e.g., insulator layer 140 illustrated in FIGS. 27A-30C). The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., NFETs such as n-type nano-FETs, and the p-type region 50P can be for forming p-type devices, such as PMOS transistors, e.g., PFETs such as p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nano-FETs in the p-type region 50P. Also, the first semiconductor layers 51 will be removed and the second semiconductor layers 53 will be patterned to form channel regions of nano-FETs in the n-type region 50N. Nevertheless, in some embodiments, the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type region 50P.

Figure 30A:
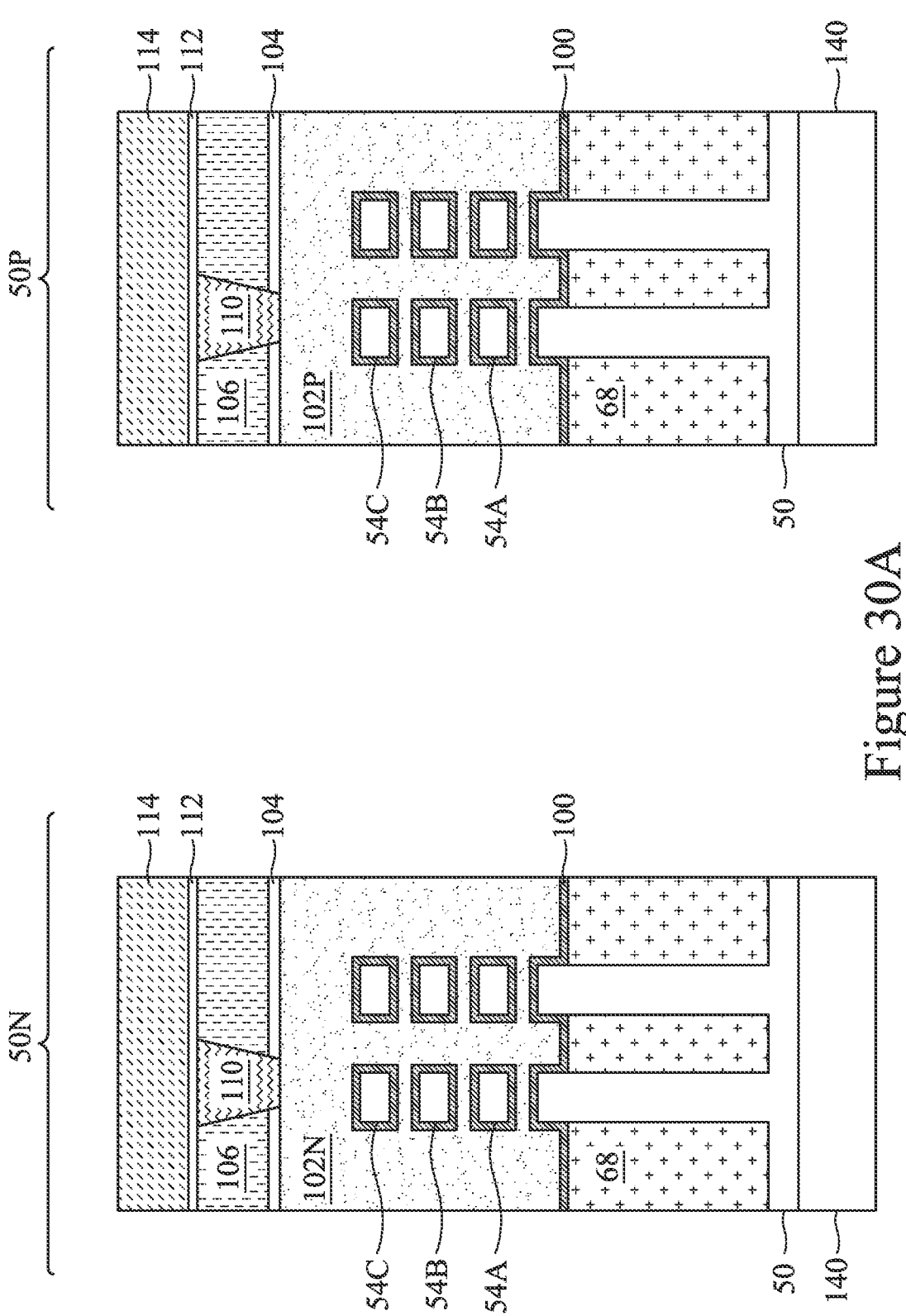
FIGS. 30A, 30B, and 30C are cross-sectional views of intermediate stages in the manufacturing of a nano-FET, in accordance with some embodiments.
Figure 30B:
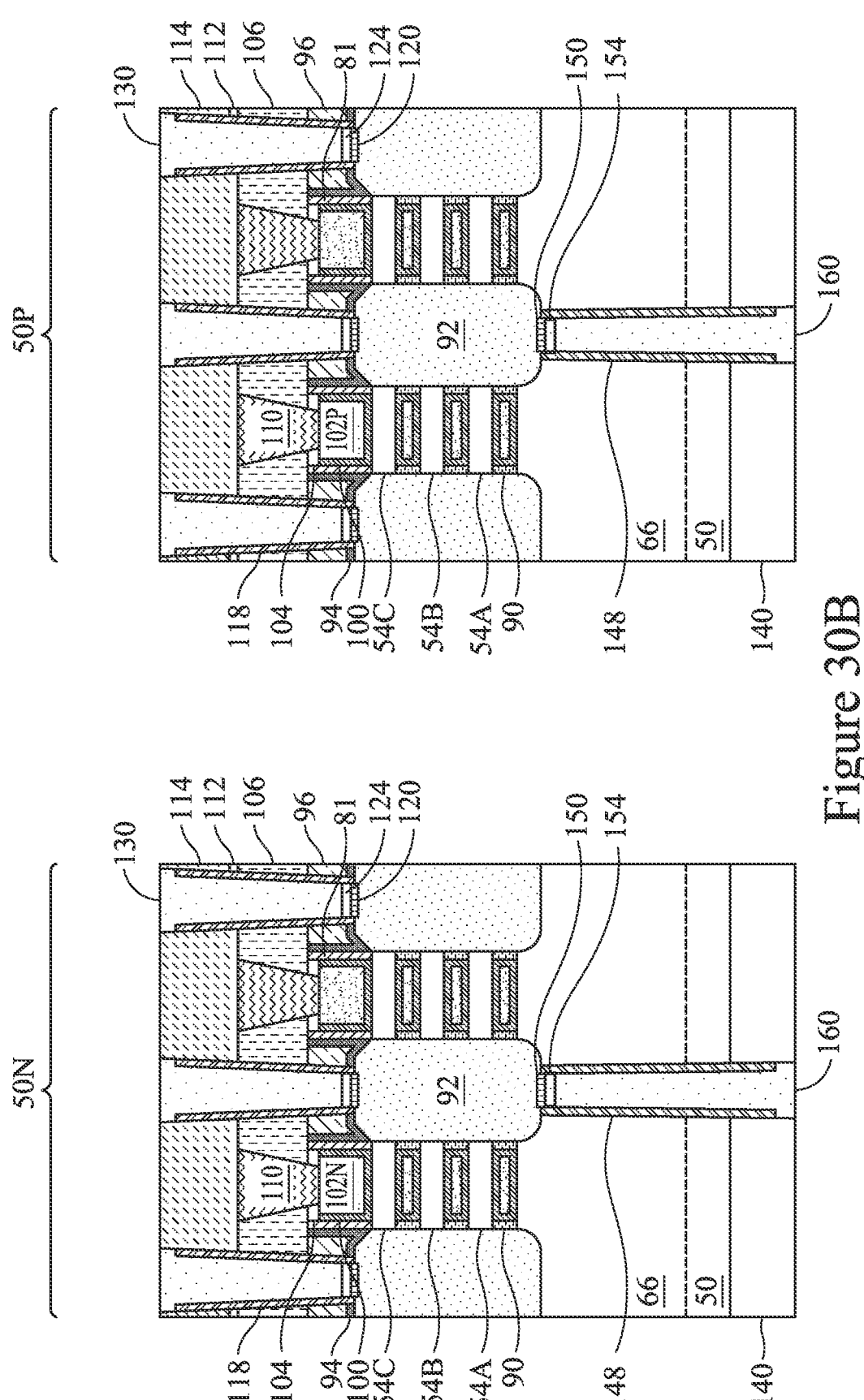
Figure 30C:
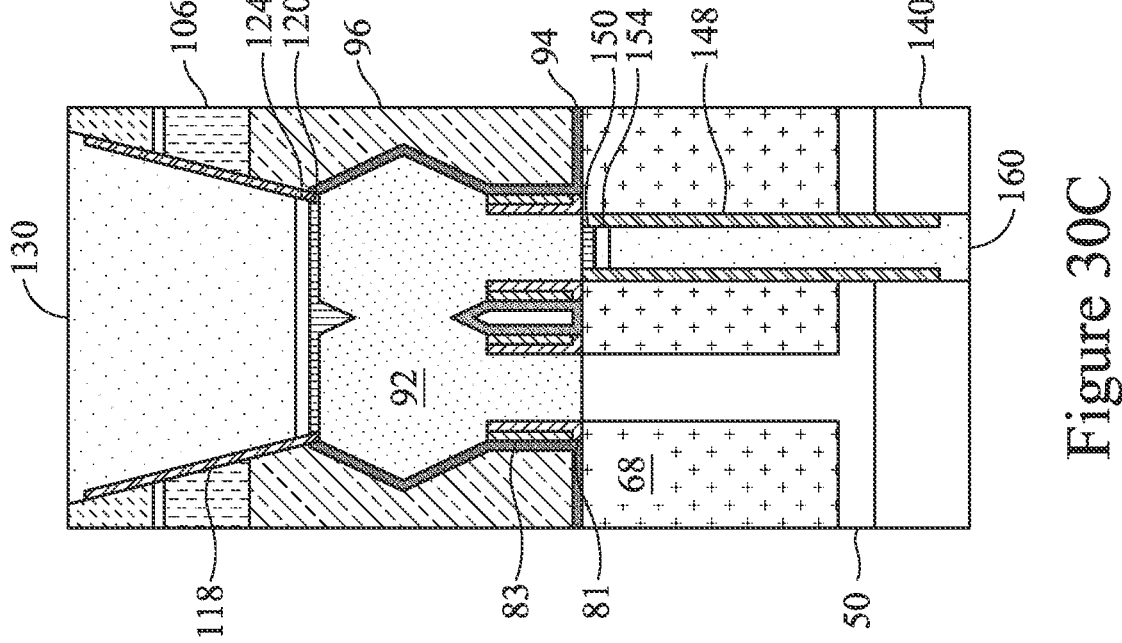

In still other embodiments, the first semiconductor layers 51 may be removed and the second semiconductor layers 53 may be patterned to form channel regions of nano-FETS in both the n-type region 50N and the p-type region 50P. In other embodiments, the second semiconductor layers 53 may be removed and the first semiconductor layers 51 may be patterned to form channel regions of nano-FETs in both the n-type region 50N and the p-type region 50P. In such embodiments, the channel regions in both the n-type region 50N and the p-type region 50P may have a same material composition (e.g., silicon, or the another semiconductor material) and be formed simultaneously. FIGS. 30A, 30B, and 30C illustrate a structure resulting from such embodiments where the channel regions in both the p-type region 50P and the n-type region 50N comprise silicon, for example.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium, or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material in the n-type region 50N, thereby allowing the second semiconductor layers 53 to be patterned to form channel regions of n-type nano-FETs. Similarly, the second semiconductor layers 53 of the second semiconductor material may be removed without significantly removing the first semiconductor layers 51 of the first semiconductor material in the p-type region 50P, thereby allowing the first semiconductor layers 51 to be patterned to form channel regions of p-type nano-FETs.

Figure 3:
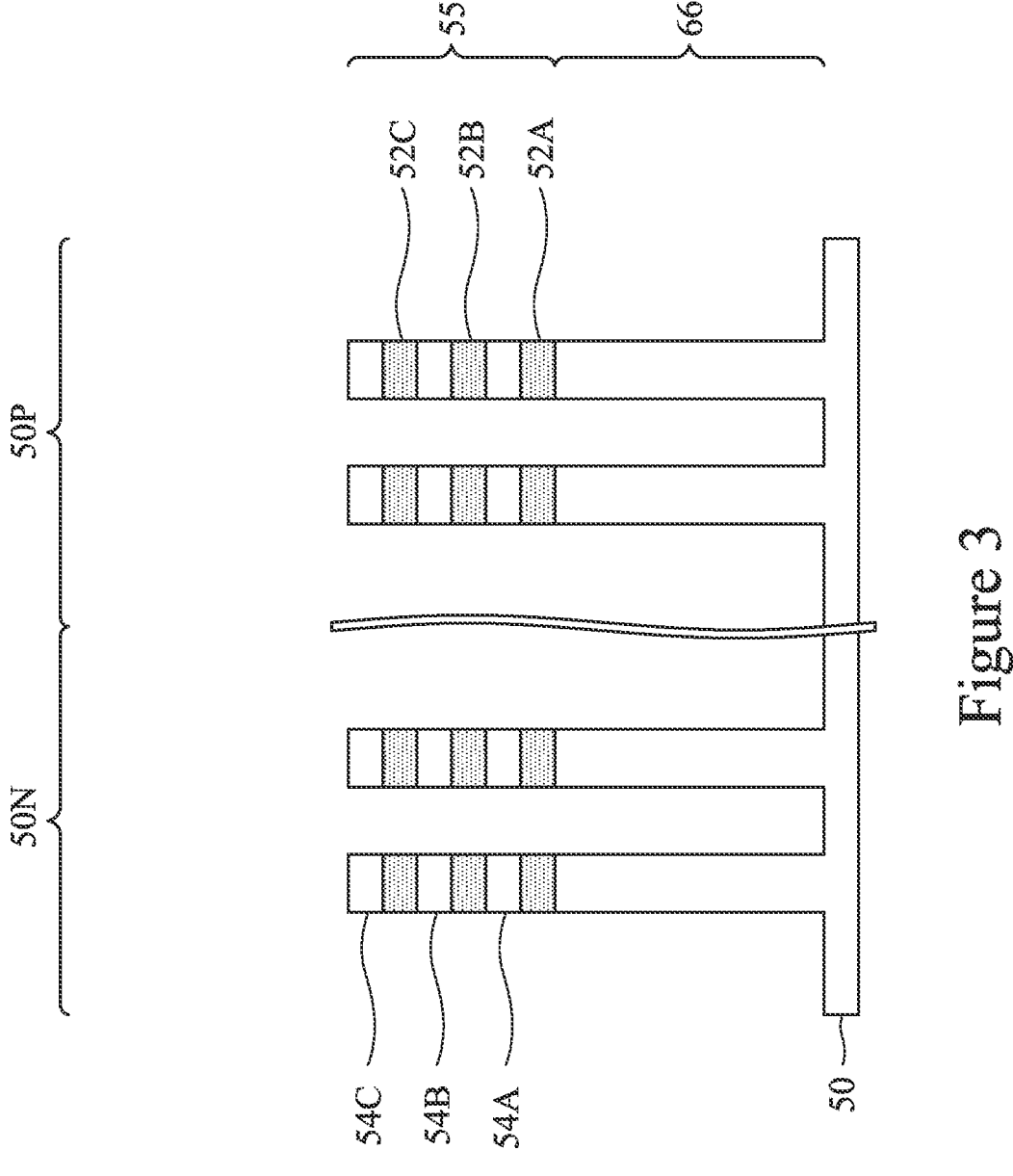

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and define second nanostructures 54A-C (collectively referred to as the second nanostructures 54) from the second semiconductor layers 53. The first nanostructures 52 and the second nanostructures 54 may further be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
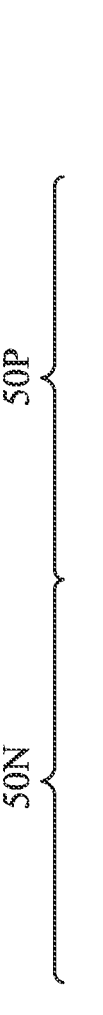
Figure 4:
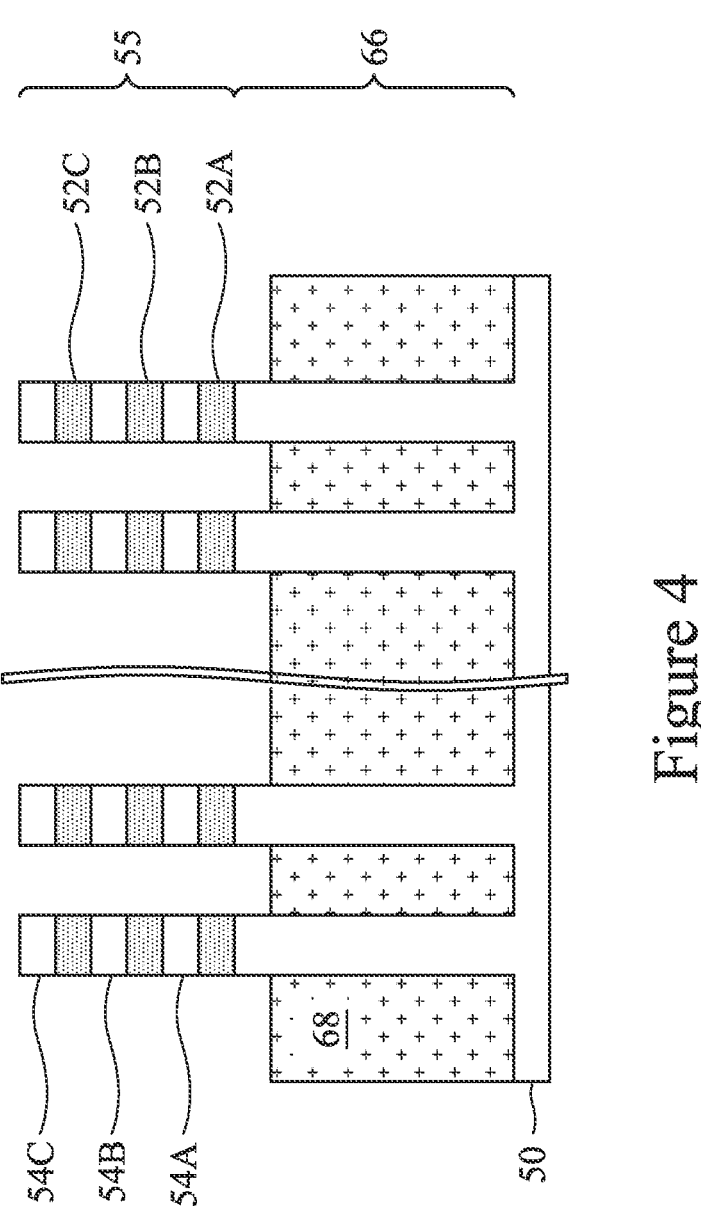

In FIG. 4, shallow trench isolation (STI) regions 68 (e.g., isolation regions) are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66, the nanostructures 55, and STI regions 68 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal process may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
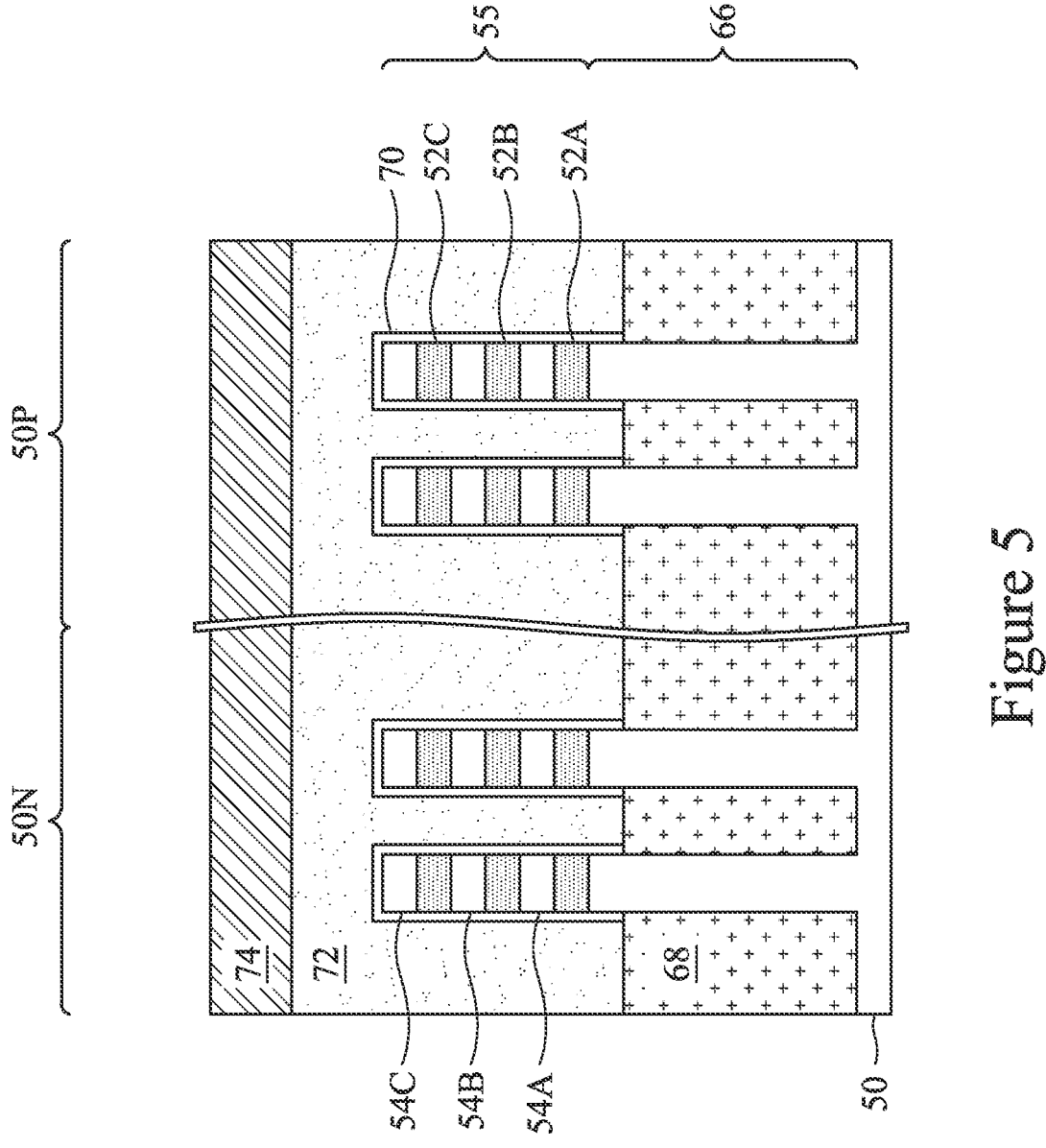

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), polycrystalline silicon germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6A:
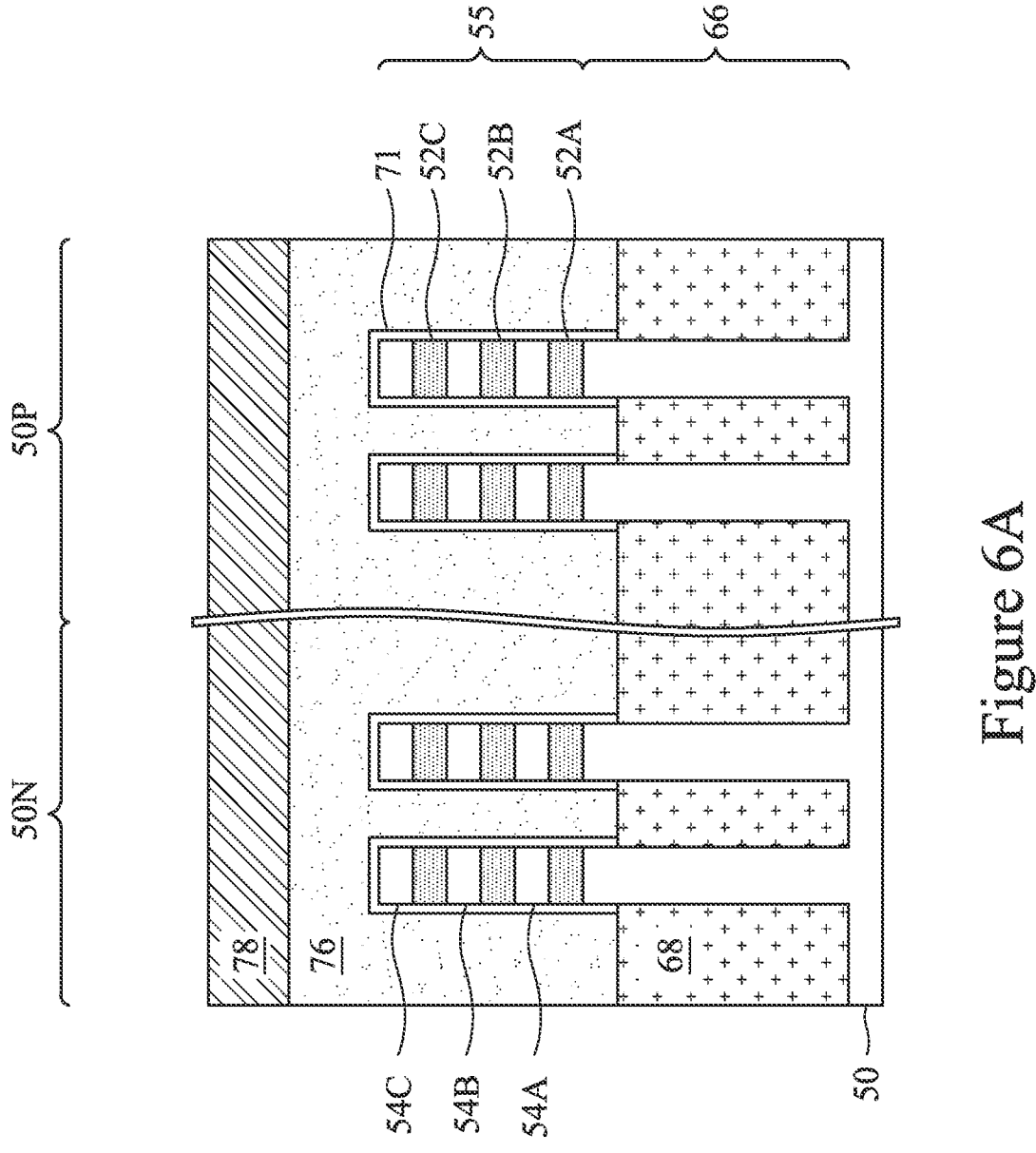
Figure 6B:
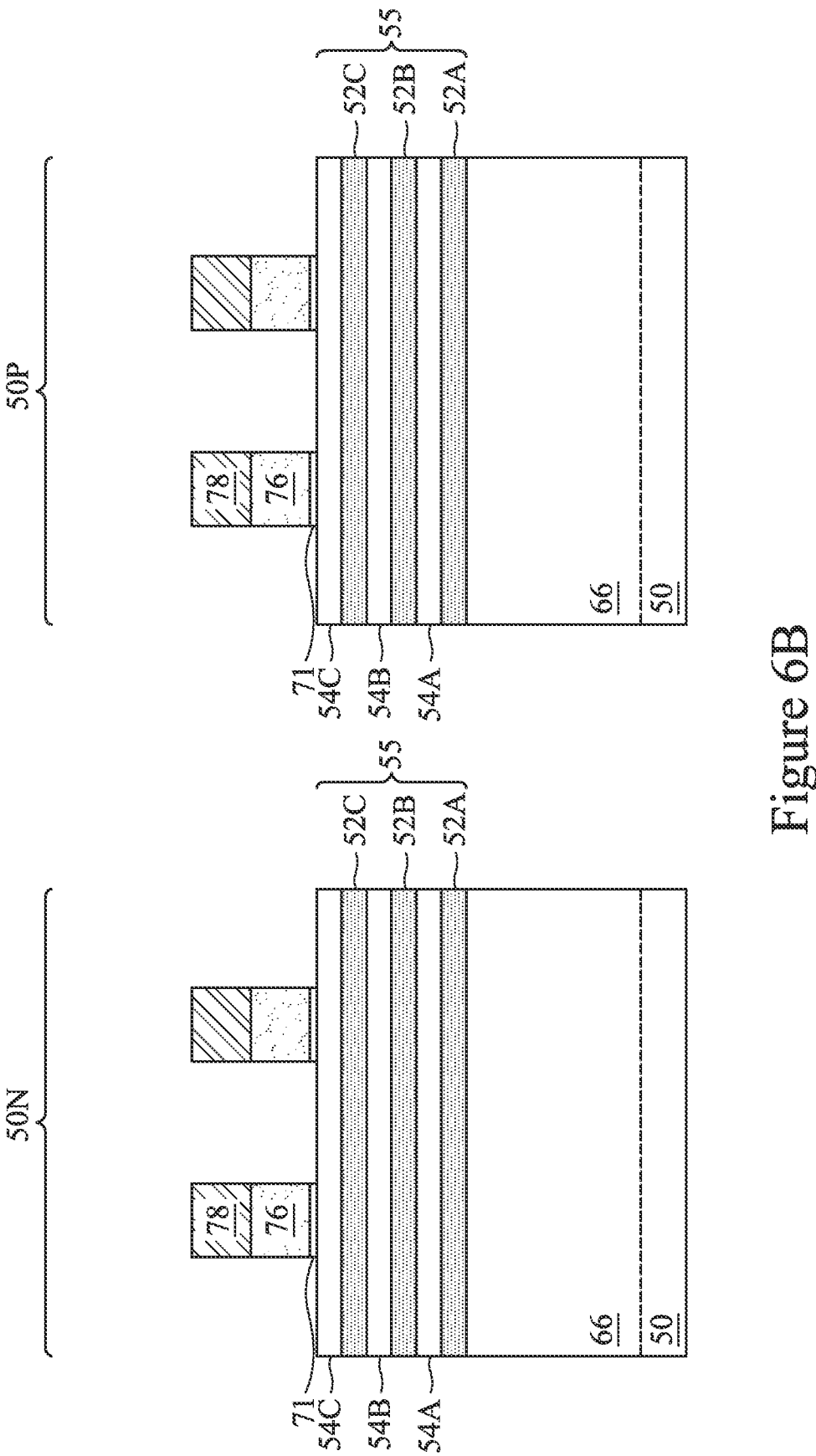

FIGS. 6A through 29C illustrate various additional steps in the manufacturing of embodiment devices. FIGS. 6A, 7A, 8A, 9A, 10A, 11A, 12A, 12C, 13A, 13C, 14A, 14C, 15A, 15C, 16A, 19C, 20C, 21C, 22C, 23C, 24C, 25C, 26C, 27C, 28C, and 29C illustrate features in either the regions 50N or the regions 50P. In FIGS. 6A and 6B, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7A:
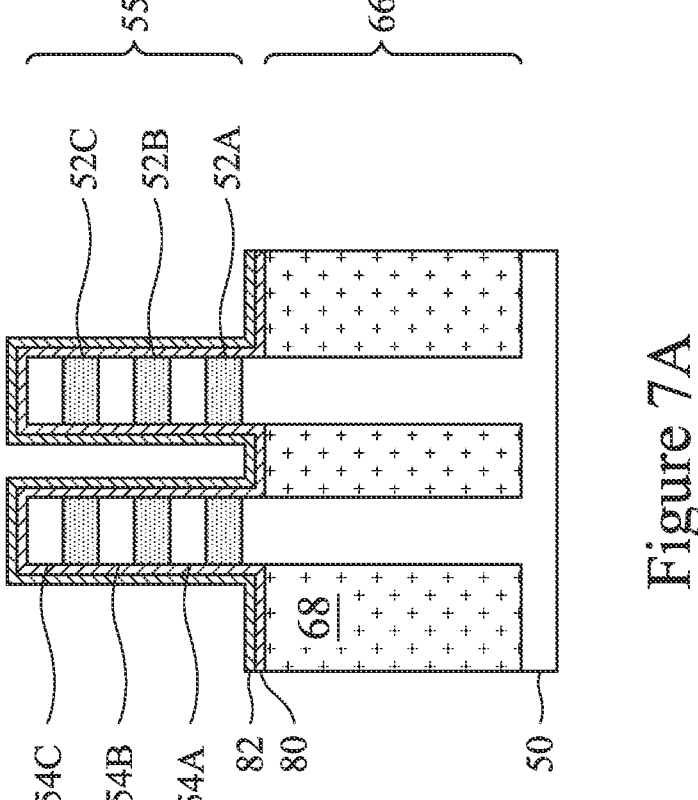
Figure 7B:
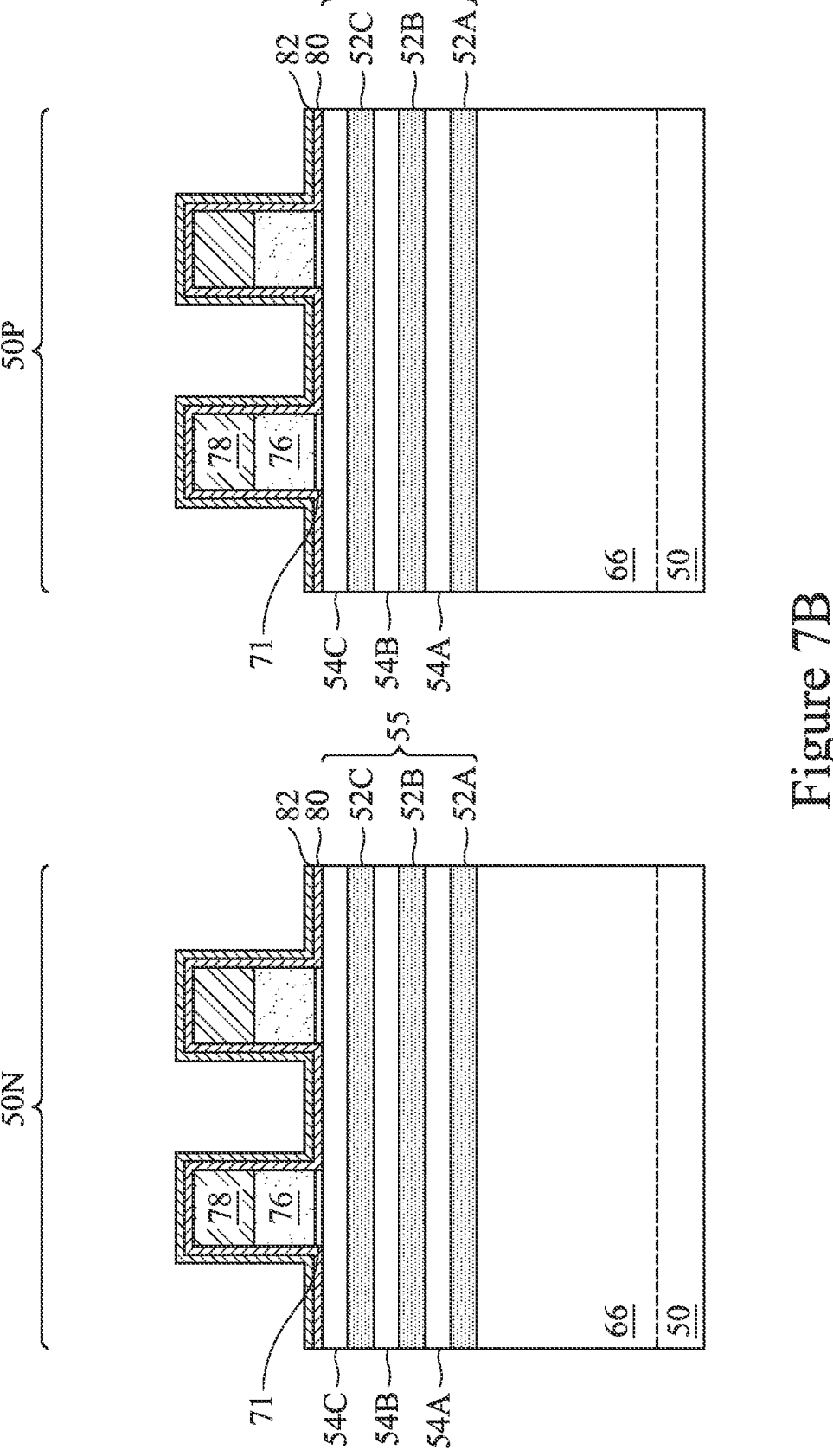

In FIGS. 7A and 7B, a first spacer layer 80 and a second spacer layer 82 are formed over the structures illustrated in FIGS. 6A and 6B, respectively. The first spacer layer 80 and the second spacer layer 82 will be subsequently patterned to act as spacers for forming self-aligned source/drain regions. In FIGS. 7A and 7B, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, silicon oxycarbonitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, silicon oxycarbonitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $10^{15}$ atoms/cm$^3$ to about $10^{19}$ atoms/cm$^3$. An anneal process may be used to repair implant damage and to activate the implanted impurities.

Figure 8A:
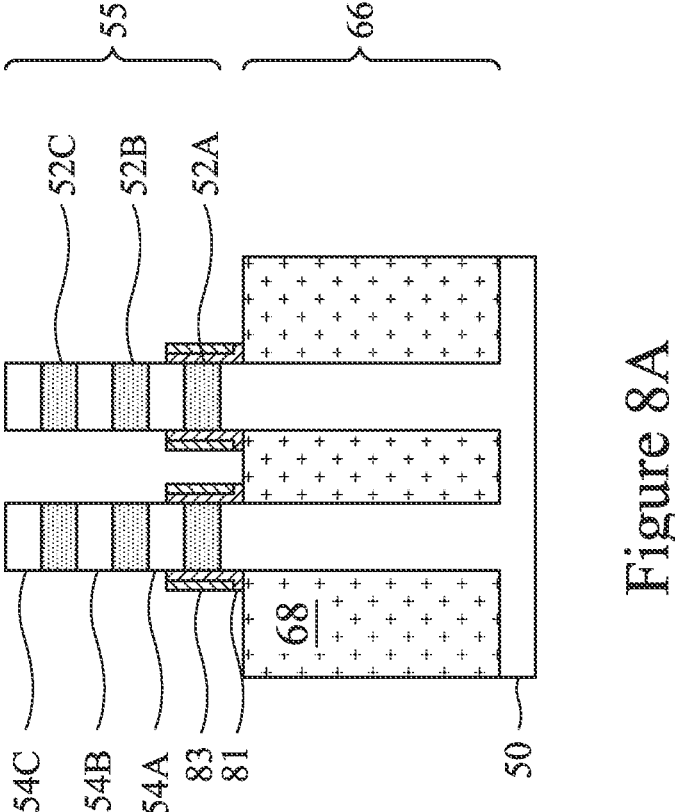
Figure 8B:
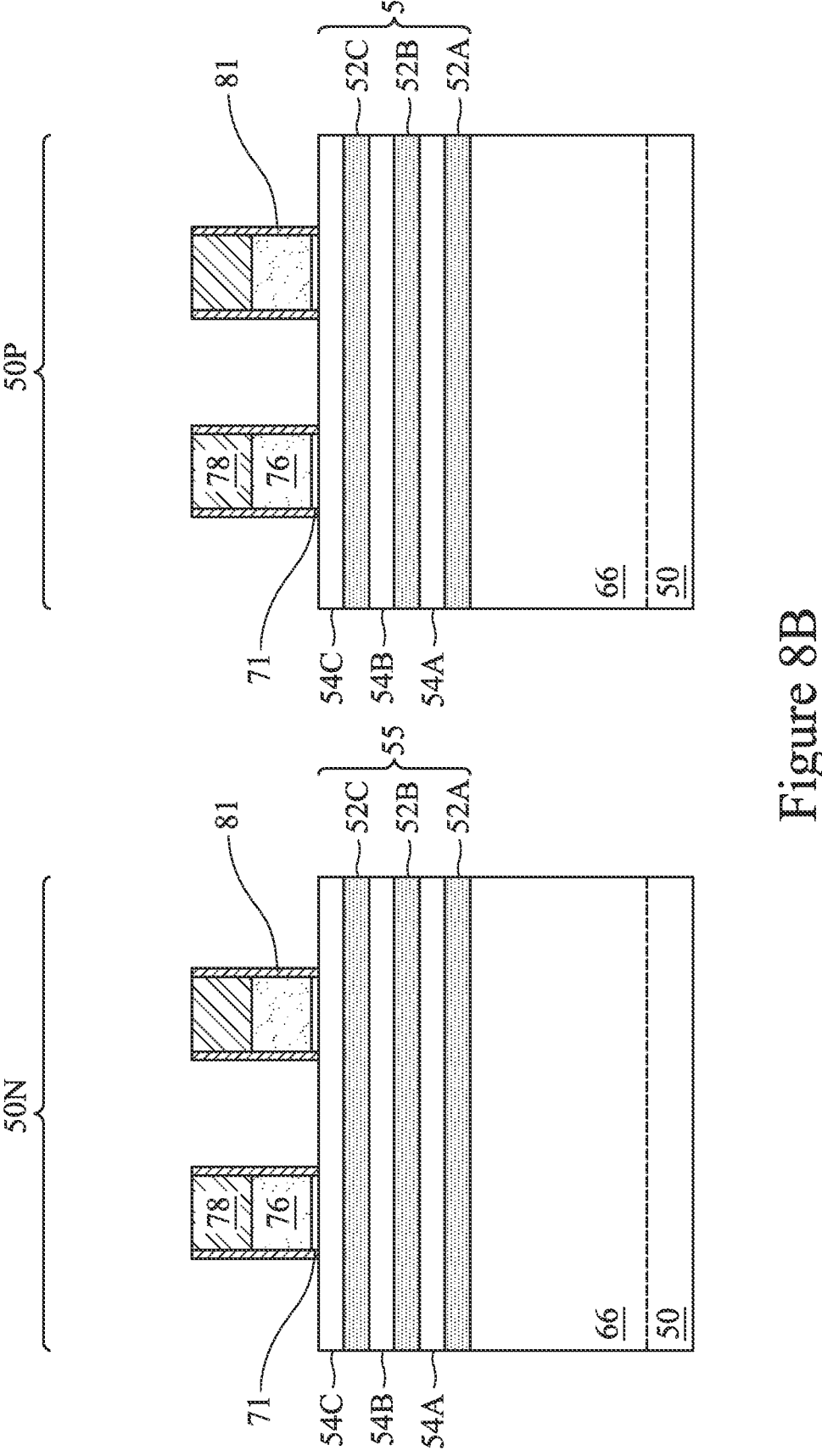

In FIGS. 8A and 8B, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 acts as a mask while etching exposed portions of the first spacer layer 80, thereby forming first spacers 81 as illustrated in FIG. 8A.

As illustrated in FIG. 8A, the first spacers 81 and the second spacers 83 are disposed on sidewalls of the fins 66 and/or nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy dielectric layers 70. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9A:
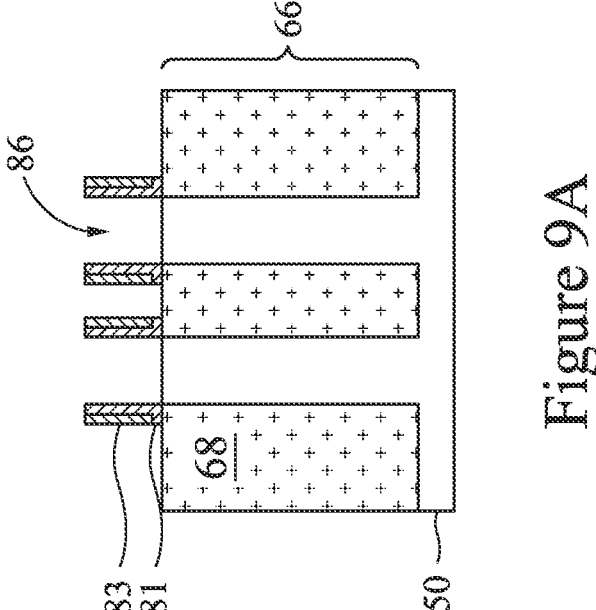
Figure 9B:
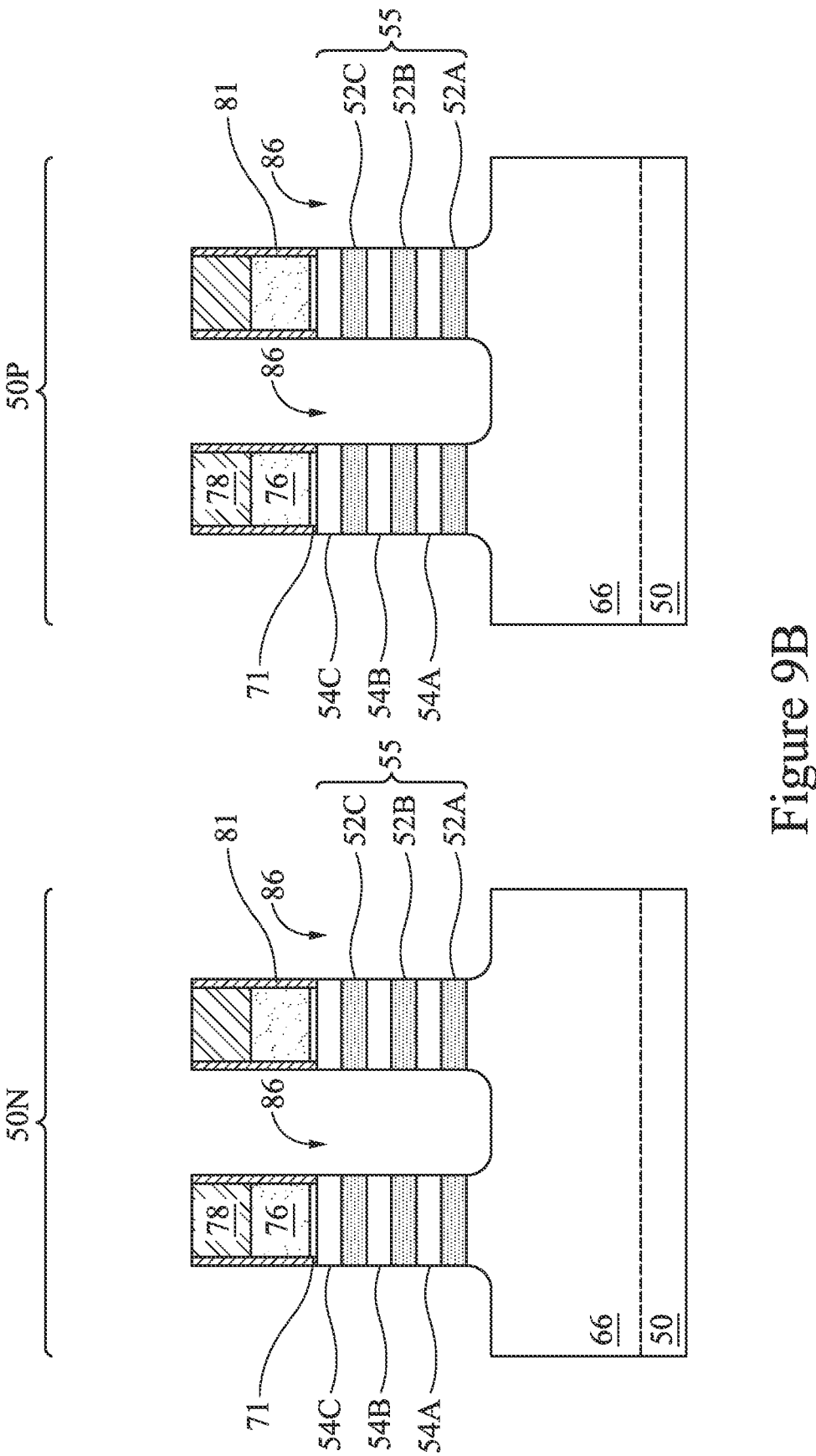

In FIGS. 9A and 9B, first recesses 86 are formed in the fins 66, the nanostructures 55, and the substrate 50, in accordance with some embodiments. Epitaxial source/drain regions will be subsequently formed in the first recesses 86. The first recesses 86 may extend through the first nanostructures 52 and the second nanostructures 54, and into the substrate 50. As illustrated in FIG. 9A, top surfaces of the STI regions 58 may be level with bottom surfaces of the first recesses 86. In various embodiments, the fins 66 may be etched such that bottom surfaces of the first recesses 86 are disposed below the top surfaces of the STI regions 68; or the like. The first recesses 86 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

Figure 10A:
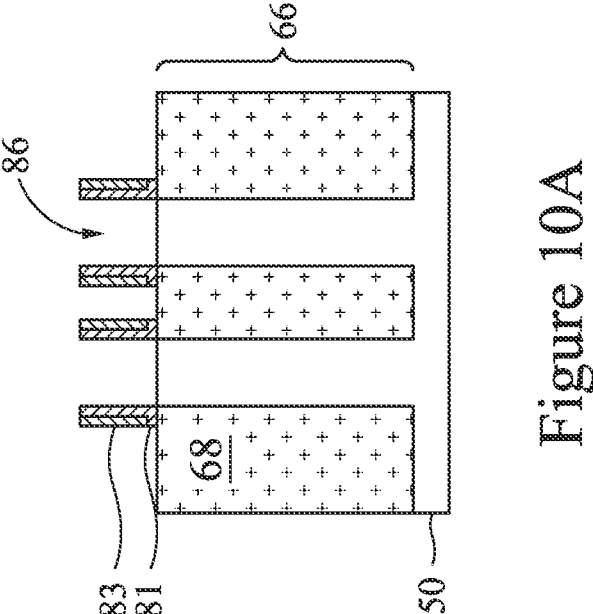
Figure 10B:
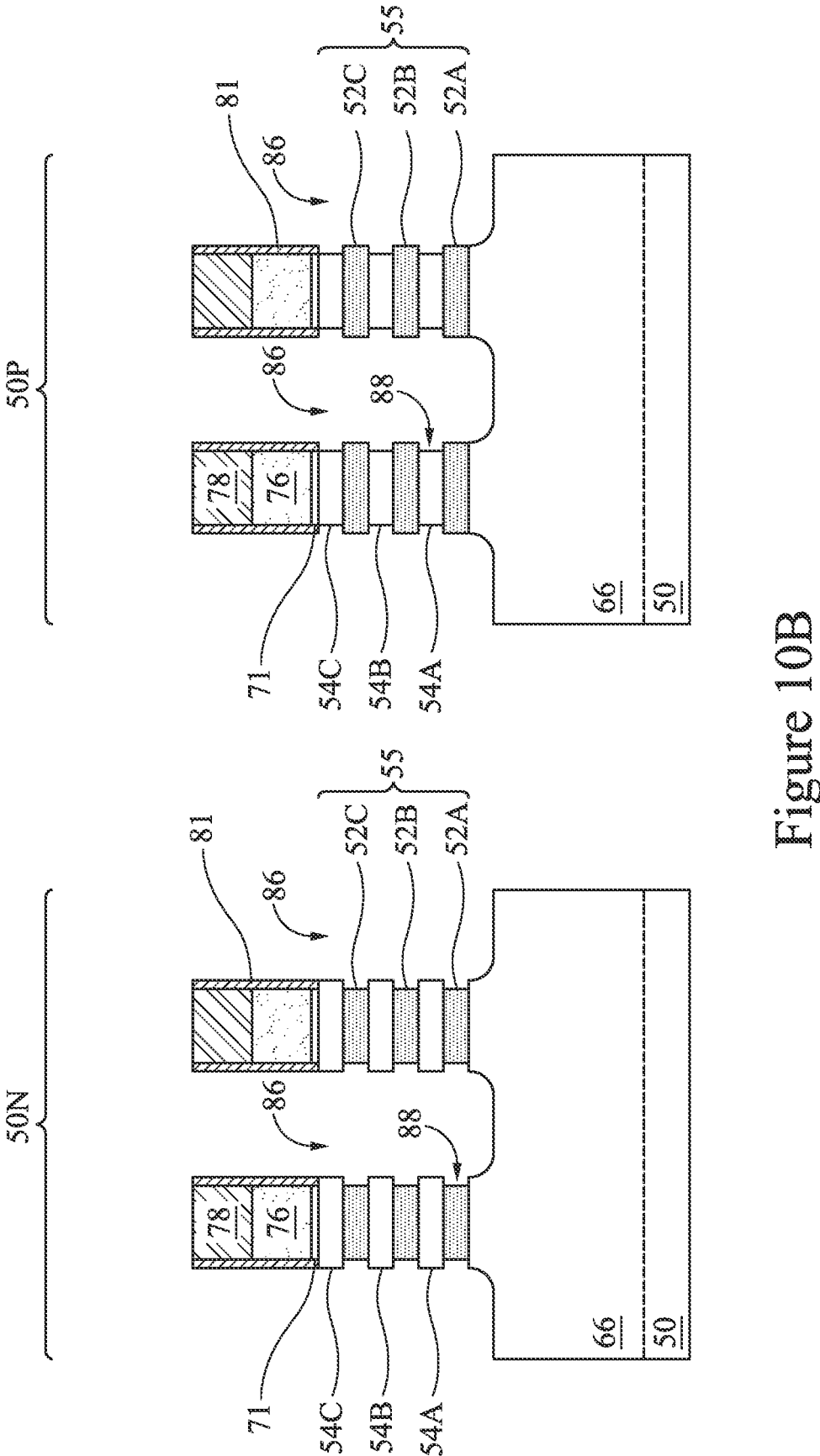

In FIGS. 10A and 10B, portions of sidewalls of the layers of the nanostructures 55 formed of the first semiconductor materials (e.g., the first nanostructures 52) exposed by the first recesses 86 are etched to form sidewall recesses 88 in the n-type region 50N, and portions of sidewalls of the layers of the nanostructures 55 formed of the second semiconductor materials (e.g., the second nanostructures 54) exposed by the first recesses 86 are etched to form sidewall recesses 88 in the p-type region 50P. Although sidewalls of the first nanostructures 52 and the second nanostructures 54 in sidewall recesses 88 are illustrated as being straight in FIG. 10B, the sidewalls may be concave or convex. The sidewalls may be etched using isotropic etching processes, such as wet etching or the like. The p-type region 50P may be protected using a mask (not shown) while etchants selective to the first semiconductor materials are used to etch the first nanostructures 52 such that the second nanostructures 54 and the substrate 50 remain relatively unetched as compared to the first nanostructures 52 in the n-type region 50N. Similarly, the n-type region 50N may be protected using a mask (not shown) while etchants selective to the second semiconductor materials are used to etch the second nanostructures 54 such that the first nanostructures 52 and the substrate 50 remain relatively unetched as compared to the second nanostructures 54 in the p-type region 50P. In an embodiment in which the first nanostructures 52 include, e.g., SiGe, and the second nanostructures 54 include, e.g., Si or SiC, a dry etch process with tetramethylammonium hydroxide (TMAH), ammonium hydroxide (NH$_4$OH), or the like may be used to etch sidewalls of the first nanostructures 52 in the n-type region 50N, and a wet or dry etch process with hydrogen fluoride, another fluorine-based etchant, or the like may be used to etch sidewalls of the second nanostructures 54 in the p-type region 50P.

Figure 11A:
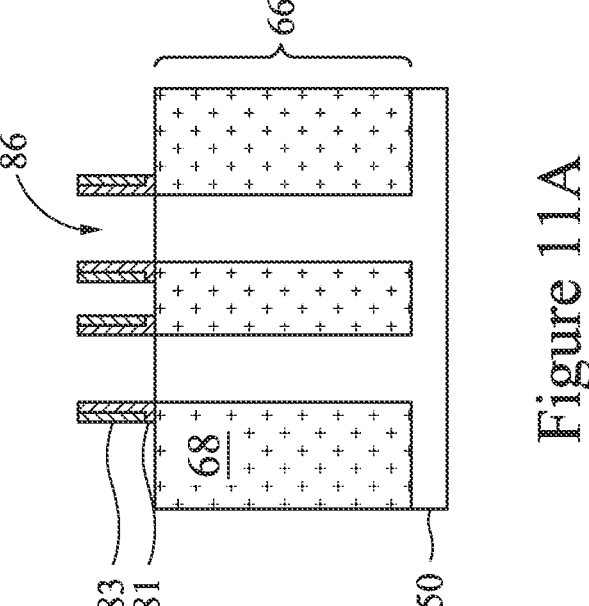
Figure 11B:
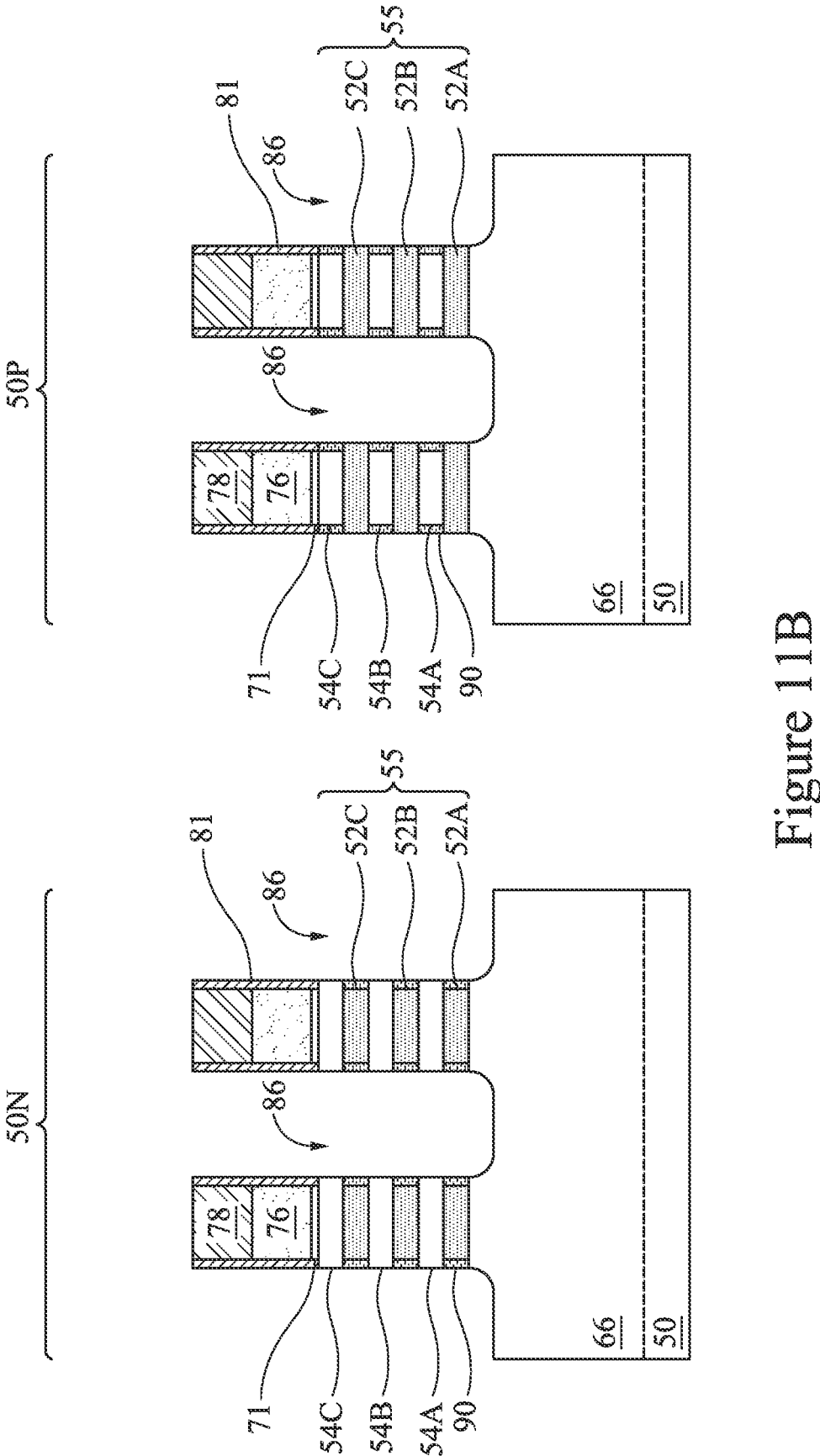
Figure 11C:
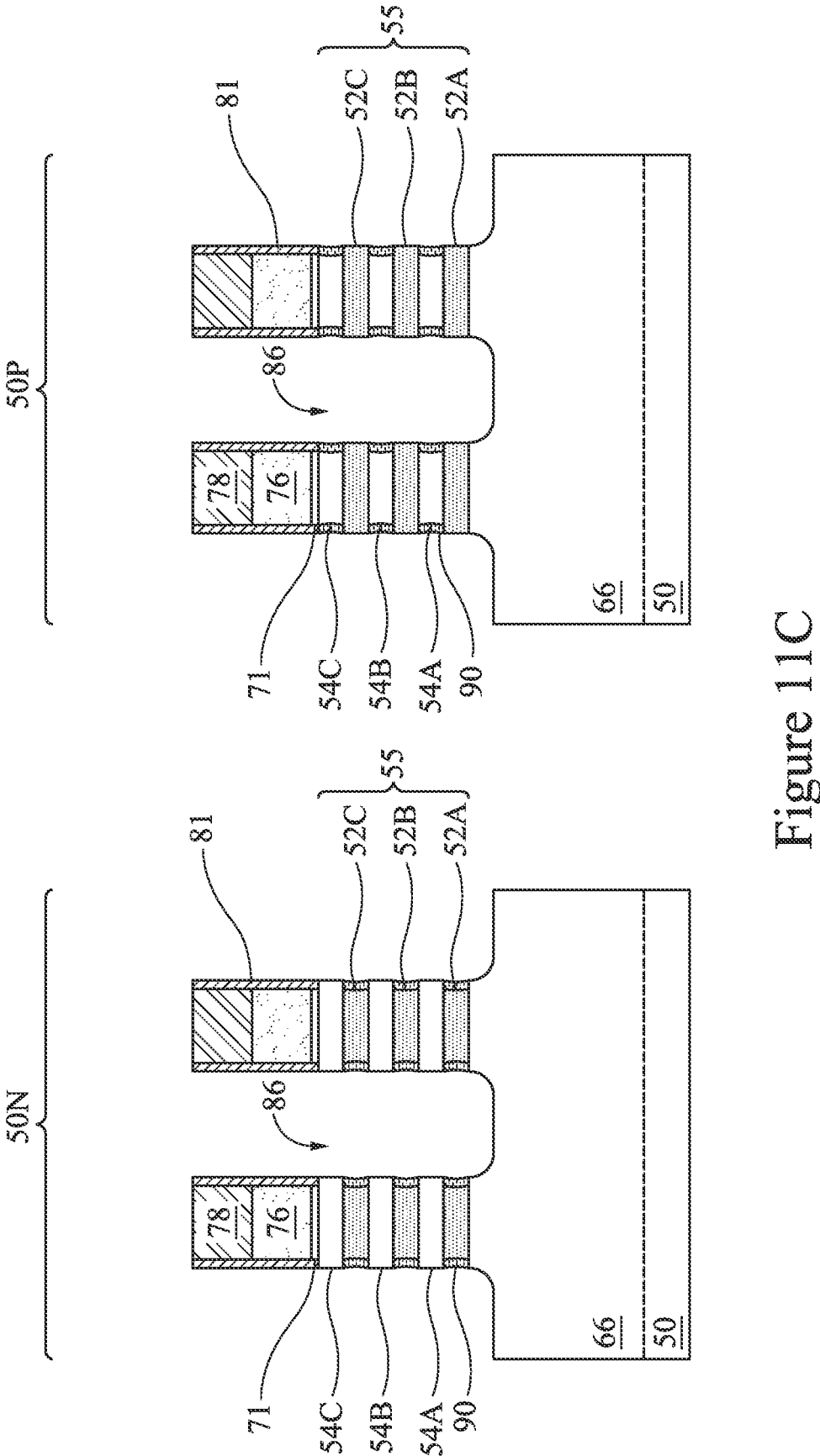

In FIGS. 11A-11C, first inner spacers 90 are formed in the sidewall recess 88. The first inner spacers 90 may be formed by depositing an inner spacer layer (not separately illustrated) over the structures illustrated in FIGS. 10A and 10B. The first inner spacers 90 act as isolation features between subsequently formed source/drain regions and a gate structure. As will be discussed in greater detail below, source/drain regions will be formed in the first recesses 86, while the first nanostructures 52 in the n-type region 50N and the second nanostructures 54 in the p-type region 50P will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54 in the n-type region 50N and flush with the sidewalls of the first nanostructures 52 in the p-type region 50P, the outer sidewalls of the first inner spacers 90 may extend beyond or be recessed from sidewalls of the second nanostructures 54 and/or the first nanostructures 52, respectively.

Moreover, although the outer sidewalls of the first inner spacers 90 are illustrated as being straight in FIG. 11B, the outer sidewalls of the first inner spacers 90 may be concave or convex. As an example, FIG. 11C illustrates an embodiment in which sidewalls of the first nanostructures 52 are concave, outer sidewalls of the first inner spacers 90 are concave, and the first inner spacers 90 are recessed from sidewalls of the second nanostructures 54 in the n-type region 50N. Also illustrated are embodiments in which sidewalls of the second nanostructures 54 are concave, outer sidewalls of the first inner spacers 90 are concave, and the first inner spacers 90 are recessed from sidewalls of the first nanostructures 52 in the p-type region 50P. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A-12C) by subsequent etching processes, such as etching processes used to form gate structures.

In FIGS. 12A-12D, epitaxial source/drain regions 92 are formed in the first recesses 86, and nodules 92N of epitaxial material (which may also be referred to as epitaxial material nodules or epitaxial nodules) may form on other surfaces within the n-type region 50N and nodules 92P may form on other surfaces within the p-type region 50P. The nodules 92N (e.g., in the n-type region 50N) and the nodules 92P (e.g., in the p-type region 50P) may be non-crystalline (e.g., amorphous and/or polycrystalline) comprising the same epitaxial material forming the epitaxial source/drain regions 92 in the n-type region 50N and the p-type region 50P, respectively.

Figure 12A:
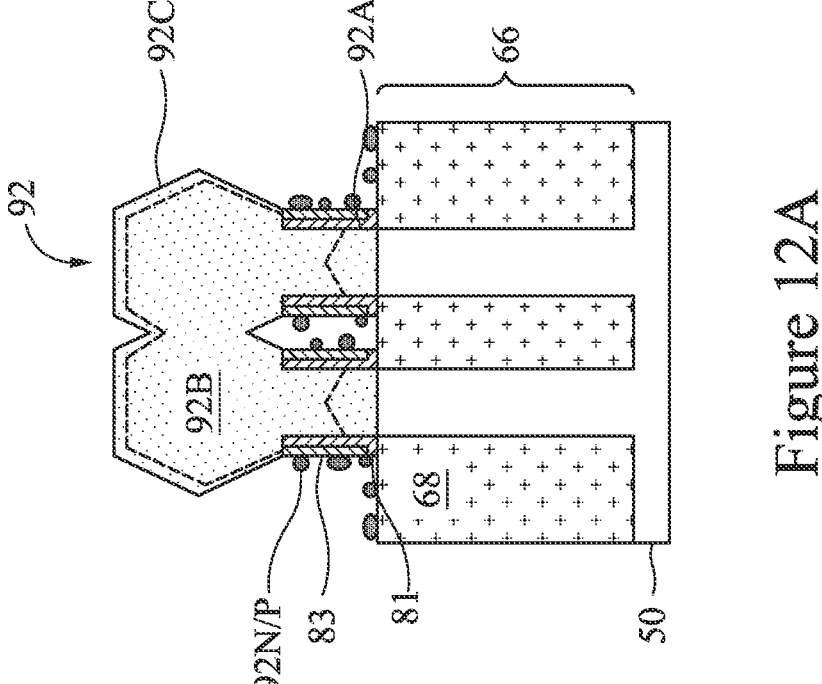
Figure 12B:
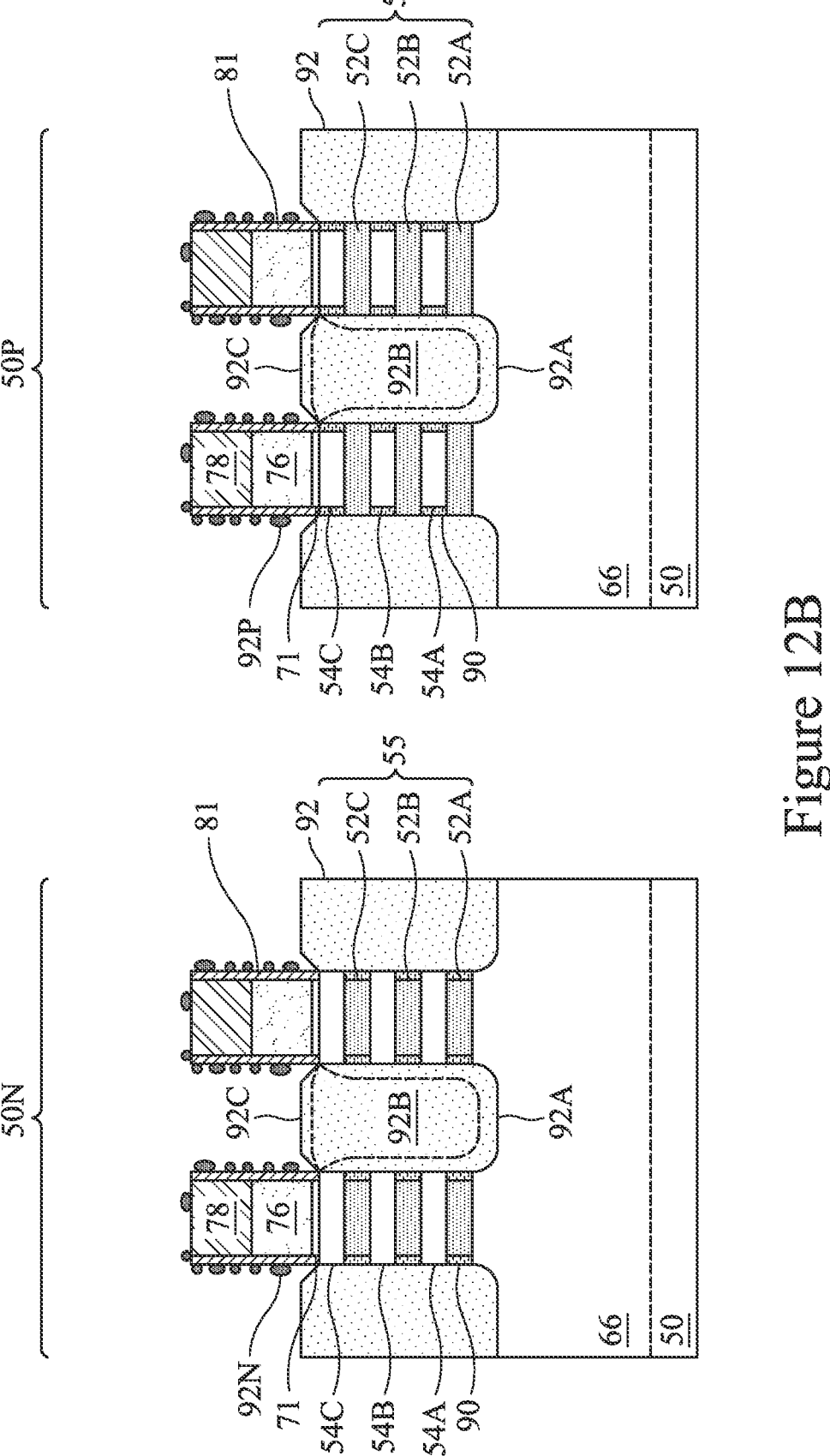

In some embodiments, the source/drain regions 92 may exert stress on the second nanostructures 54 in the n-type region 50N and on the first nanostructures 52 in the p-type region 50P, thereby improving performance. As illustrated in FIG. 12B, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous-doped silicon, phosphorous-doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon germanium, boron-doped silicon germanium, germanium, germanium tin, or the like. The epitaxial source/drain regions 92 may also have surfaces raised from respective surfaces of the nanostructures 55 and may have facets.

In accordance with some embodiments, the nodules 92N (e.g., small clusters of the corresponding epitaxial material) may grow over exposed gate structures in the n-type region 50N during formation of the epitaxial source/drain regions 92 in the n-type region 50N. Similarly, the nodules 92P (e.g., small clusters of the corresponding epitaxial material) may grow over exposed gate structures in the p-type region 50P during formation of the epitaxial source/drain regions 92 in the p-type region 50P. In particular, the nodules 92N, 92P may form along exposed surfaces of the gate structures (e.g., the first spacers 81, the second spacers 83, the masks 78) and exposed surfaces of the STI regions 68. For example, the nodules 92N may include silicon, phosphorous-doped silicon, any other materials of the corresponding epitaxial source/drain regions 92, or any combinations thereof. Similarly, the nodules 92P may include silicon germanium, boron-doped silicon germanium, any other materials of the corresponding source/drain regions (e.g., silicon may be used for the first semiconductor material layer 92A), or any combinations thereof. As illustrated, each of the epitaxial source/drain regions 92 forms to become one continuous material, while the nodules 92N, 92P form as discontinuous clusters or discontinuous nodules. As discussed above, in some embodiments, some or all of the nodules 92N, 92P may be polycrystalline, amorphous, or combinations thereof.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal process. The source/drain regions may have an impurity concentration of between about $10^{19}$ atoms/cm$^3$ and about $10^{21}$ atoms/cm$^3$. The n-type and/or p-type impurities for source/drain regions may be any of the impurities previously discussed. In some embodiments, the epitaxial source/drain regions 92 may be in situ doped during growth. In some embodiments, the epitaxial source/drain regions 92 are implanted with dopants following the cleaning processes discussed below (see FIGS. 13A-13F).

Figure 12C:
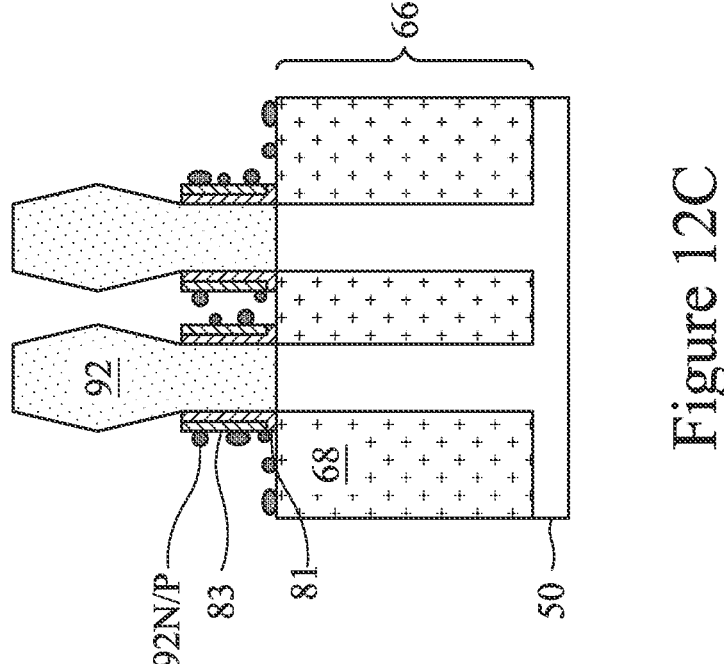

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nano-FET to merge as illustrated by FIG. 12A. In other embodiments, adjacent epitaxial source/drain regions 92 remain separated after the epitaxy process is completed as illustrated by FIG. 12C. In the embodiments illustrated in FIGS. 12A and 12C, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 58.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 12D:
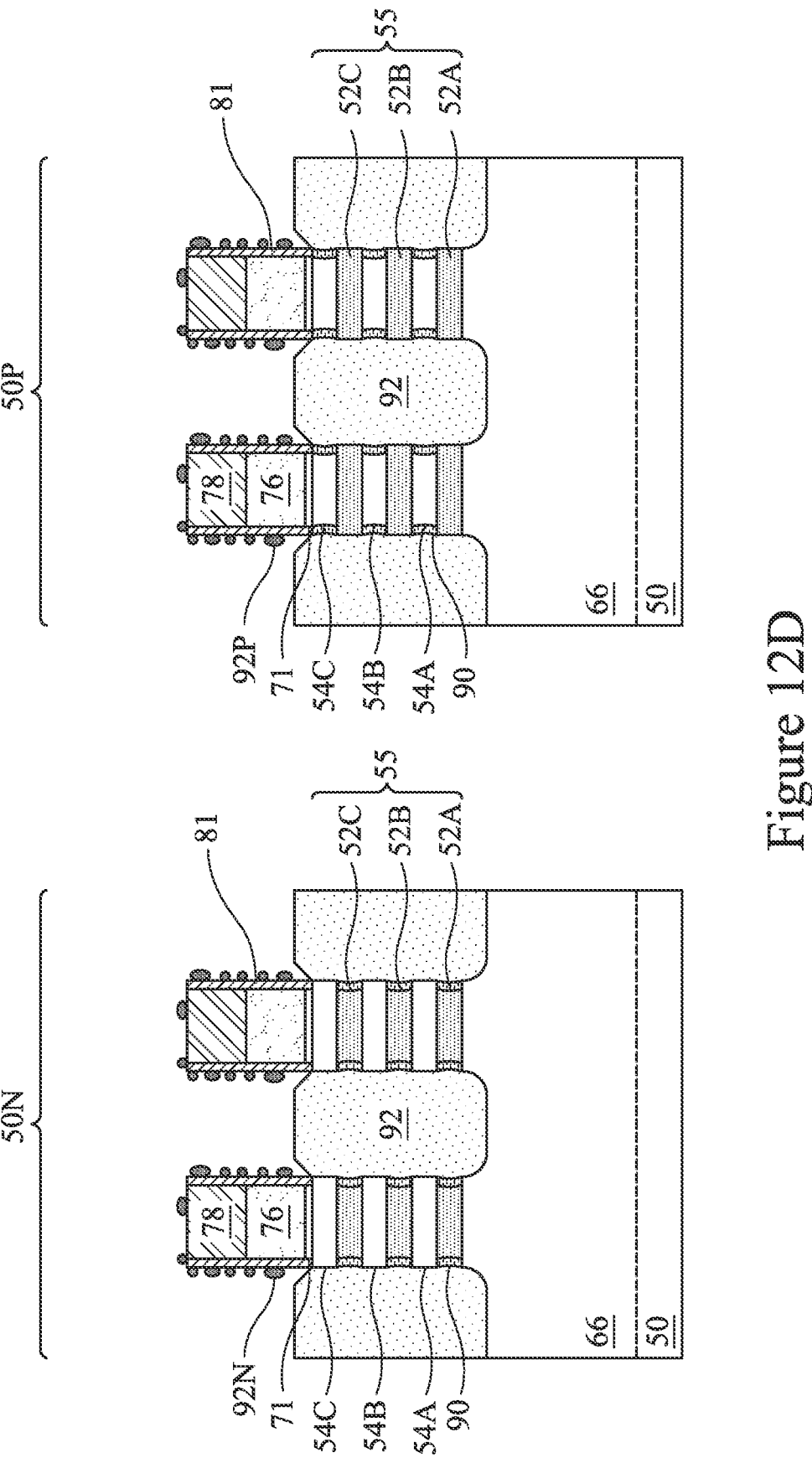

FIG. 12D illustrates an embodiment in which sidewalls of the first nanostructures 52 in the n-type region 50N and sidewalls of the second nanostructures 54 in the p-type region 50P are concave, outer sidewalls of the first inner spacers 90 are concave, and the first inner spacers 90 are recessed from sidewalls of the second nanostructures 54 and the first nanostructures 52, respectively. As illustrated in FIG. 12D, the epitaxial source/drain regions 92 may be formed in contact with the first inner spacers 90 and may extend past sidewalls of the second nanostructures 54 in the n-type region 50N and past sidewalls of the first nanostructures 52 in the p-type region 50P.

In FIGS. 13A-13F, one or more cleaning processes are performed to remove the nodules 92N, 92P. In some embodiments, an NFET cleaning process is performed to remove the nodules 92N in the n-type region 50N while the p-type region 50P is masked. In addition, a PFET cleaning process is performed to remove the nodules 92P in the p-type region 50P while the n-type region 50N is masked.

In some embodiments, the NFET cleaning process includes flowing gaseous precursors fluorine ($F_2$) and ammonia ($NH_3$)—for example, which may include an inert gas such as argon, nitrogen, or the like-over the structure to react with and remove the nodules 92N. The fluorine may have a flow rate ranging from 10 standard cubic centimeters (sccm) to 300 sccm, and the ammonia may have a flow rate ranging from 30 sccm to 500 sccm. During the NFET cleaning process, the precursor flow rates may be varied (e.g., increasing or decreasing) while maintaining a substantially constant ratio to one another. In addition, the NFET cleaning process may be performed at temperatures ranging from 30° C. to 100° C., at pressures ranging from 100 mTorr to 800 mTorr, and for a duration of about or less than 10 minutes (e.g., ranging from 10 seconds to 3 minutes). Note that these parameters may be adjusted based on quantity, total volume, individual size, and surface area of coverage of the nodules 92N.

The NFET cleaning process as described above can effectively remove the nodules 92N (e.g., non-crystalline forms of silicon, phosphorous-doped silicon, and the like) without etching or damaging the epitaxial source/drain regions 92 or other exposed features of the structure. The precursors have a higher selectivity for etching the nodules 92N (e.g., non-crystalline forms of the epitaxial material) than for etching the epitaxial source/drain regions 92 (e.g., crystalline forms of the epitaxial material) and other features in the n-type region 50N. In particular, the precursors are free of chlorine to prevent undesired etching of the epitaxial source/drain regions 92. In addition, the precursors are free of hydrogen radicals to prevent damaging or modifying the chemical compositions of the epitaxial source/drain regions 92 or other exposed features of the structure. As such, embodiments of the NFET cleaning process may remove the nodules 92N more effectively and at a faster rate than using precursors such as hydrogen chloride.

In some embodiments, the PFET cleaning process includes flowing gaseous precursors fluorine ($F_2$) and hydrogen fluoride (HF)—for example, which may include an inert gas such as argon, nitrogen, or the like-over the structure to react with and remove the nodules 92P. The fluorine may have a flow rate ranging from 10 sccm to 300 sccm, and the hydrogen fluoride may have a flow rate ranging from 30 sccm to 800 sccm. During the PFET cleaning process, the precursor flow rates may be varied (e.g., increasing or decreasing) while maintaining a substantially constant ratio to one another. In addition, the PFET cleaning process may be performed at temperatures ranging from 30° C. to 100° C., at pressures ranging from 100 mTorr to 800 mTorr, and for a duration of about or less than 10 minutes (e.g., ranging from 30 seconds to 10 minutes). Note that these parameters may be adjusted based on quantity, total volume, individual size, and surface area of coverage of the nodules 92P.

The PFET cleaning process as described above can effectively remove the nodules 92P (e.g., non-crystalline forms of silicon germanium, boron-doped silicon germanium, and the like) without etching or damaging the epitaxial source/drain regions 92 or other exposed features of the structure. The precursors have a higher selectivity for etching the nodules 92N (e.g., non-crystalline forms of the epitaxial material) than for etching the epitaxial source/drain regions 92 (e.g., crystalline forms of the epitaxial material) and other features in the p-type region 50P. In particular, the precursors are free of chlorine to prevent undesired etching of the epitaxial source/drain regions 92. In addition, the precursors are free of hydrogen radicals which have low selectivity for the nodules 92P. Further, the precursors being free of hydrogen radicals also prevents damaging or modifying the chemical compositions of other exposed features of the structure. As such, embodiments of the PFET cleaning process may remove the nodules 92P more effectively and at a faster rate than using precursors such as hydrogen chloride.

Figure 13A:
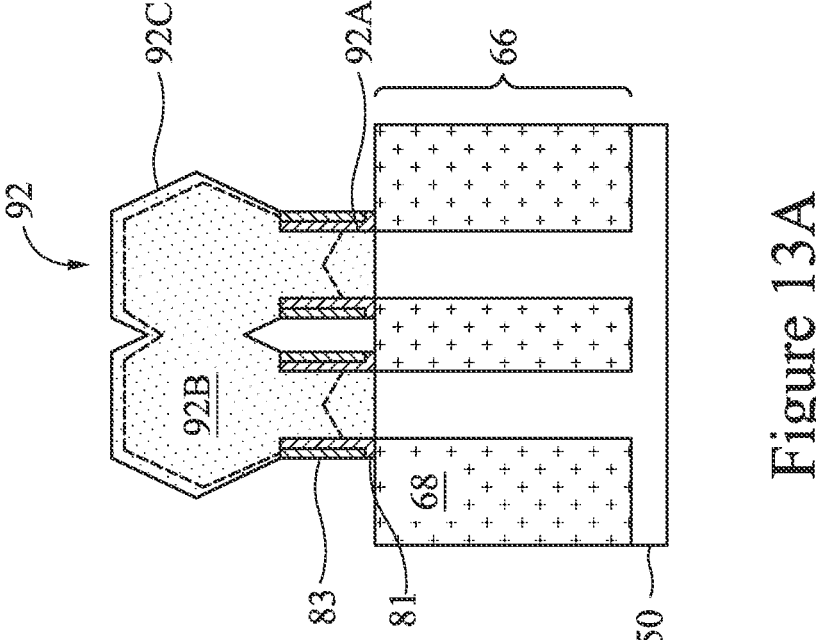
Figure 13B:
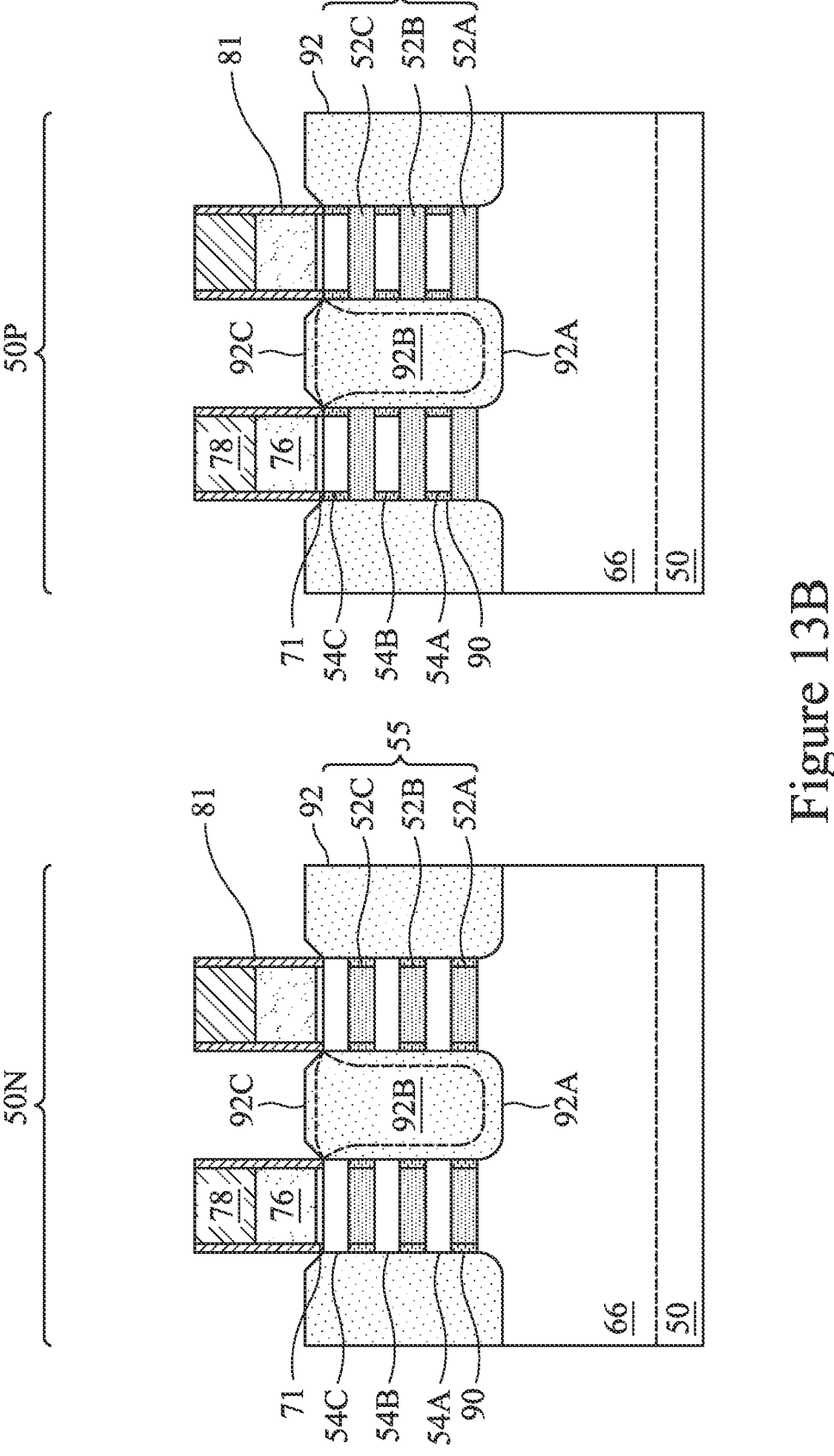
Figure 13C:
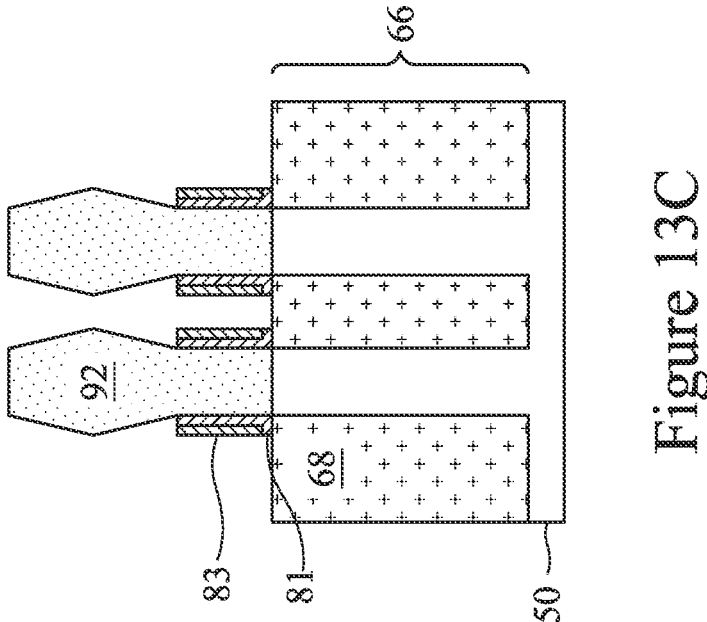
Figure 13D:
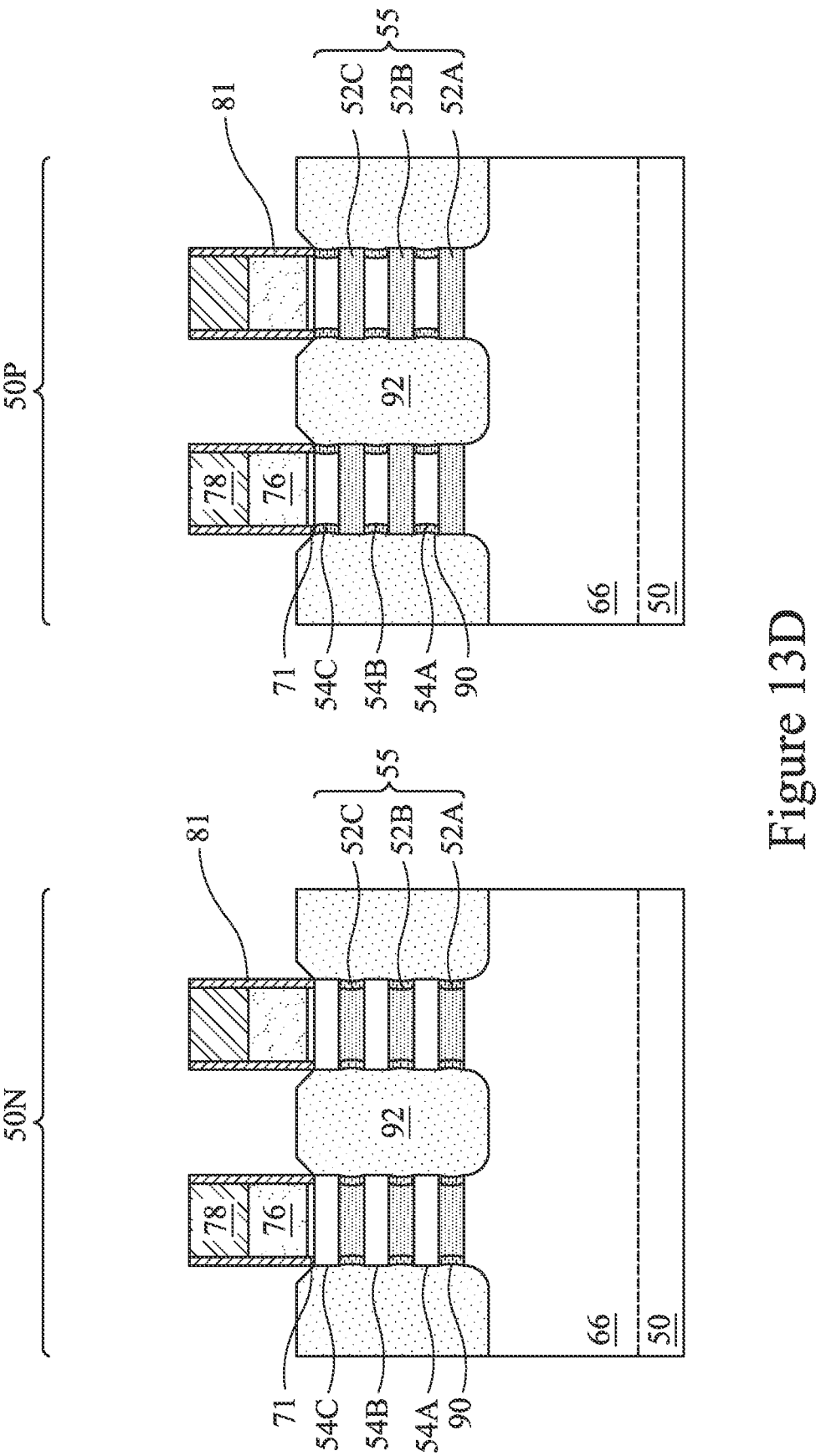
Figures 13E, 13F:
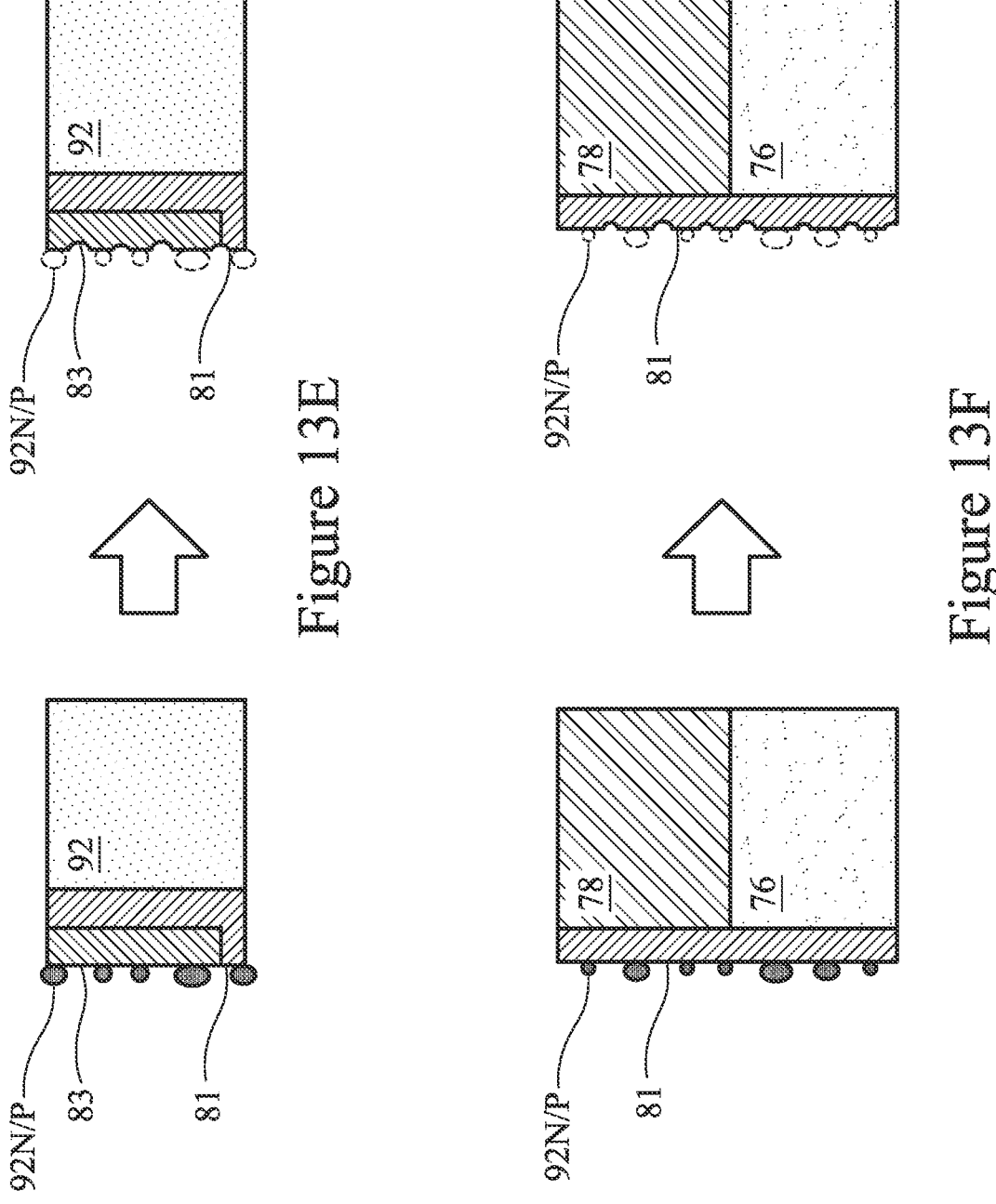

Referring to FIGS. 13E and 13F, in accordance with some embodiments, the cleaning processes may increase a roughness of surfaces of certain layers by etching exposed portions of those layers while removing the nodules 92N, 92P. FIG. 13E illustrates portions of the first spacers 81 and the second spacers 83 along the epitaxial source/drain regions 92. The overlying second spacers 83 may be etched, while only a lower portion of the first spacers 81 may be exposed and etched to increase roughness. FIG. 13F illustrates portions of the first spacers 81 along the dummy gates 76 and the masks 78. As illustrated, the exposed portions of the first spacers 81 and the second spacers 83 between nodules 92N, 92P may be etched while the nodules 92N, 92P are being etched. In particular, exposed surfaces of the first spacers 81 and the second spacers 83 may increase in roughness. For example, silicon nitride layers (e.g., the first spacers 81) may increase in roughness from 1-2 Å to 4-5 Å, such as increasing in roughness by 2-4 Å or by two to five times the previous roughness. In addition, silicon oxycarbonitride layers (e.g., the second spacers 83) may increase in roughness from 3-4 Å to 5-6 Å, such as increasing in roughness by 1-3 Å or by up to two times the previous roughness. Further, the cleaning processes may remove up to about 90% of the quantity and/or volume of the nodules 92N, 92P. Similarly, the cleaning processes may decrease the surface area coverage of the nodules 92N, 92P by up to about 90%.

Figure 14A:
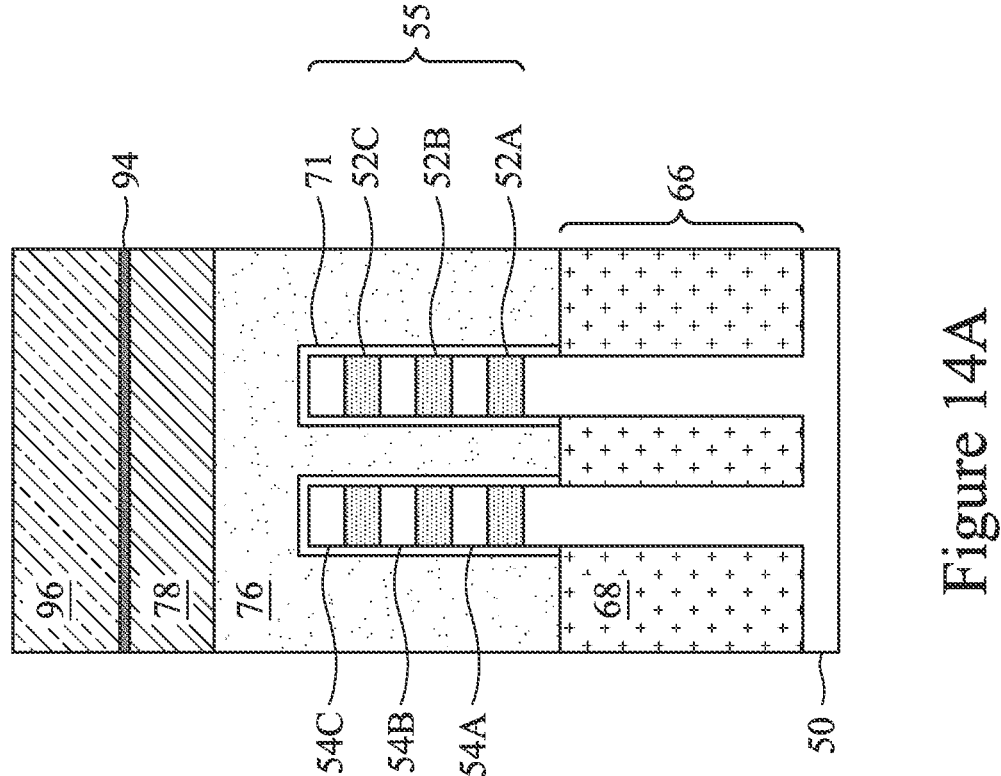
Figure 14B:
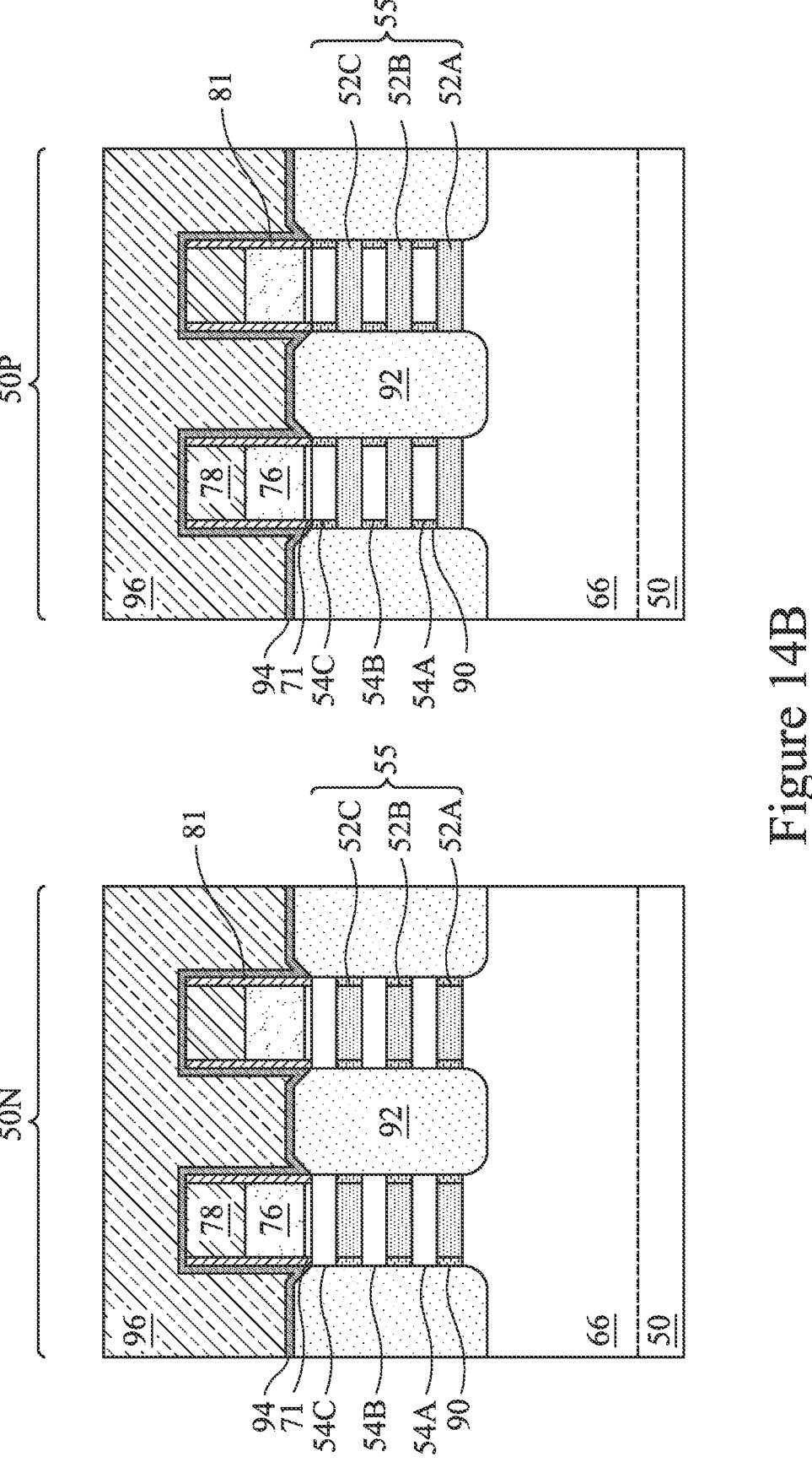
Figure 14C:
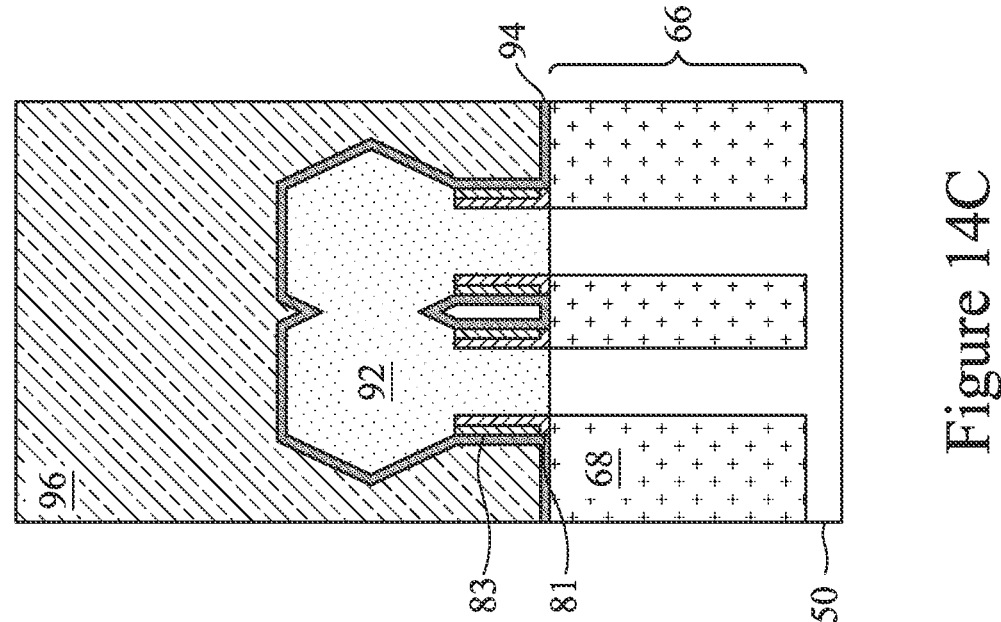

In FIGS. 14A-14C, a first interlayer dielectric (ILD) 96 is deposited over the structure illustrated in FIGS. 6A, 13B, and 13A (the processes of FIGS. 7A-13D do not alter the cross-section illustrated in FIGS. 6A), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as, silicon nitride, silicon oxide, silicon oxynitride, or the like, having a different etch rate than the material of the overlying first ILD 96. In some embodiments, the increased roughness of the first spacers 81 and the second spacers 83 may improve adhesion with the CESL 94.

Figure 15A:
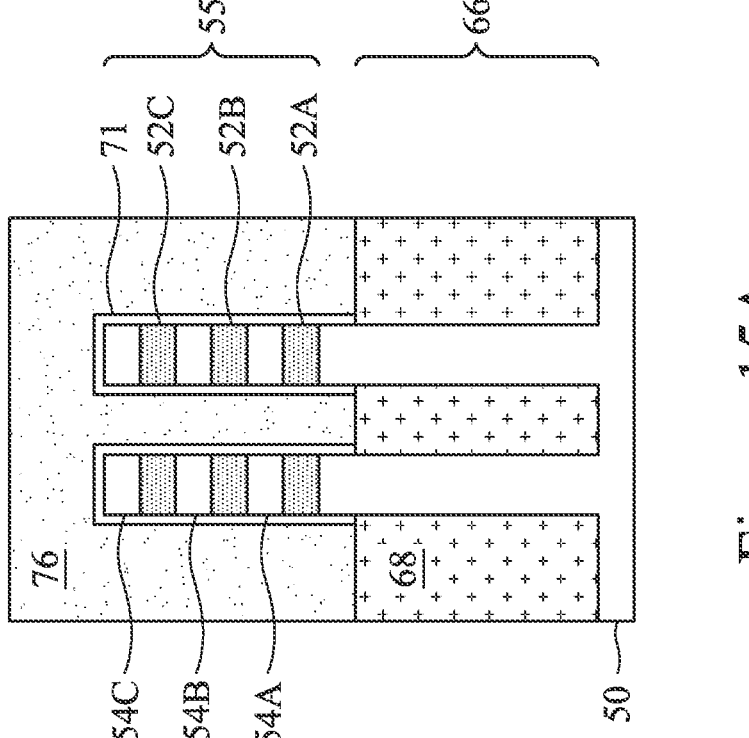
Figure 15B:
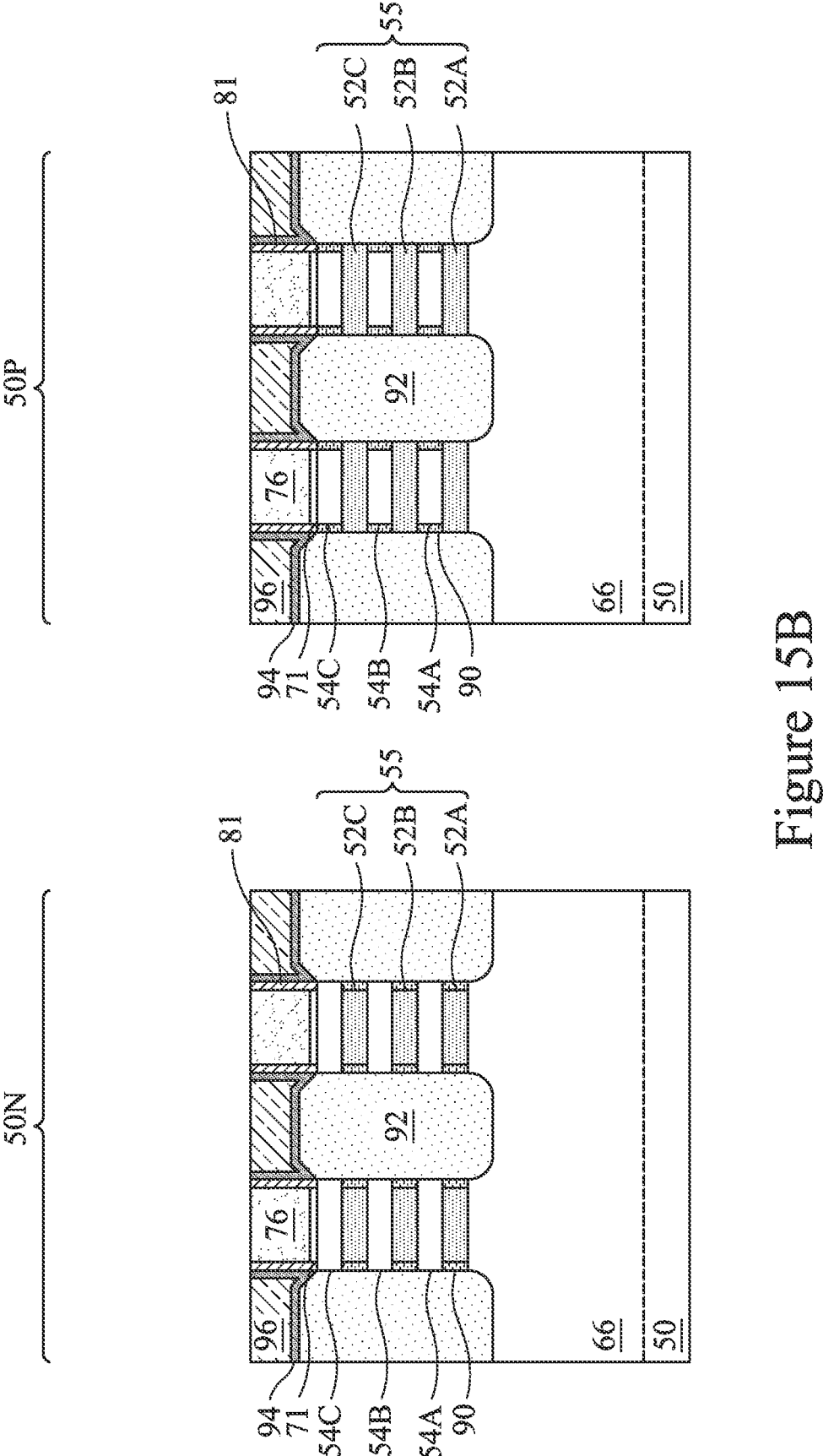

In FIGS. 15A-15C, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 72 are exposed through the first ILD 96. In some embodiments, the masks 78 may remain, in which case the planarization process levels the top surface of the first ILD 96 with top surface of the masks 78 and the first spacers 81.

Figure 16A:
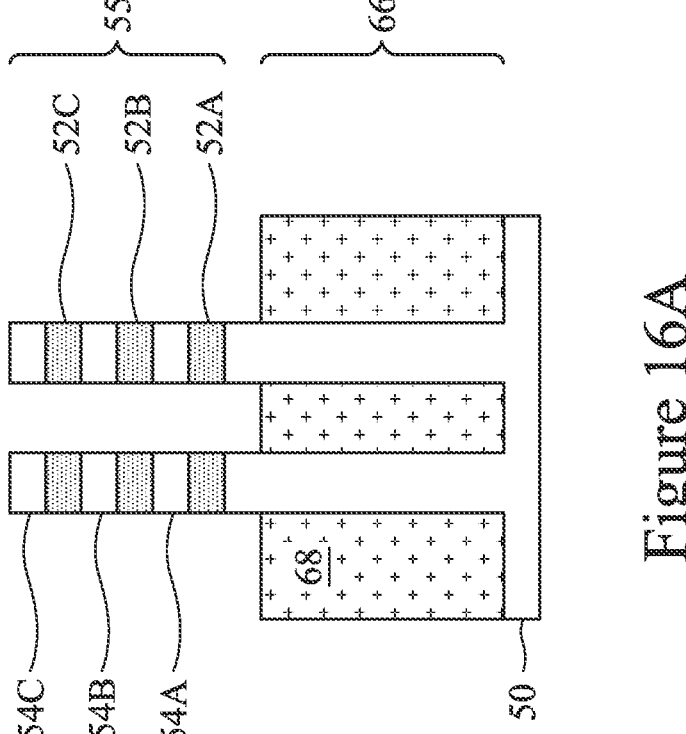
Figure 16B:
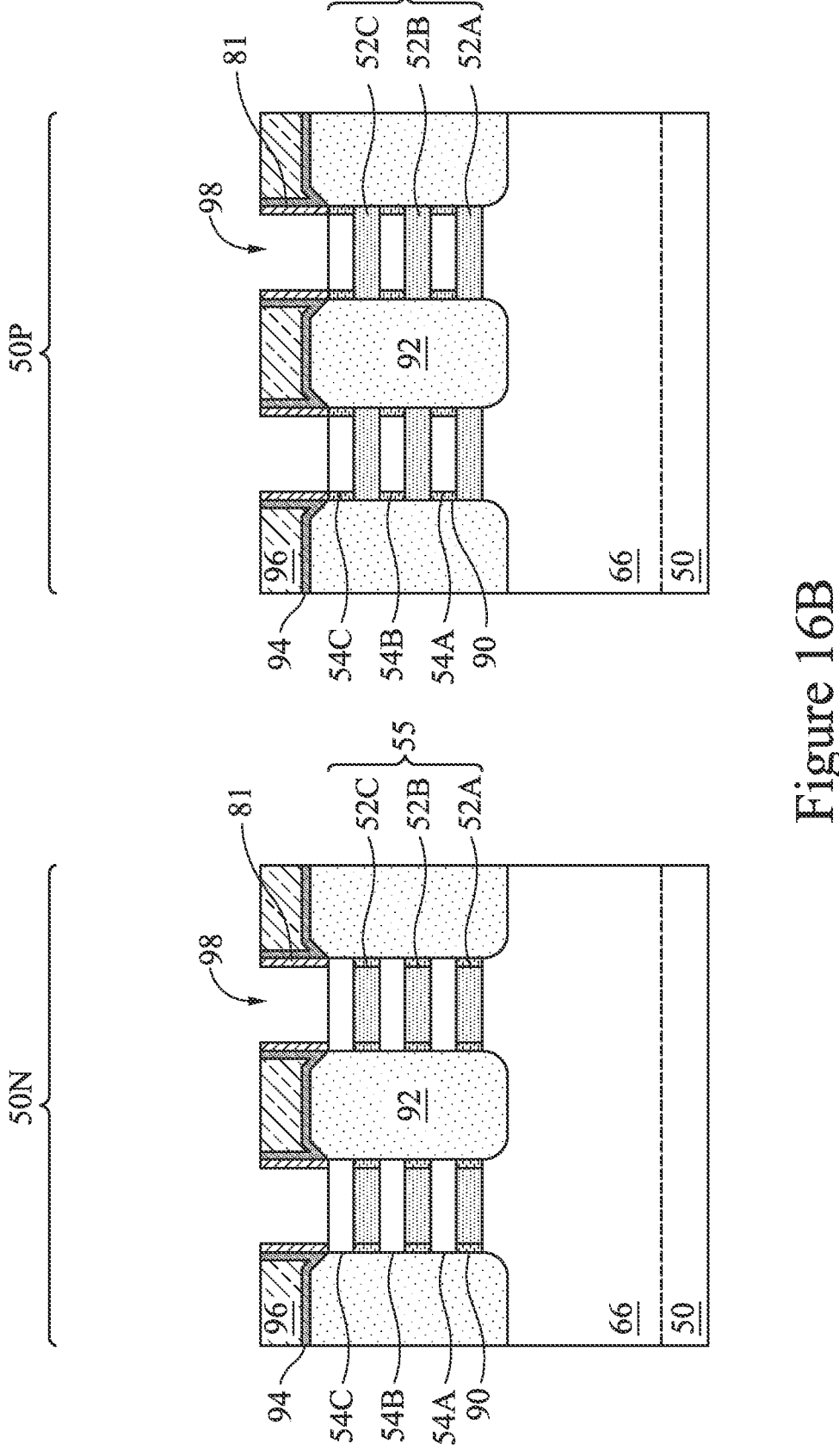

In FIGS. 16A and 16B, the dummy gates 76, and the masks 78 (if present) are removed in one or more etching steps, so that second recesses 98 are formed. Portions of the dummy gate dielectrics 71 in the second recesses 98 are also be removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 96 or the first spacers 81. Each second recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76.

Figure 17A:
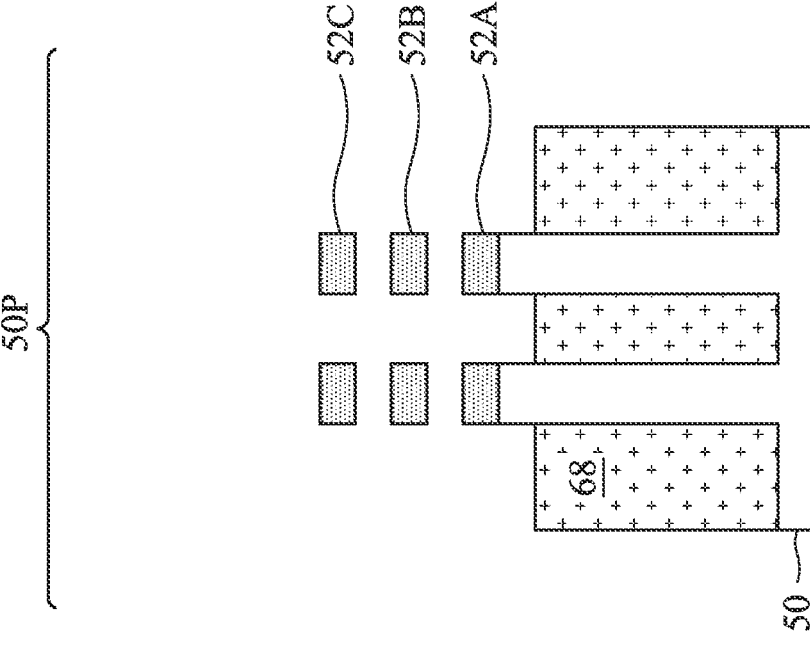
Figure 17A:
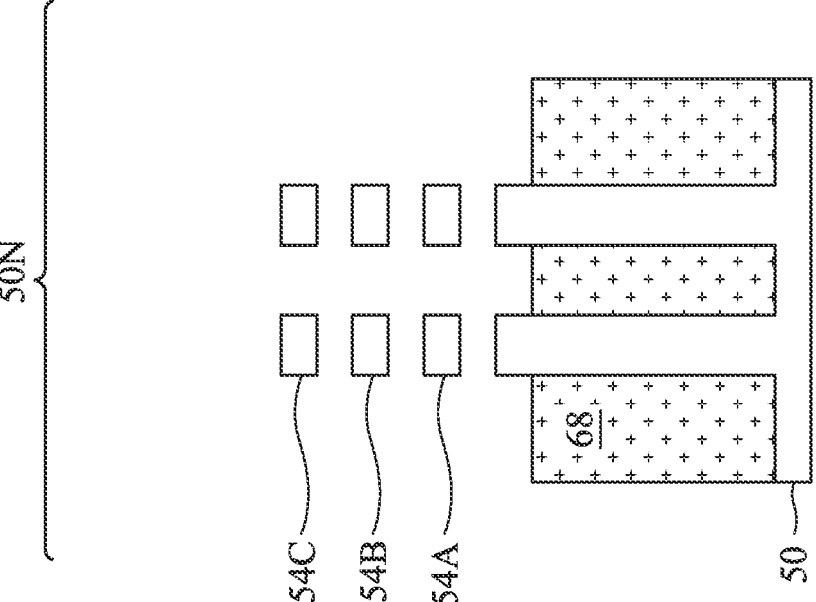
Figure 17B:
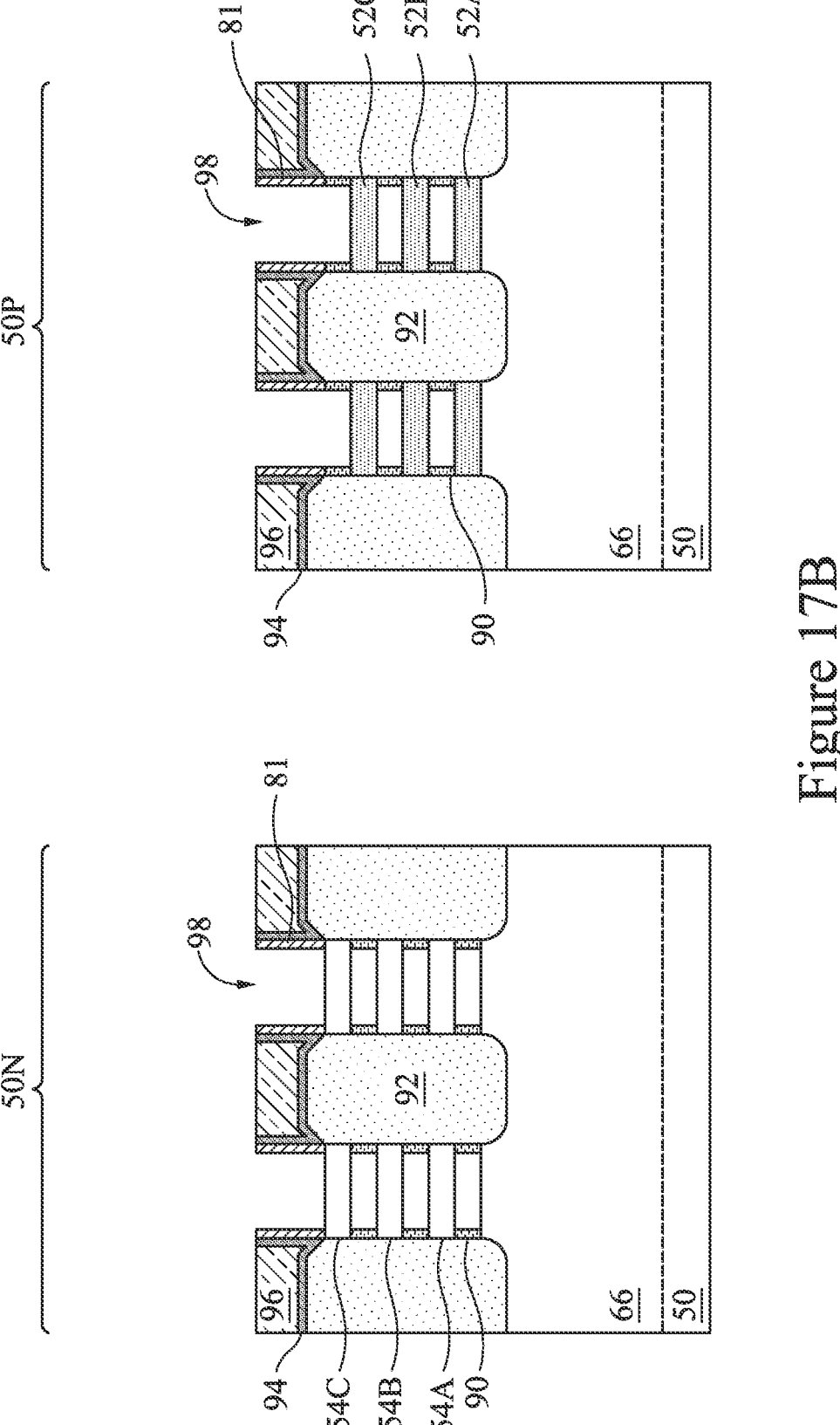

In FIGS. 17A and 17B, the first nanostructures 52 in the n-type region 50N and the second nanostructures 54 in the p-type region 50P are removed extending the second recesses 98. The first nanostructures 52 may be removed by forming a mask (not shown) over the p-type region 50P and performing an isotropic etching process such as wet etching or the like using etchants which are selective to the materials of the first nanostructures 52, while the second nanostructures 54, the substrate 50, the STI regions 68 remain relatively unetched as compared to the first nanostructures 52. In embodiments in which the first nanostructures 52 include, e.g., SiGe, and the second nanostructures 54 include, e.g., Si or SiC, tetramethylammonium hydroxide (TMAH), ammonium hydroxide ($NH_4OH$), or the like may be used to remove the first nanostructures 52 in the n-type region 50N.

The second nanostructures 54 in the p-type region 50P may be removed by forming a mask (not shown) over the n-type region 50N and performing an isotropic etching process such as wet etching or the like using etchants which are selective to the materials of the second nanostructures 54, while the first nanostructures 52, the substrate 50, the STI regions 68 remain relatively unetched as compared to the second nanostructures 54. In embodiments in which the second nanostructures 54 include, e.g., SiGe, and the first nanostructures 52 include, e.g., Si or SiC, hydrogen fluoride, another fluorine-based etchant, or the like may be used to remove the second nanostructures 54 in the p-type region 50P.

In other embodiments, the channel regions in the n-type region 50N and the p-type region 50P may be formed simultaneously, for example by removing the first nano-structures 52 in both the n-type region 50N and the p-type region 50P or by removing the second nanostructures 54 in both the n-type region 50N and the p-type region 50P. In such embodiments, channel regions of n-type nano-FETs and p-type nano-FETS may have a same material composition, such as silicon, silicon germanium, or the like. FIGS. 30A-30C illustrate a structure resulting from such embodiments where the channel regions in both the p-type region 50P and the n-type region 50N are provided by the second nanostructures 54 and comprise silicon, for example.

Figure 18A:
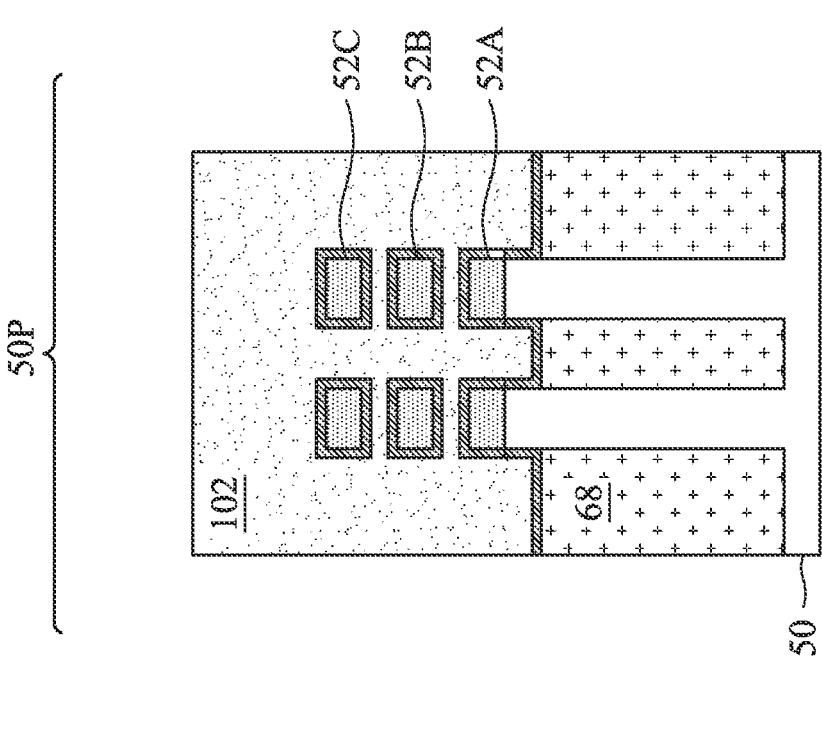
Figure 18A:
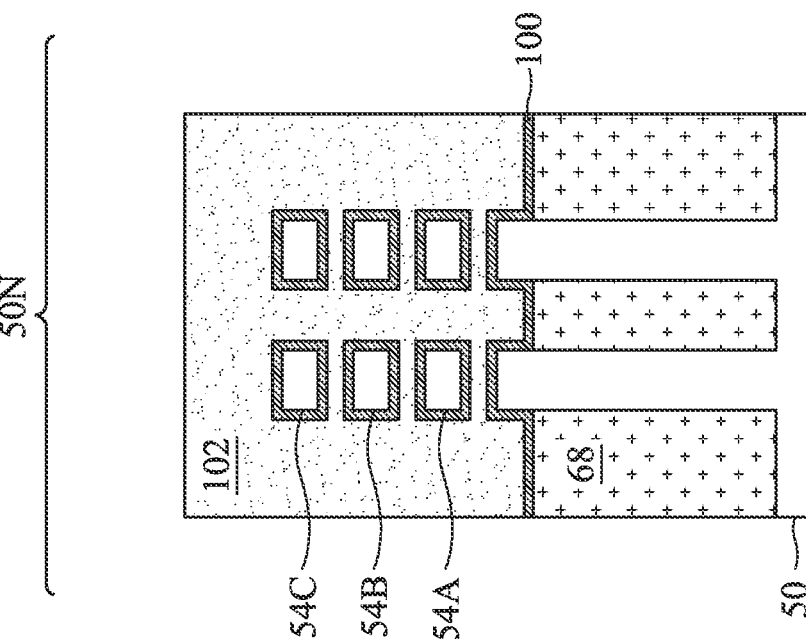
Figure 18B:
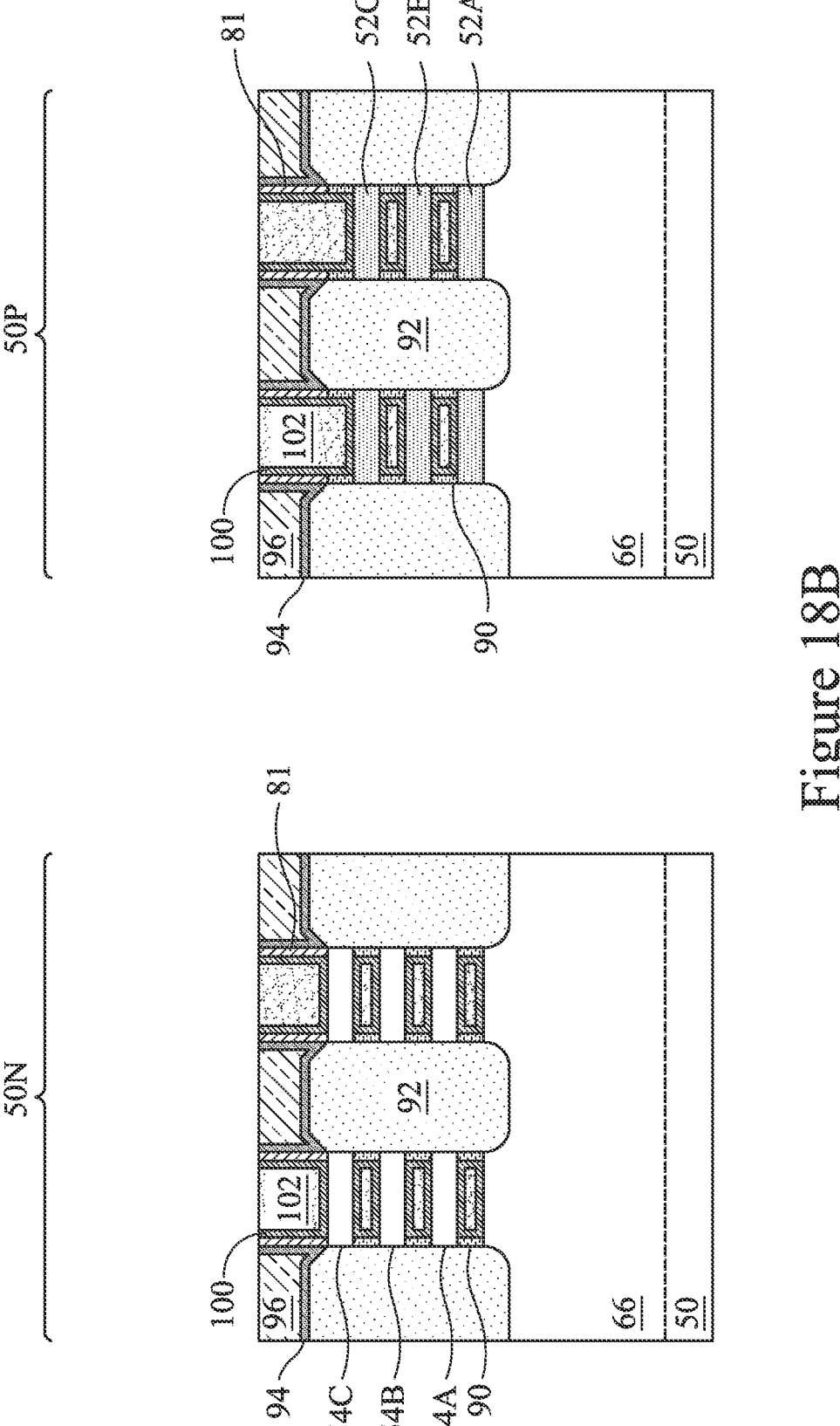

In FIGS. 18A and 18B, gate dielectric layers 100 and gate electrodes 102 are formed for replacement gates. The gate dielectric layers 100 are deposited conformally in the second recesses 98. In the n-type region 50N, the gate dielectric layers 100 may be formed on top surfaces and sidewalls of the substrate 50 and on top surfaces, sidewalls, and bottom surfaces of the second nanostructures 54, and in the p-type region 50P, the gate dielectric layers 100 may be formed on top surfaces and sidewalls of the substrate 50 and on top surfaces, sidewalls, and bottom surfaces of the first nano-structures 52. The gate dielectric layers 100 may also be deposited on top surfaces of the first ILD 96, the CESL 94, the first spacers 81, and the STI regions 68.

In accordance with some embodiments, the gate dielectric layers 100 comprise one or more dielectric layers, such as an oxide, a metal oxide, the like, or combinations thereof. For example, in some embodiments, the gate dielectric layers 100 may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100 and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated, the gate electrodes 102 may comprise any number of liner layers, any number of work function tuning layers, and a fill material. Any combination of the layers which make up the gate electrodes 102 may be deposited in the n-type region 50N between adjacent ones of the second nanostructures 54 and between the second nanostructure 54A and the substrate 50, and may be deposited in the p-type region 50P between adjacent ones of the first nanostructures 52.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the second recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 19A:
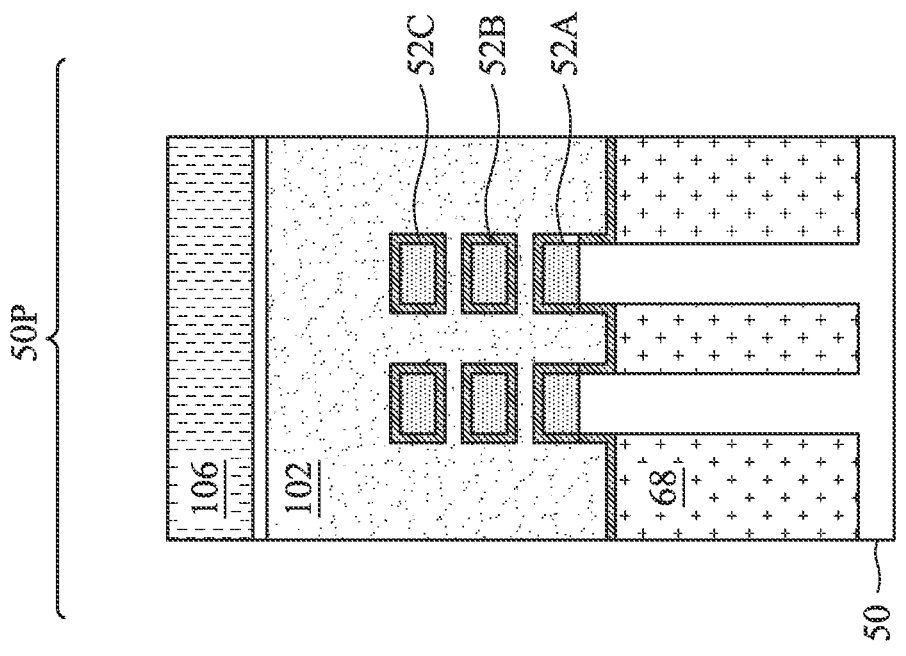
Figure 19A:
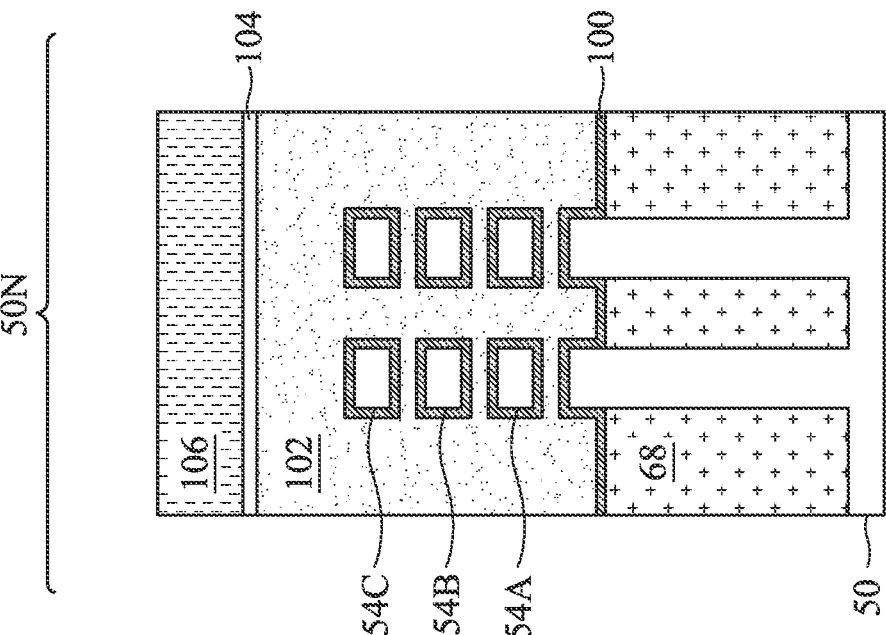
Figure 19B:
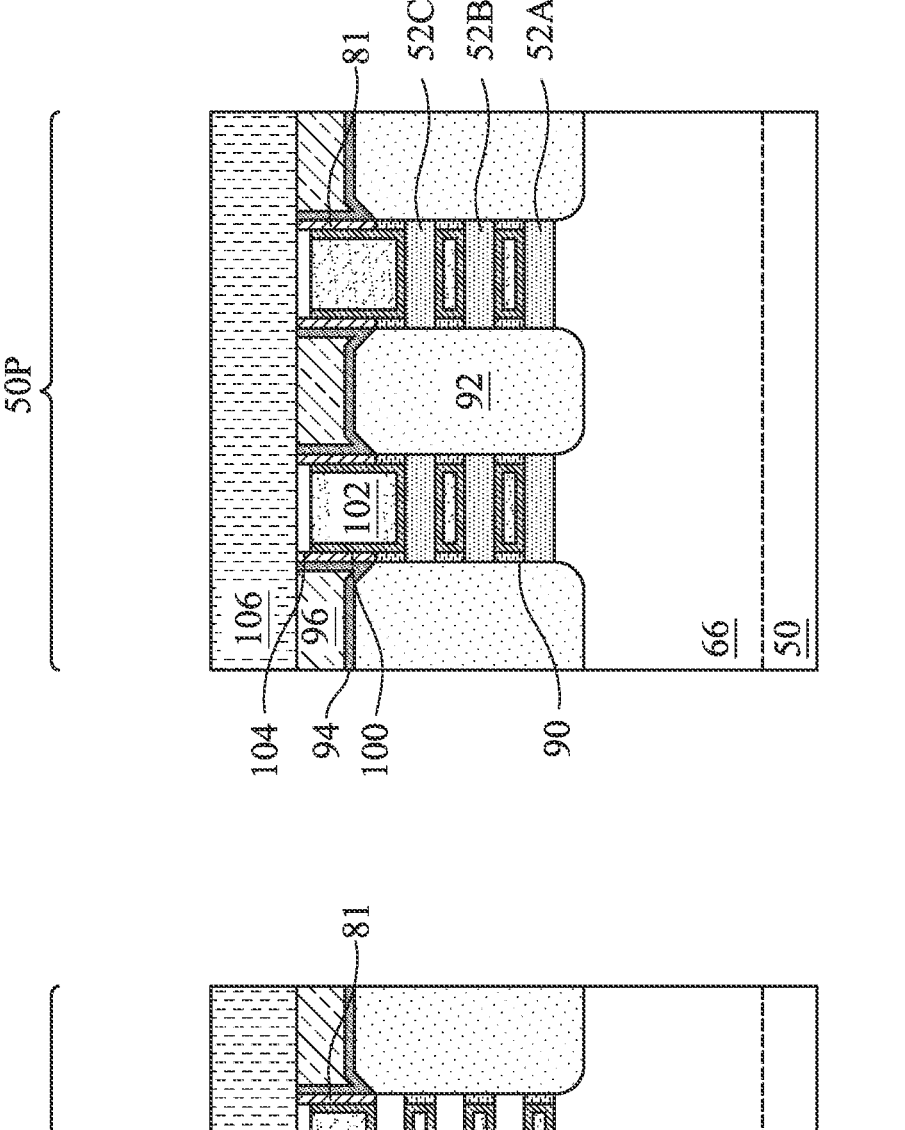
Figure 19C:
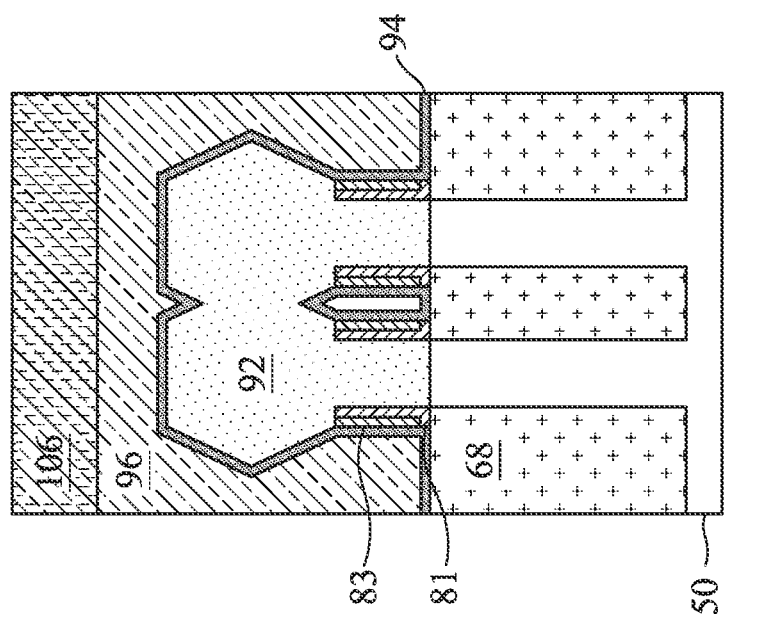

In FIGS. 19A-19C, the gate structure (including the gate dielectric layers 100 and the corresponding overlying gate electrodes 102) is recessed, so that a recess is formed directly over the gate structure and between opposing portions of first spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 110, discussed below with respect to FIGS. 21A and 21B) penetrate through the gate mask 104 to contact the top surface of the recessed gate electrodes 102.

As further illustrated, a second ILD 106 is deposited over the first ILD 96 and over the gate mask 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 20A:
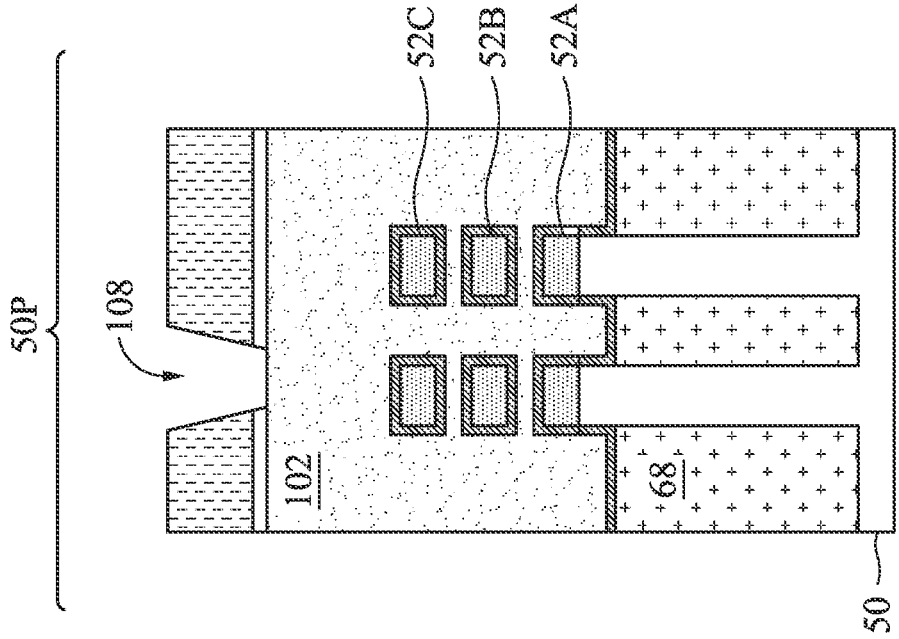
Figure 20A:
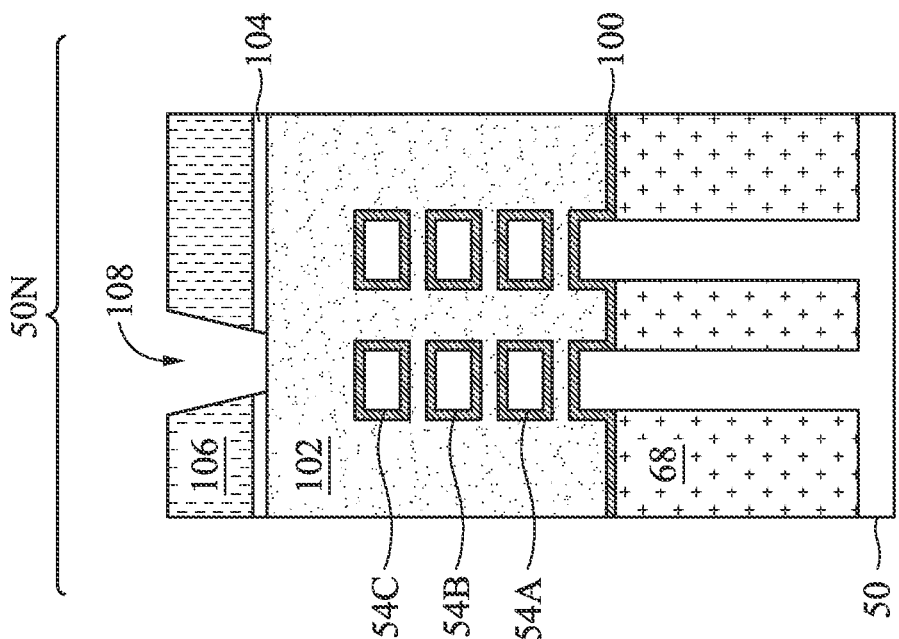
Figure 20B:
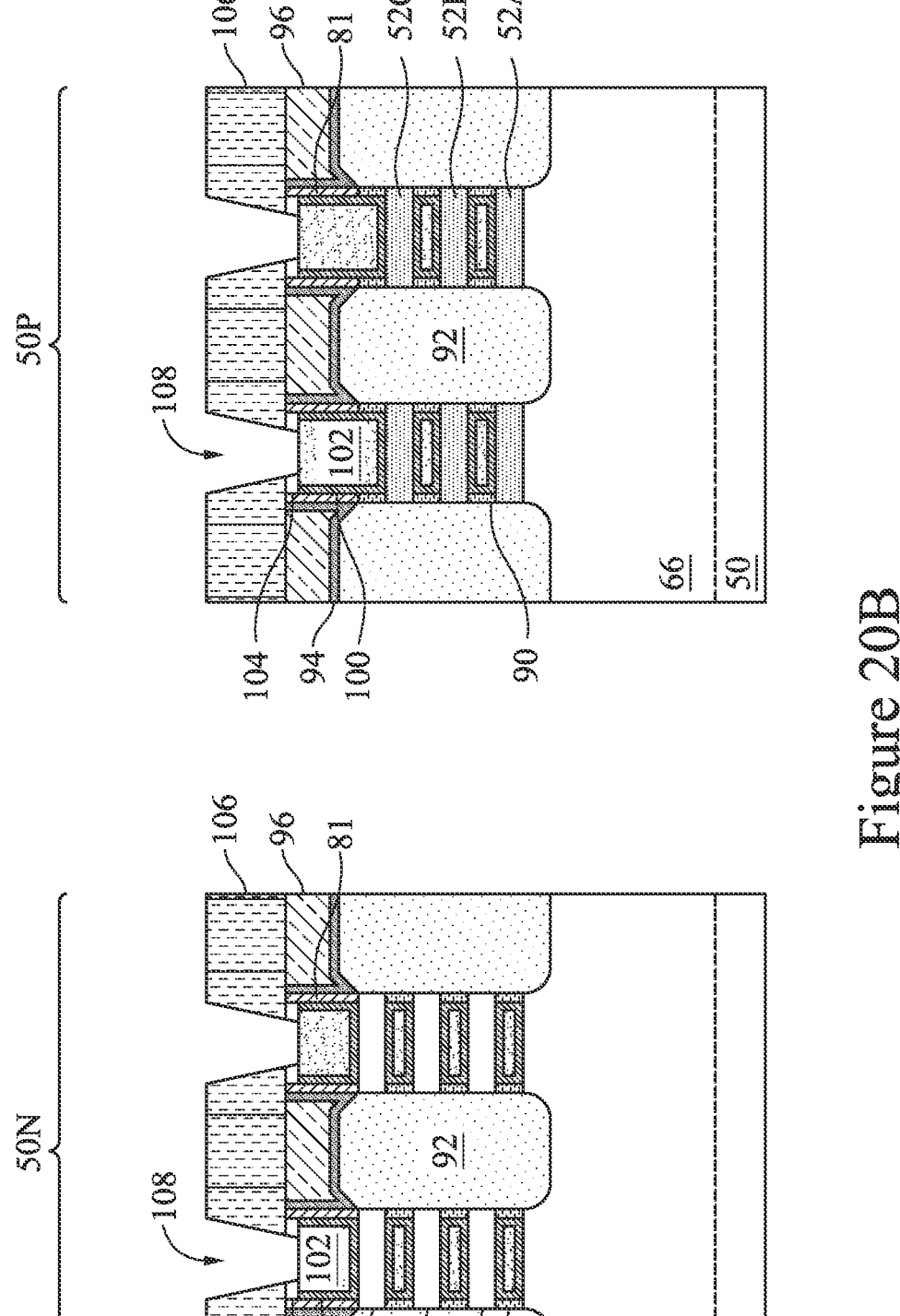
Figure 20C:
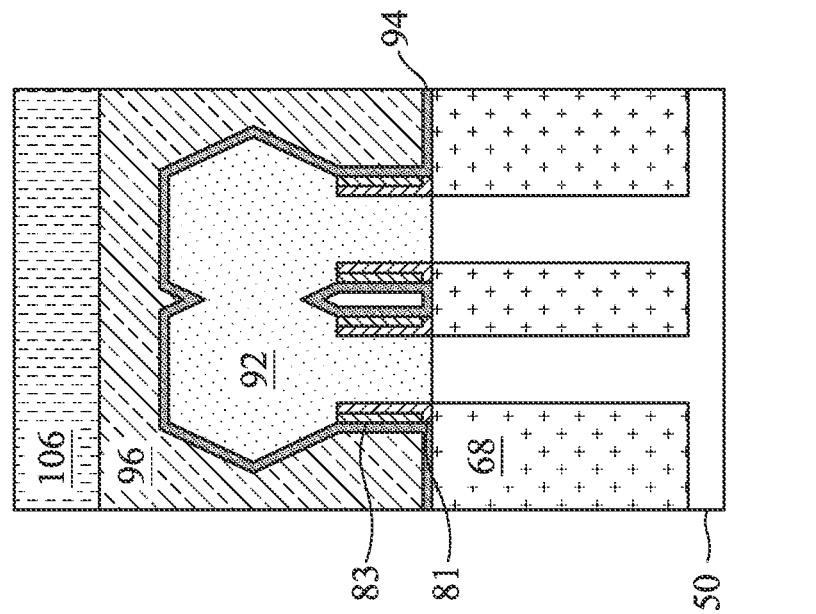

In FIGS. 20A-20C, the second ILD 106 and the gate masks 104 are etched to form third recesses 108 exposing surfaces of the gate structures. The third recesses 108 may be formed by etching using an anisotropic etching process, such as RIE, NBE, or the like. In some embodiments, the third recesses 108 may be etched through the second ILD 106 using a first etching process and may be etched through the gate masks 104 using a second etching process. A mask, such as a photoresist, may be formed and patterned over the second ILD 106 to mask portions of the second ILD 106 from the first etching process and the second etching process. In some embodiments, the etching process may over-etch, and therefore, the third recesses 108 extend into the gate structure, and a bottom of the third recesses 108 may be level with (e.g., at a same level as or having a same distance from the substrate 50 as), or lower than (e.g., closer to the substrate 50 than), an upper surface of the gate structure. Although the third recesses 108 are illustrated as exposing the gate structure in a same cross-section as the epitaxial source/drain regions 92, in various embodiments, the third recesses 108 and the epitaxial source/drain regions 92 may be in different cross-sections, thereby reducing the risk of shorting between subsequently formed contacts to the source/drain regions 92.

Figure 21A:
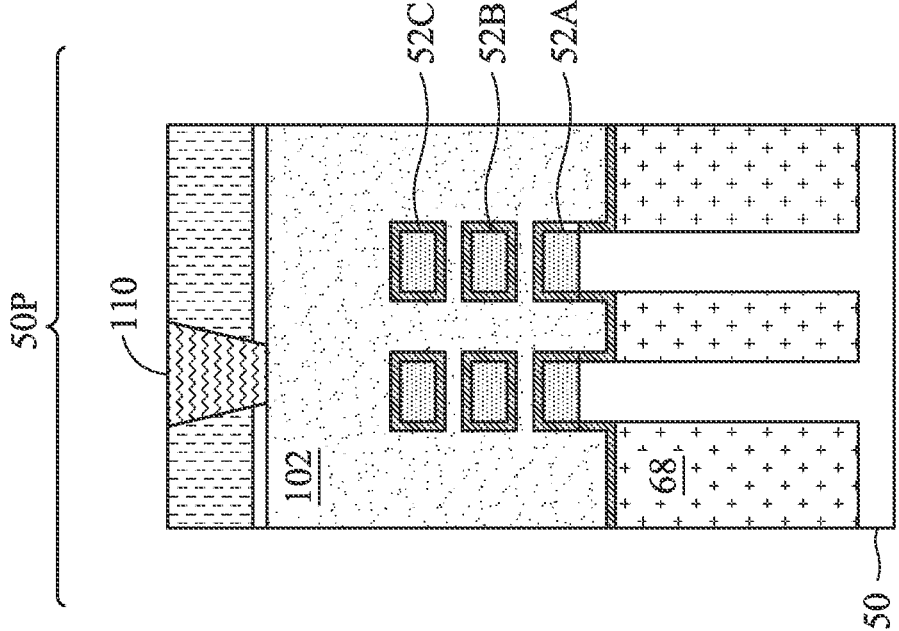
Figure 21A:
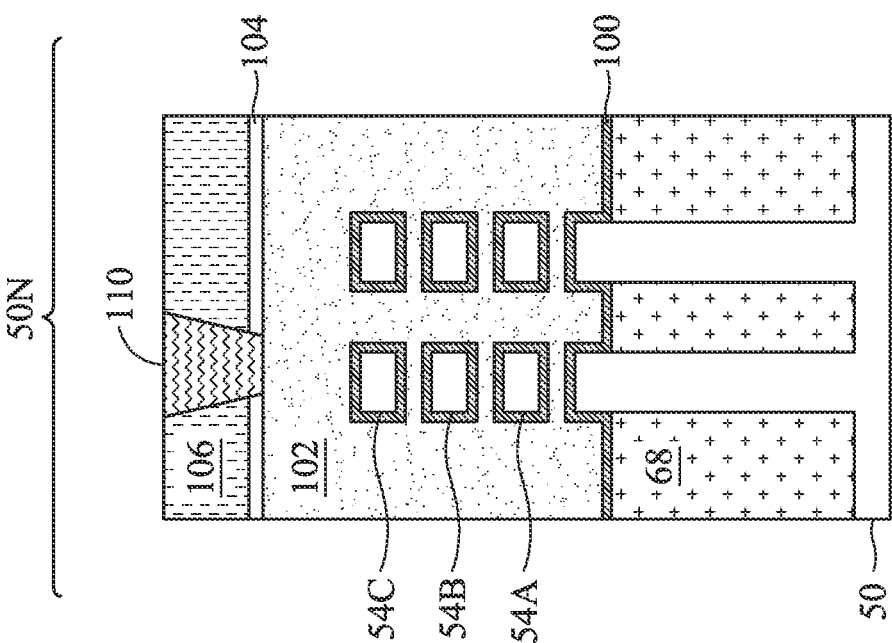
Figure 21B:
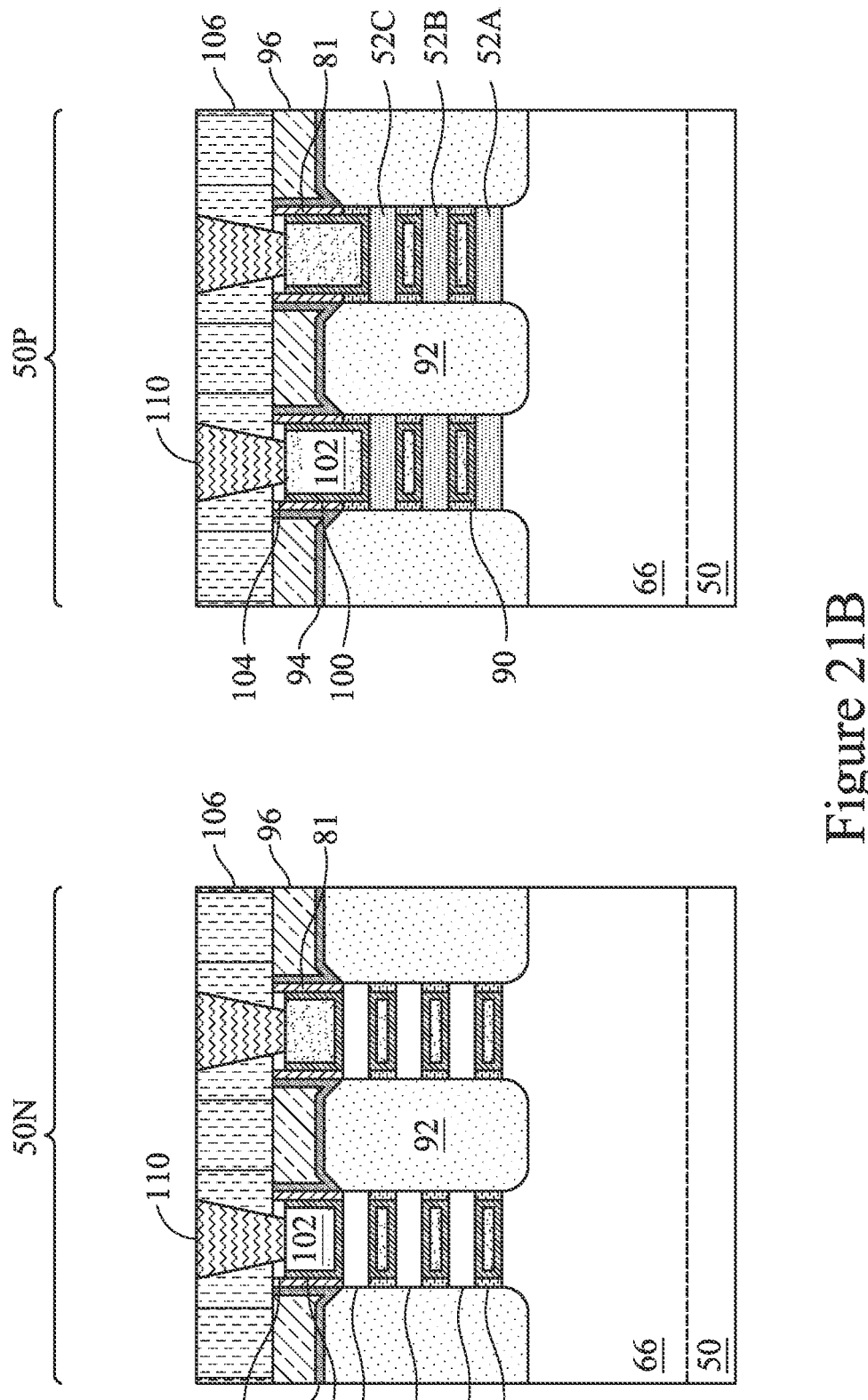
Figure 21C:
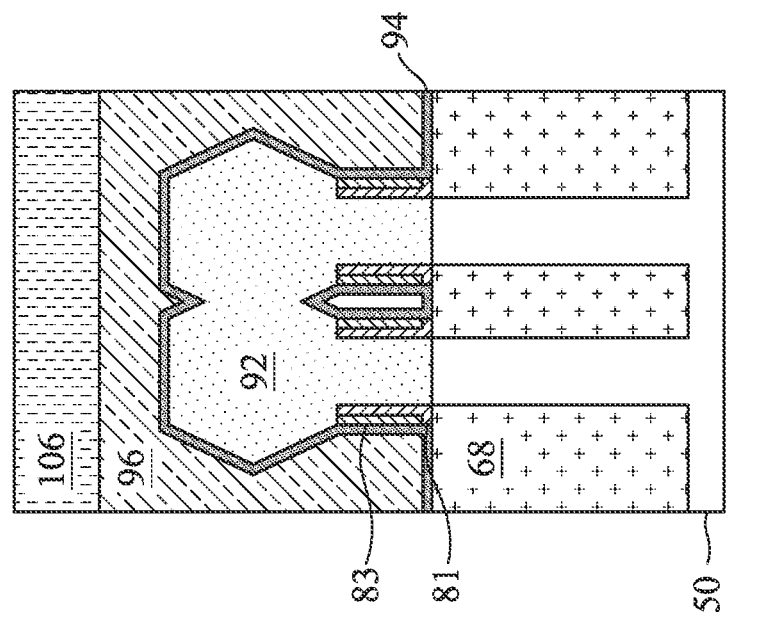

Next, in FIGS. 21A-21C, contacts 110 (may also be referred to as contact plugs, gate contacts, or gate contact plugs) are formed in the third recesses 108. The contacts 110 may each comprise one or more layers, such as barrier layers, diffusion layers, and fill materials. For example, in some embodiments, the contacts 110 each include a barrier layer and a conductive material, and is electrically coupled to the underlying conductive feature (e.g., gate structure 102 in the illustrated embodiment). The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 106.

Figure 22A:
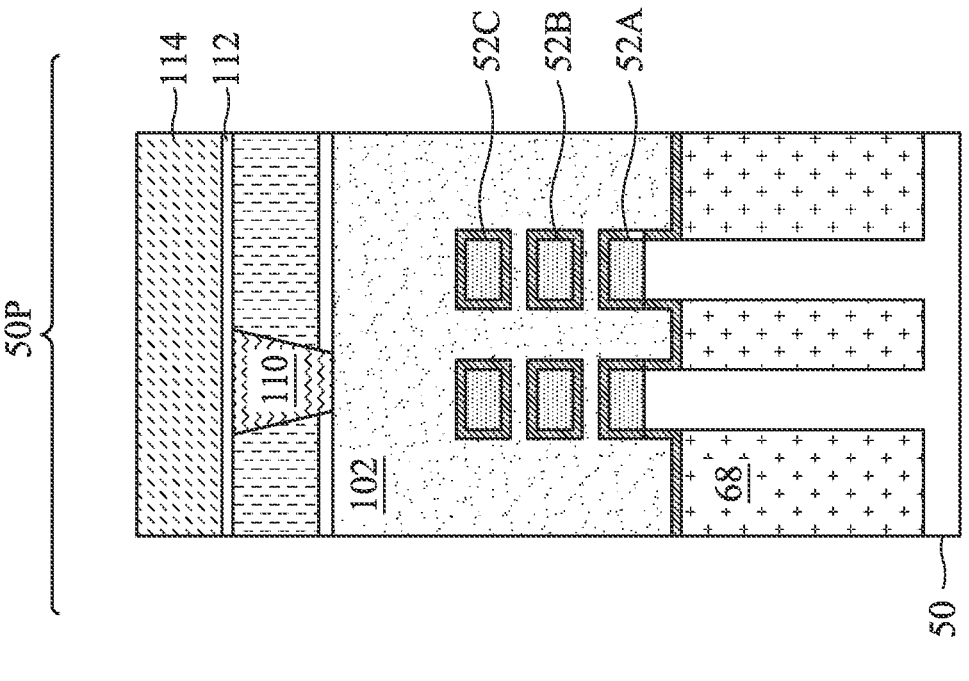
Figure 22A:
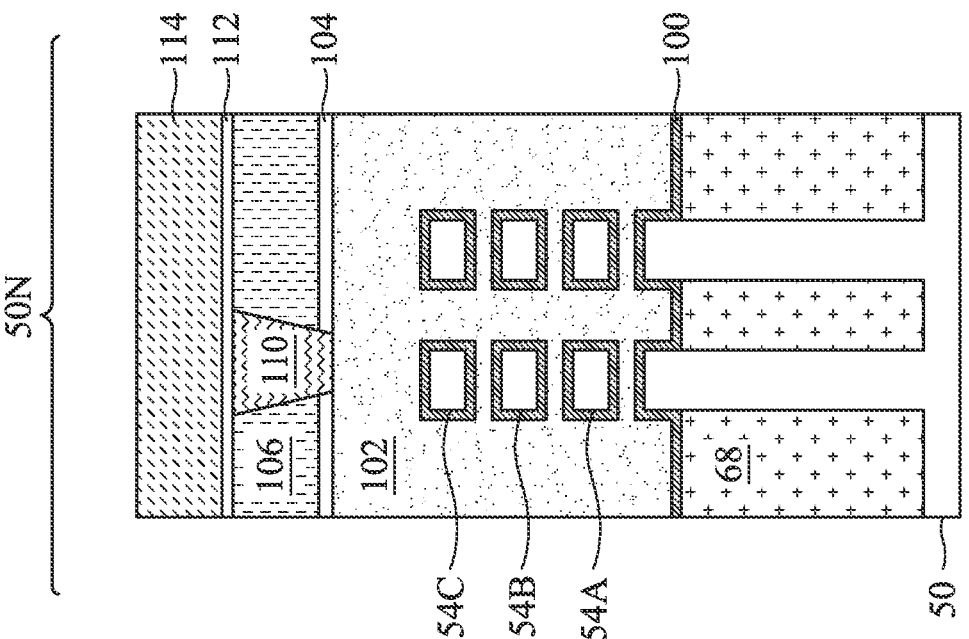
Figure 22B:
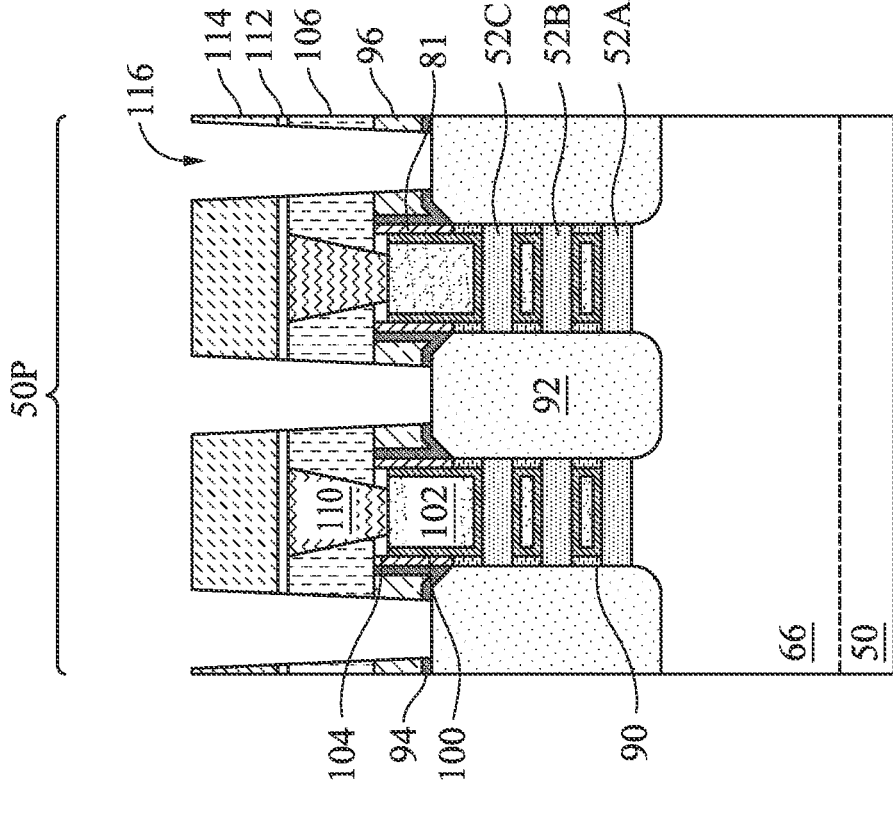
Figure 22B:
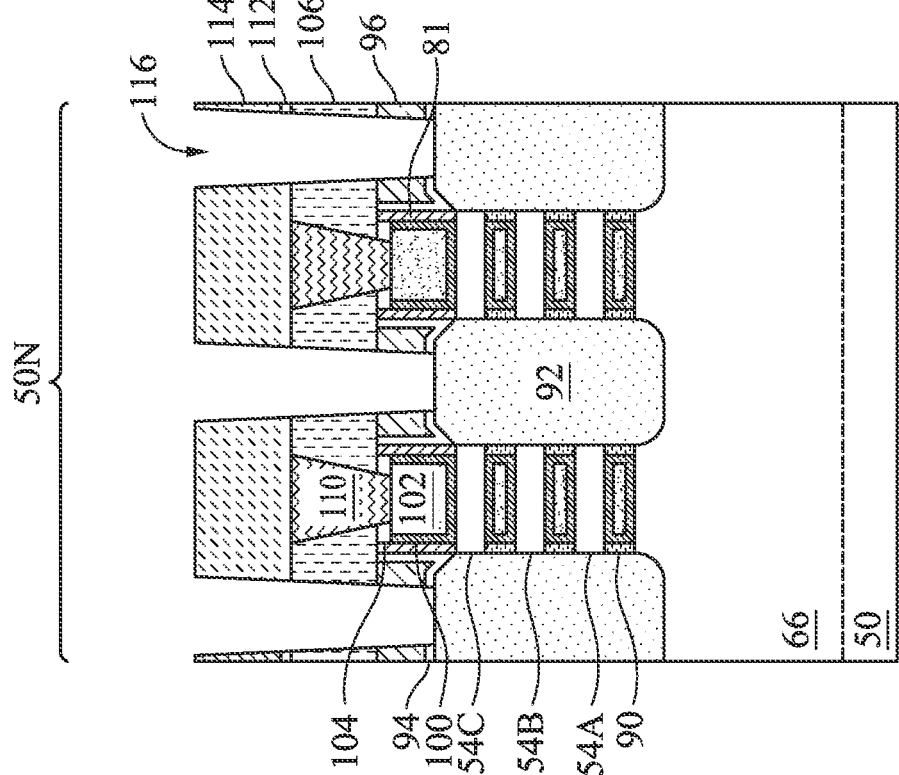
Figure 22C:
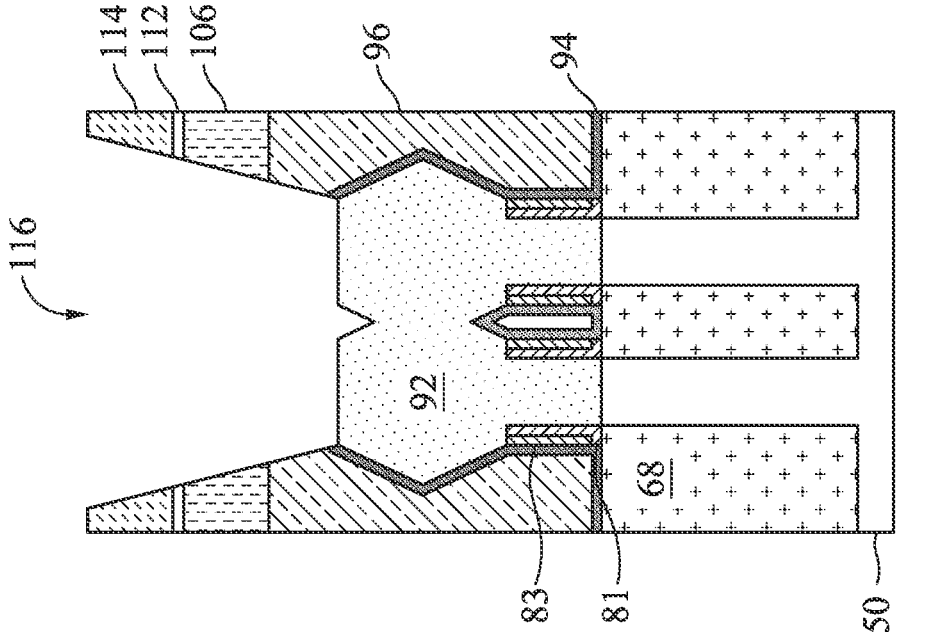

In FIGS. 22A-22C, optionally, a third ILD 114 is formed over the second ILD 106. In addition, the third ILD 114, the second ILD 106, the first ILD 96, the CESL 94, and fourth recesses 116 are etched into the layers to expose surfaces of the epitaxial source/drain regions 92. In some embodiments, the third ILD 114 is a flowable film formed by FCVD, similarly as described above in connection with the first ILD 96 and/or the second ILD 106. In some embodiments, the third ILD 114 is formed of a dielectric material such as PSG, BSG, BPSG, USG, or the like, and may be deposited by any suitable method, such as CVD, PECVD, or the like. Optionally, a contact etch stop layer (CESL) 112 is disposed between the second ILD 106 and the third ILD 114. The CESL 112 may comprise a dielectric material, such as, silicon nitride, silicon oxide, silicon oxynitride, or the like, having a same or different etch rate as the material of the overlying third ILD 114.

The fourth recesses 116 may be formed by etching using an anisotropic etching process, such as RIE, NBE, or the like. In some embodiments, the fourth recesses 116 may be etched through the third ILD 114 (if present), the CESL 112 (if present), the second ILD 106 and the first ILD 96 using a first etching process, and may then be etched through the CESL 94 using a second etching process. A mask, such as a photoresist, may be formed and patterned over the third ILD 114 to mask portions of the third ILD 114 from the first etching process and the second etching process. In some embodiments, the etching process may over-etch, and therefore, the fourth recesses 116 extend into the epitaxial source/drain regions 92, and a bottom of the fourth recesses 116 may be level with (e.g., at a same level as or having a same distance from the substrate as), or lower than (e.g., closer to the substrate than), upper surfaces of the epitaxial source/drain regions 92. Although the fourth recesses 116 are illustrated as exposing the epitaxial source/drain regions 92 in a same cross-section as the gate contacts 110, in various embodiments, the epitaxial source/drain regions 92 may be exposed in different cross-sections from the gate contacts 110, thereby reducing the risk of shorting between the gate contacts 110 and the subsequently formed contacts to the epitaxial source/drain regions 92.

Figure 23A:
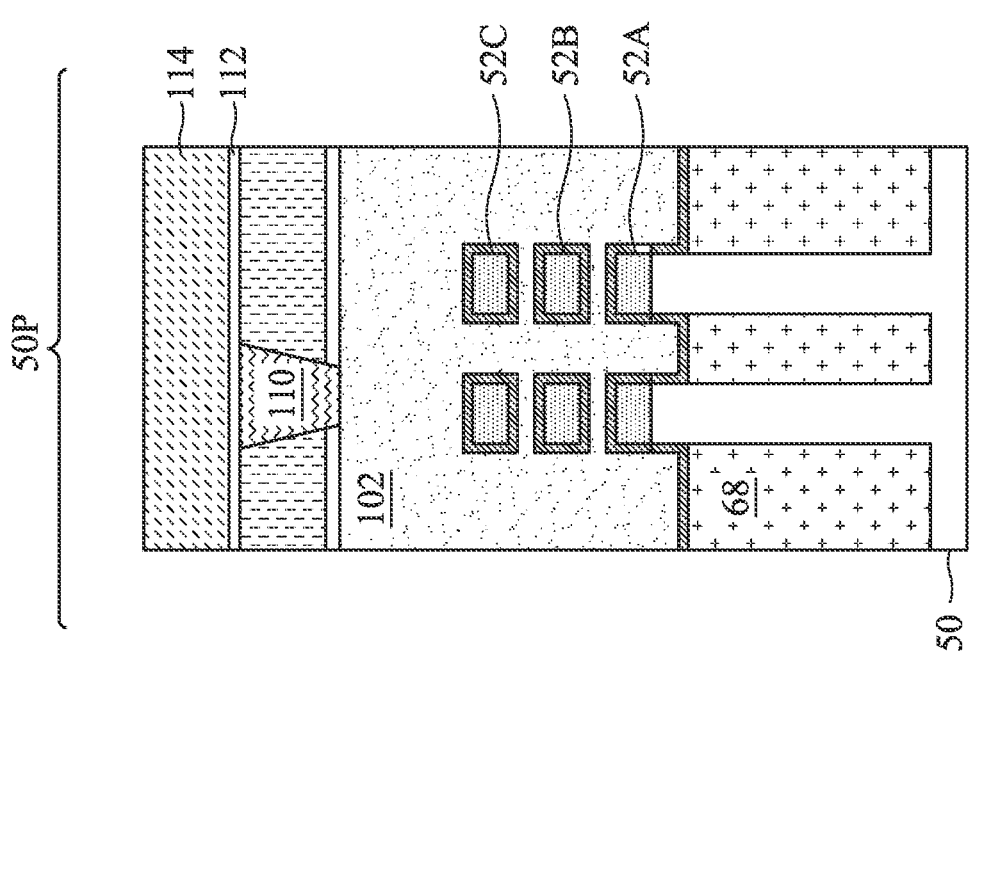
Figure 23A:
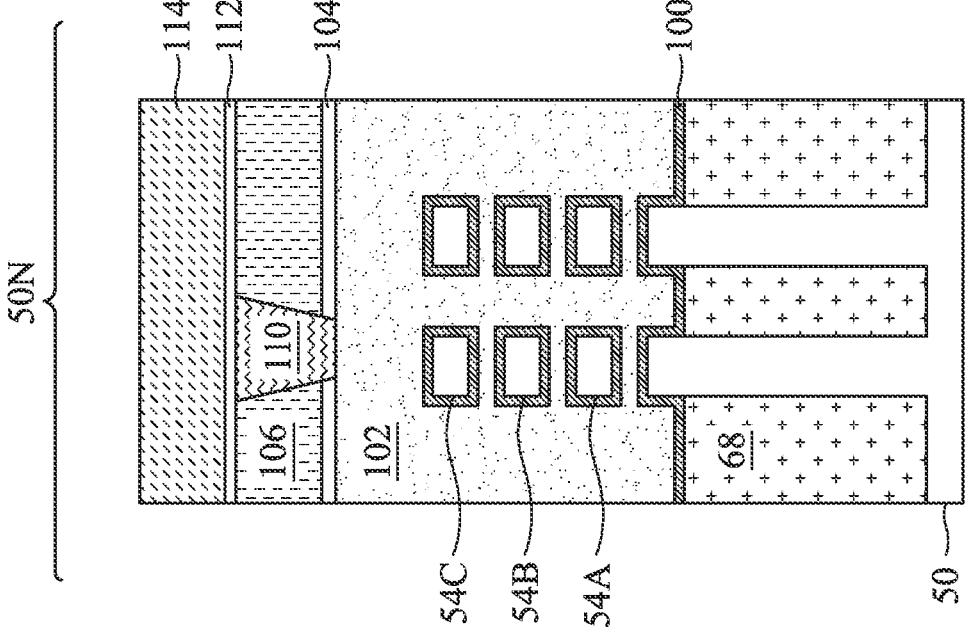
Figure 23B:
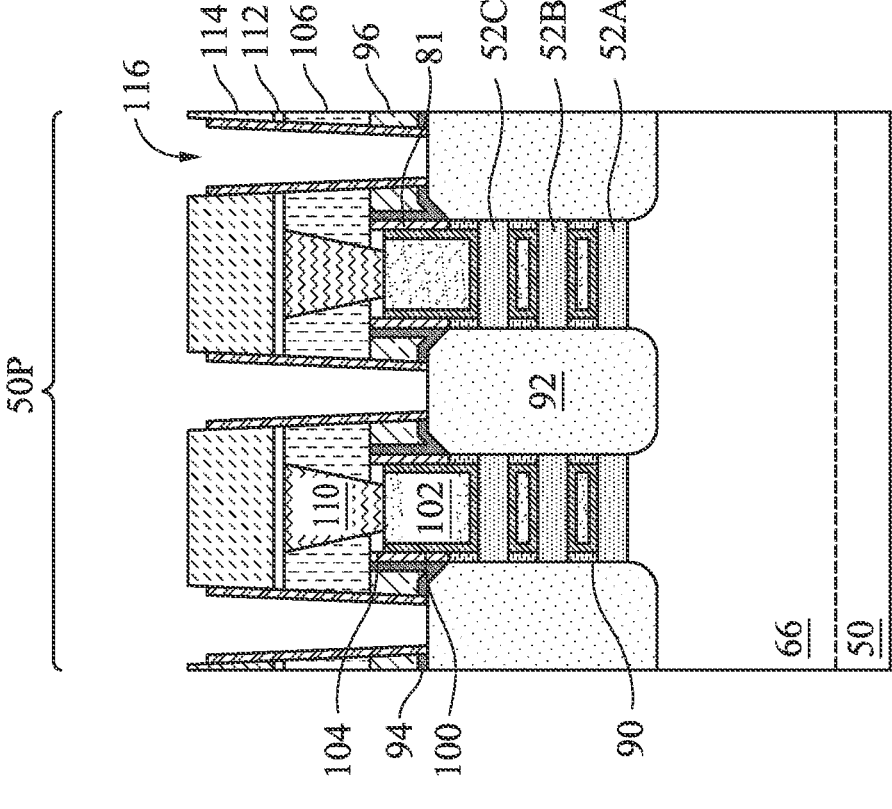
Figure 23B:
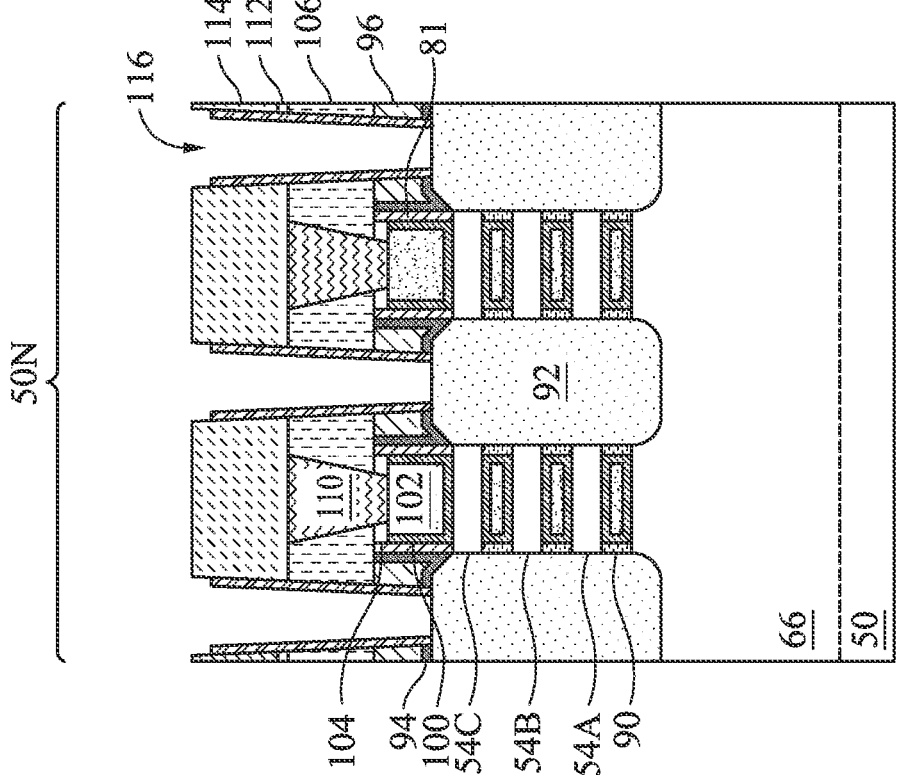
Figure 23C:
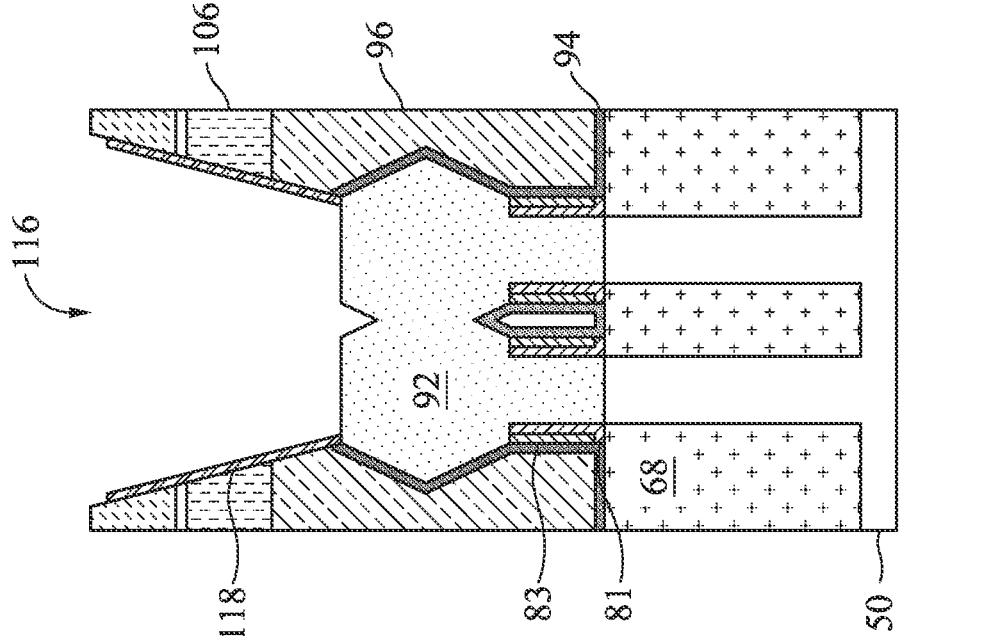

In FIGS. 23A-23C, a dielectric liner 118 is deposited over the third ILD 114 (or over the second ILD 106), along sidewalls of the fourth recesses 116, and over exposed surfaces of the epitaxial source/drain regions 92. In addition, an etch process is performed to remove portions of the dielectric liner 118 and re-expose the epitaxial source/drain regions 92. The dielectric liner 118 may be silicon nitride or the like and may be deposited by any suitable method, such as CVD, PECVD, ALD, or the like. The etch process may be an anisotropic etch, which removes portions of the dielectric liner 118 from an upper surface of the third ILD 114 (or the second ILD 106) and from the upper surfaces of the epitaxial source/drain regions 92.

Figure 24A:
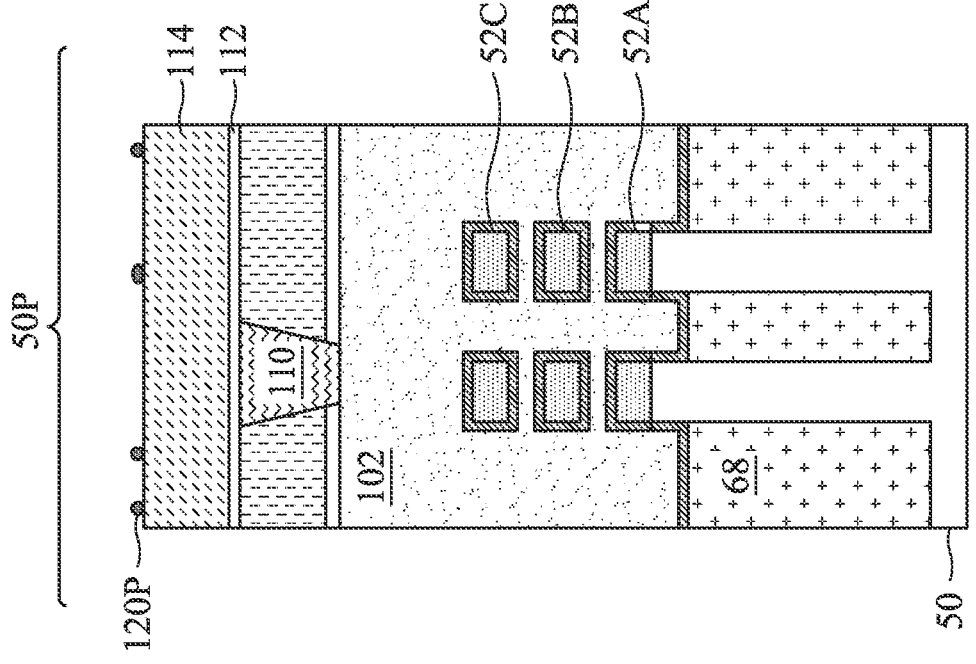
Figure 24A:
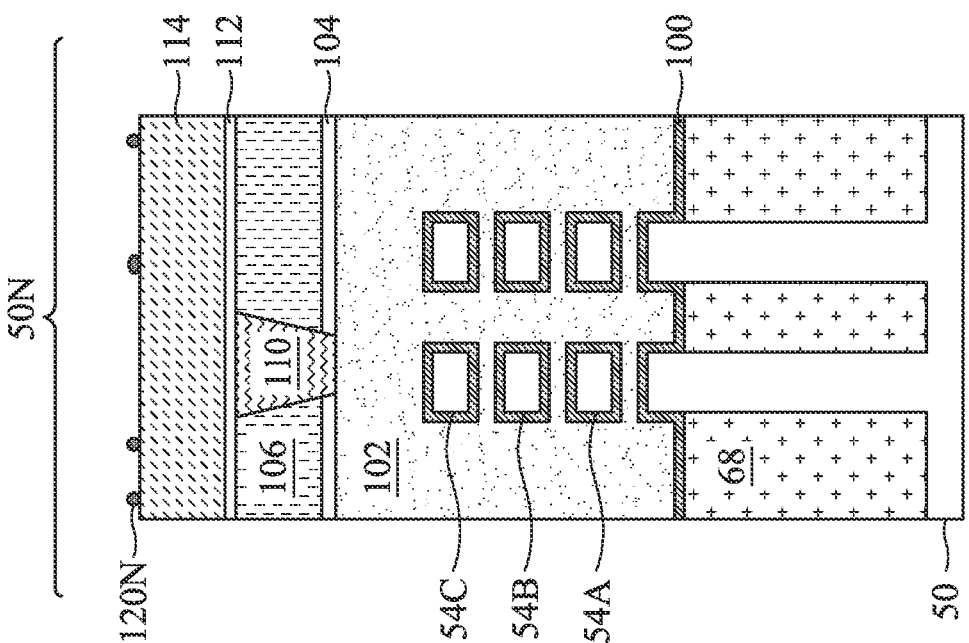
Figure 24B:
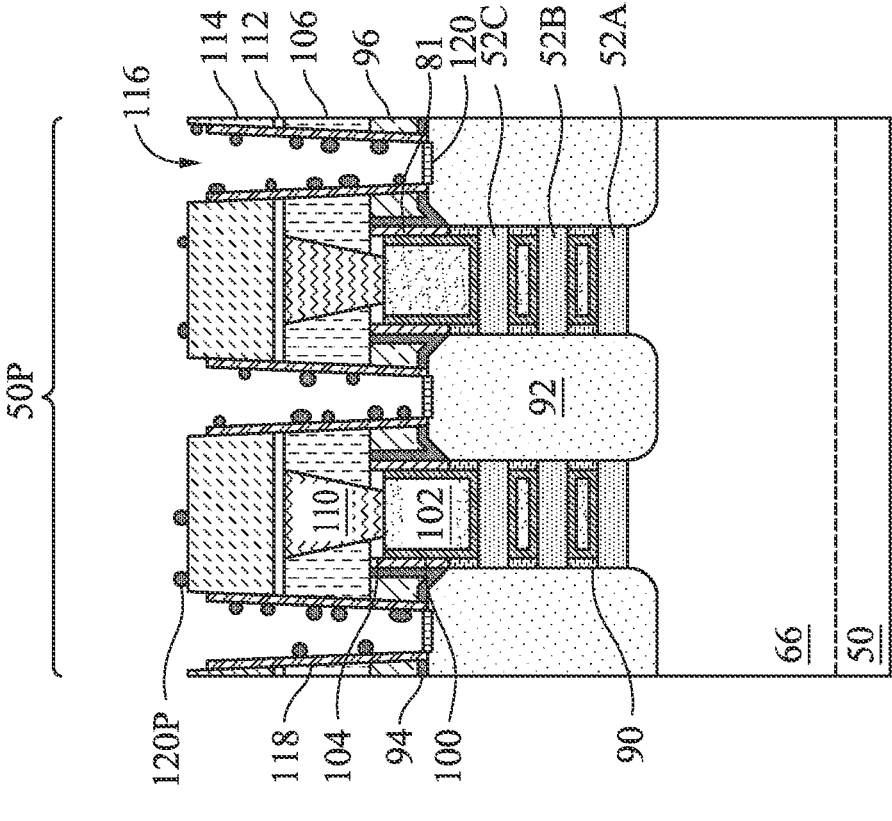
Figure 24B:
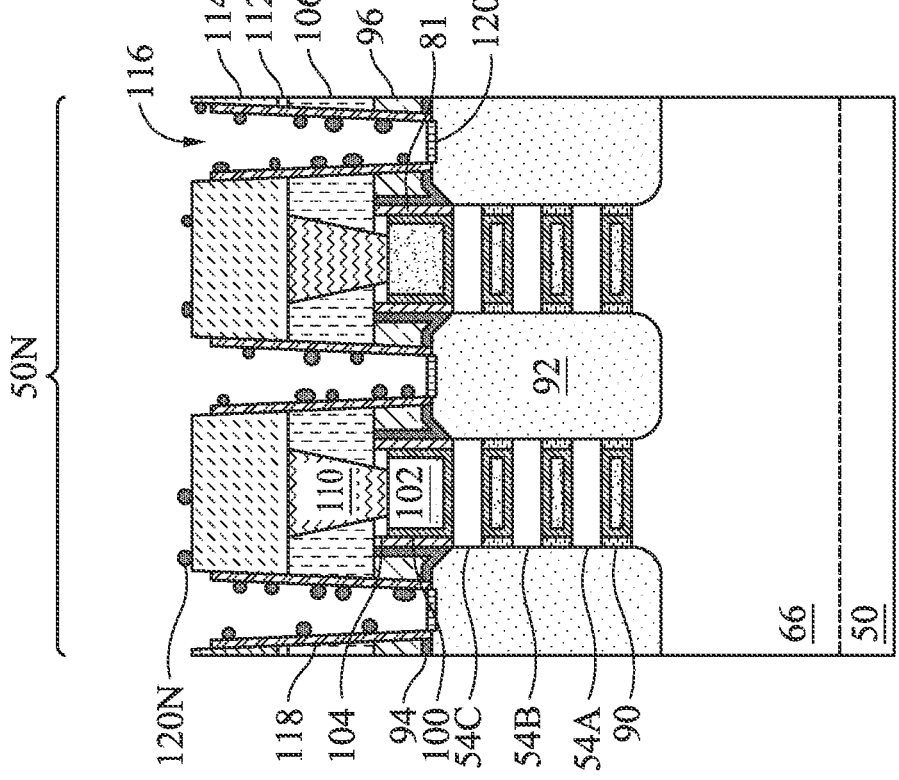
Figure 24C:
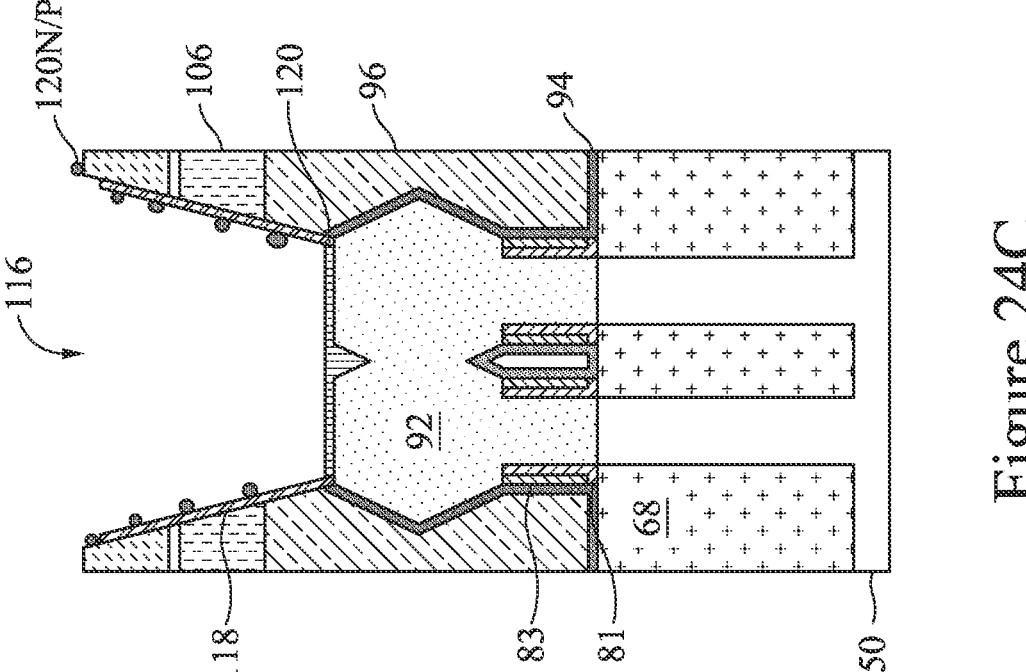

In FIGS. 24A-24C, epitaxial caps 120 are formed on the exposed epitaxial source/drain regions 92, and nodules 120N may form on other surfaces within the n-type region 50N and nodules 120P may form on other surfaces within the p-type region 50P. In some embodiments, the epitaxial caps 120 in the n-type region 50N are formed while the p-type region 50P is masked, and the epitaxial caps 120 in the p-type region 50P are formed while the n-type region 50N is masked. The epitaxial caps 120 may replenish material of the epitaxial source/drain regions 92 that may have been lost from over-etching during formation of the fourth recesses 116 (see FIGS. 22A-22C) and/or during etching of the dielectric liner 118 (see FIGS. 23A-23C). As such, the epitaxial caps 120 may be considered part of the corresponding epitaxial source/drain regions 92.

In accordance with some embodiments, the epitaxial caps 120 formed in the n-type region 50N may be a same or similar material as the epitaxial source/drain regions 92 in the n-type region 50N (e.g., the third semiconductor material layer 92C, see FIGS. 12A-12D), such as phosphorous-doped silicon. The epitaxial caps 120 formed in the p-type region 50P may be a same or similar material as the epitaxial source/drain regions 92 in the p-type region 50P (e.g., the third semiconductor material layer 92C, see FIGS. 12A-12D), such as boron-doped silicon germanium. In some embodiments, the epitaxial caps 120 are formed of a similar material with a different composition as compared with the exposed portions of the epitaxial source/drain regions 92. The epitaxial caps 120 may serve to decrease resistance between the subsequently formed source/drain contacts (e.g., including a silicide portion of the source/drain contacts) and the epitaxial source/drain regions 92. The nodules 120N, 120P may be non-crystalline (e.g., amorphous and/or polycrystalline) comprising the same epitaxial material forming the epitaxial caps 120 in the n-type region 50N and the p-type region 50P, respectively. For example, the epitaxial caps 120 may be formed using low temperature epitaxial processes, such as temperatures at or less than 400° C.

In accordance with some embodiments, similarly as with the nodules 92N, the nodules 120N (e.g., small clusters of the epitaxial material) may grow along the third ILD 114 and sidewalls of the fourth recesses 116 (e.g., the dielectric liner 118) in the n-type region 50N during formation of the epitaxial caps 120 in the n-type region 50N. Similarly, the nodules 120P (e.g., small clusters of the epitaxial material) may grow along the third ILD 114 and sidewalls of the fourth recesses 116 (e.g., the dielectric liner 118) in the p-type region 50P during formation of the epitaxial caps 120 in the p-type region 50P. For example, the nodules 120N may be silicon and/or phosphorous-doped silicon (or the like), and the nodules 120P may be silicon germanium and/or boron-doped silicon germanium (or the like). As illustrated, each of the epitaxial caps 120 forms to become one continuous material with the epitaxial source/drain regions 92, while the nodules 120N, 120P form as discontinuous clusters or discontinuous nodules. As discussed above, in some embodiments, some or all of the nodules 120N, 120P may be polycrystalline, amorphous, or combinations thereof.

Figure 25A:
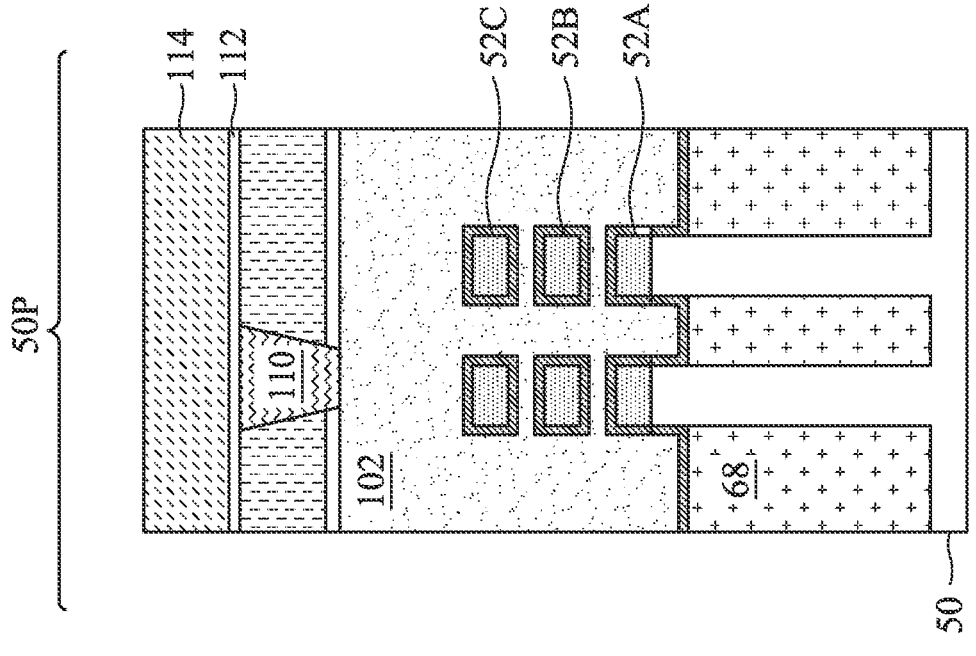
Figure 25A:
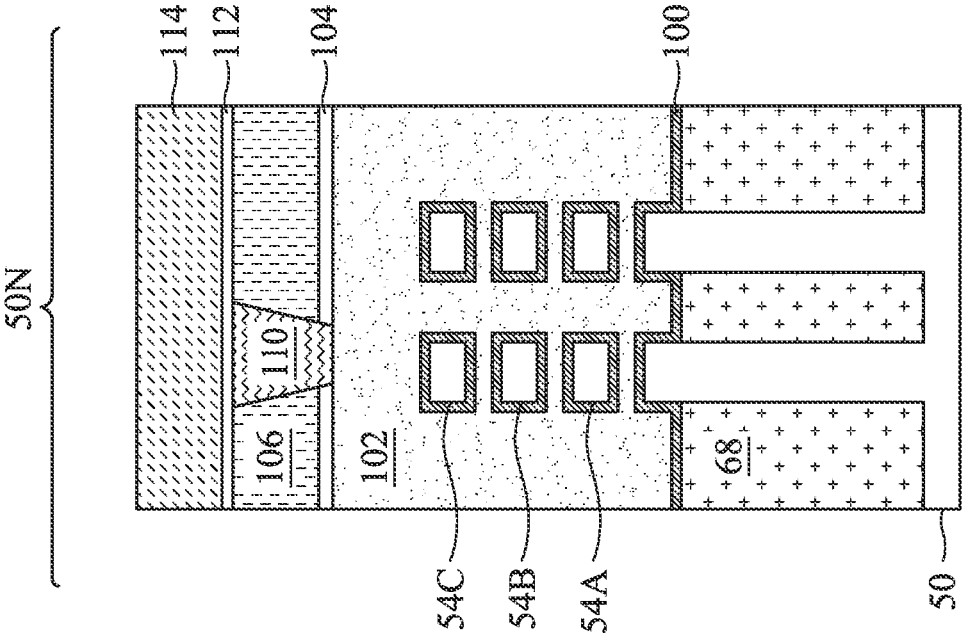
Figure 25B:
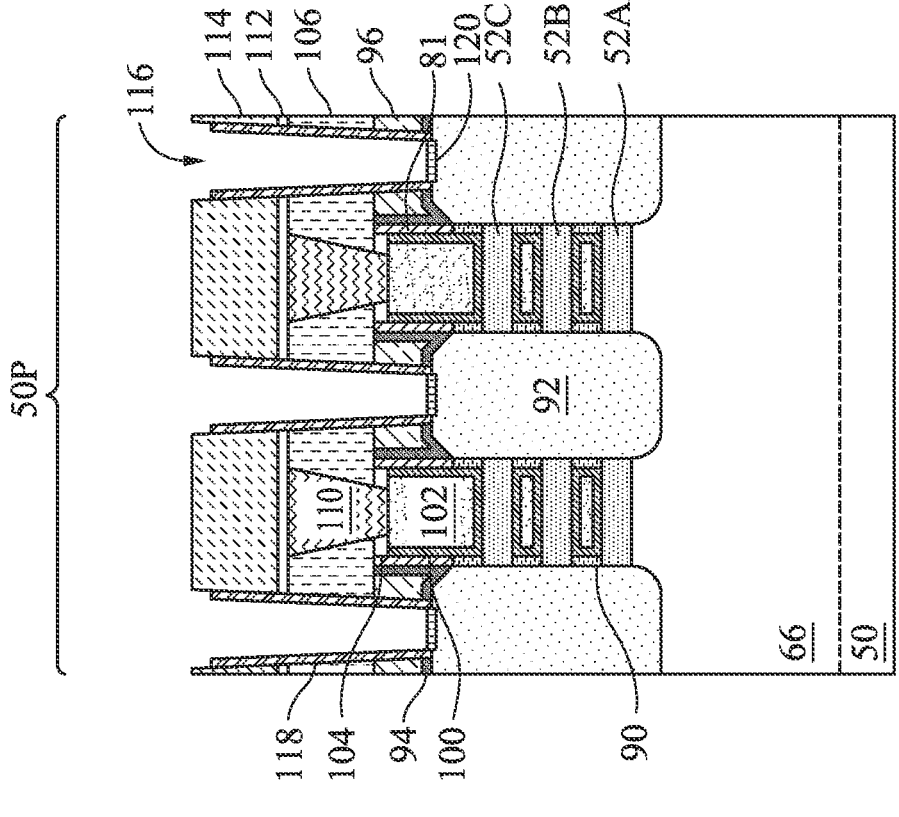
Figure 25B:
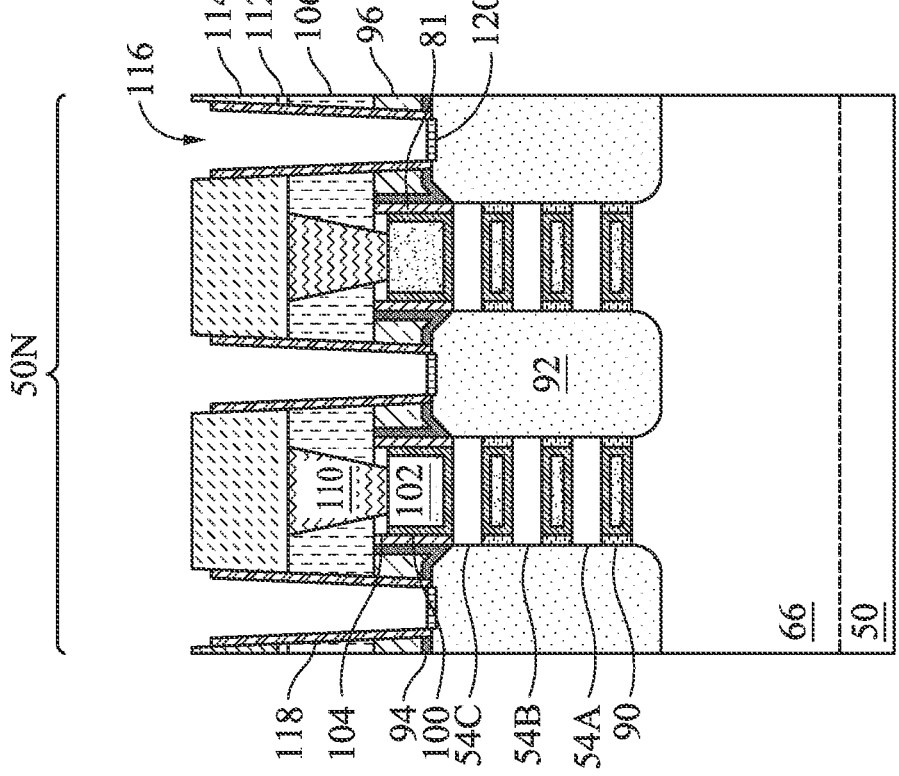
Figure 25C:
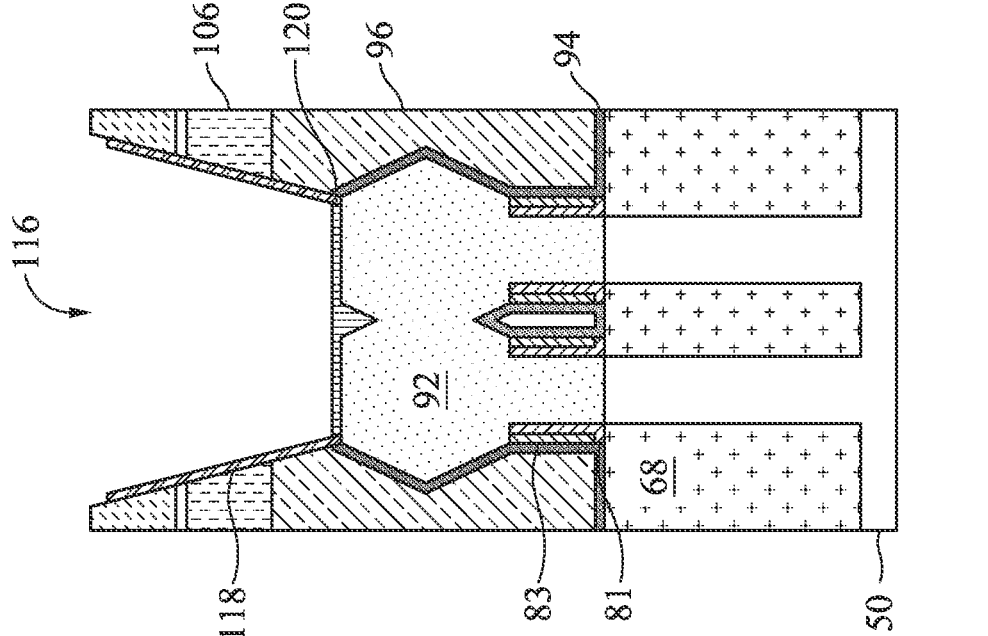

In FIGS. 25A-25C, one or more cleaning processes are performed to remove the nodules 120N, 120P. Similarly as described above in connection with FIGS. 13A-13D, an NFET cleaning process is performed to remove the nodules 120N in the n-type region 50N while the p-type region 50P is masked. In addition, a PFET cleaning process is performed to remove the nodules 120P in the p-type region 50P while the n-type region 50N is masked.

Similarly as discussed above, the NFET cleaning process includes flowing gaseous precursors fluorine ($F^2$) and ammonia ($NH_3$) to remove the nodules 120N, and the PFET cleaning process includes flowing gaseous precursors fluorine ($F_2$) and hydrogen fluoride (HF) to remove the nodules 120P. The cleaning processes may be performed according to the other parameters identified previously in regard to the cleaning processes used to remove the nodules 92N, 92P (see FIGS. 13A-13D). In some embodiments, the cleaning processes may be performed for a shorter duration (e.g., for a duration of about or less than 3 minutes) as discussed above regarding the nodules 92N, 92P due to fewer and/or smaller nodules 120N, 120P being formed as compared with the nodules 92N, 92P. Note that the process parameters may be adjusted based on quantity, total volume, individual size, and surface area of coverage of the nodules 120N, 120P.

The cleaning processes achieve similar benefits as discussed above (e.g., preventing etching or damage to the epitaxial source/drain regions 92 and other exposed features) and may also similarly increase a roughness of surfaces of certain layers by etching exposed portions of those layers while removing the nodules 120N, 120P. For example, exposed surfaces of silicon nitride (e.g., the dielectric liner 118) may increase in roughness from 1-2 Å to 4-5 Å, such as increasing in roughness by 2-3 Å or by two to five times the previous roughness. In addition, the cleaning processes may remove up to about 90% of the quantity and/or volume of the nodules 120N, 120P. Similarly, the cleaning processes may decrease the surface area coverage of the nodules 120N, 120P by up to about 90%.

Note that the quantity, total volume, individual size, and surface area coverage of the nodules 120N, 120P may be less than those corresponding metrics for the nodules 92N, 92P due to differing process conditions and durations for the formation of the epitaxial caps 120 as compared to the formation of the epitaxial source/drain regions 92. As such, in some embodiments, the dielectric liner 118 may increase in roughness from 1-2 Å to 2-3 Å, such as increasing in roughness by up to about 1 Å or by up to two times the previous roughness. For example, after the cleaning processes to remove the nodules 120N, 120P, the dielectric liner 118 may be less rough (e.g., increase in roughness by a lesser amount) than the first spacers 81 and the second spacers 83 after the cleaning processes to remove the nodules 92N, 92P.

Figure 26A:
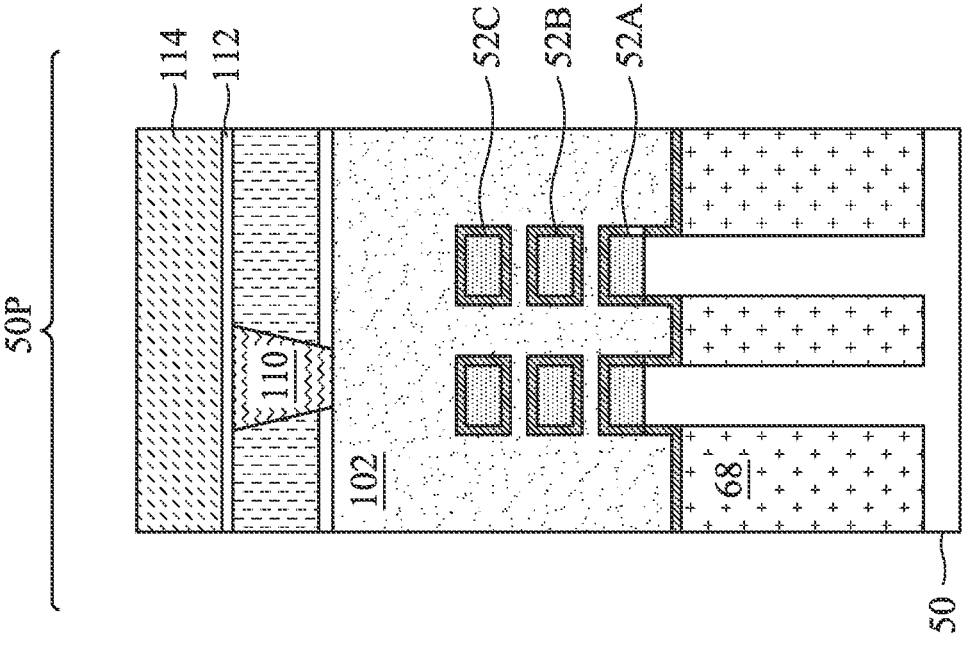
Figure 26A:
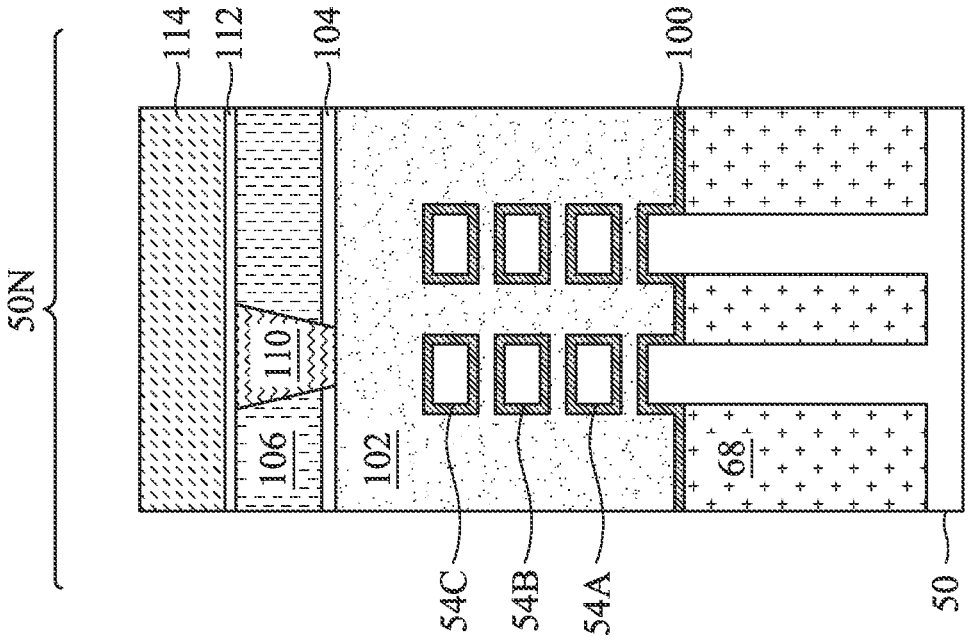
Figure 26B:
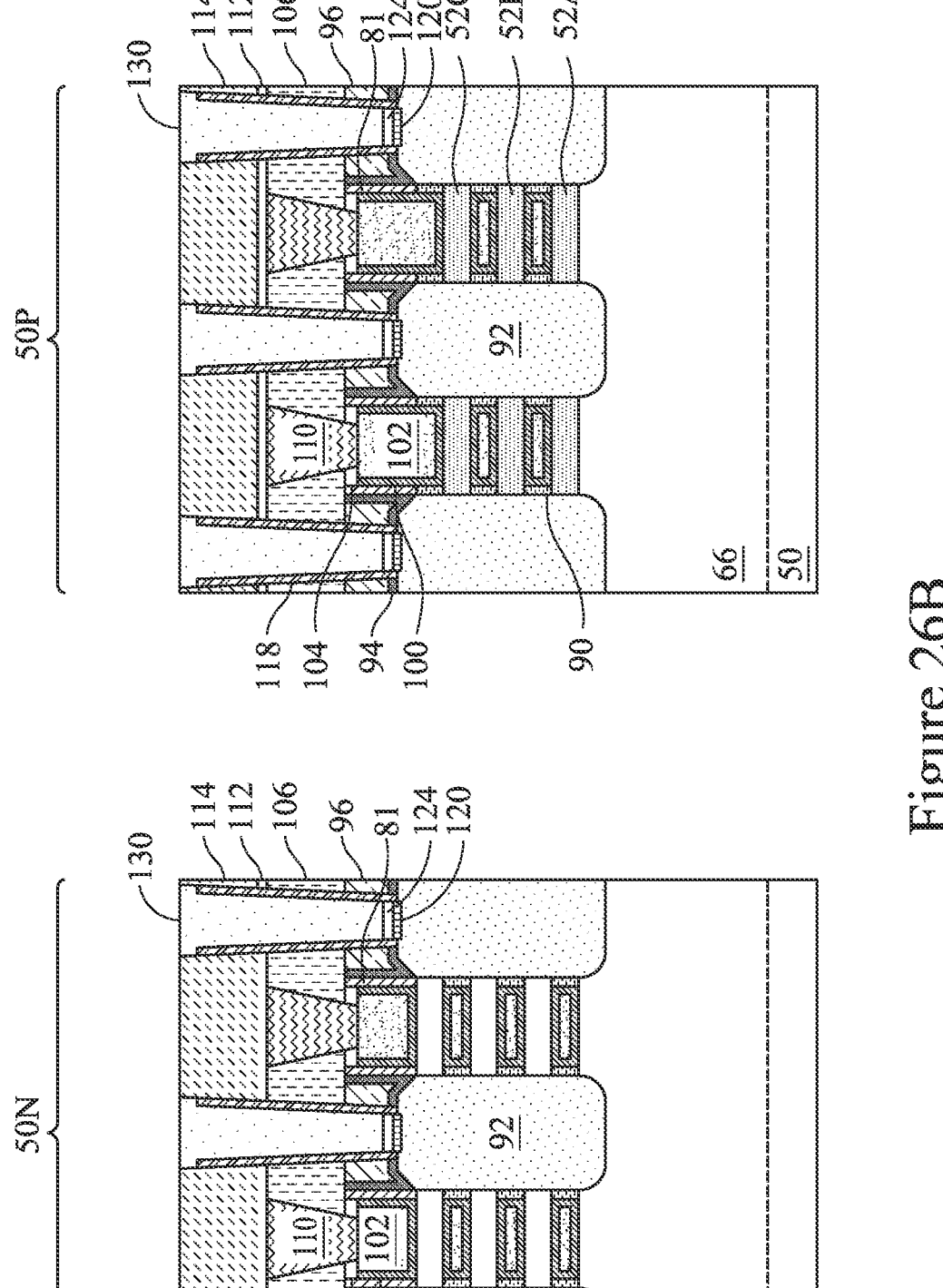
Figure 26C:
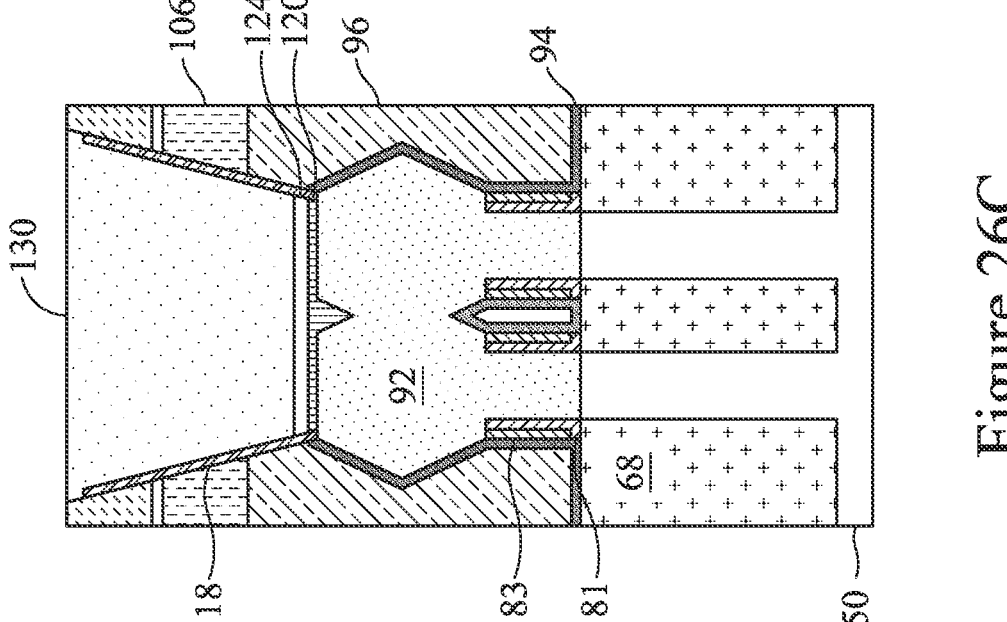

In FIGS. 26A-26C, silicide regions 124 and contacts 130 (may also be referred to as contact plugs, source/drain contacts, or source/drain contact plugs) are formed in the fourth recesses 116. For example, after forming the epitaxial caps 120 and removing the nodules 120N, 120P, silicide regions 124 are formed over the epitaxial source/drain regions 92 (e.g., over the epitaxial caps 120). In some embodiments, the silicide regions 124 are formed by first depositing a metal (not specifically illustrated) capable of reacting with the semiconductor materials of the underlying epitaxial caps 120 (e.g., silicon, silicon germanium, germanium) to form silicide and/or germanide regions, such as nickel, cobalt, titanium, tantalum, platinum, tungsten, other noble metals, other refractory metals, rare earth metals or their alloys, over the exposed portions of the epitaxial source/drain regions 92 (e.g., the epitaxial caps 120), then performing a thermal anneal process to form the silicide regions 124. The unreacted portions of the deposited metal are then removed, e.g., by an etching process. Although the silicide regions 124 are referred to as silicide regions, as noted above, the silicide regions 124 may also be germanide regions, or silicon germanide regions (e.g., regions comprising silicide and germanide). In an embodiment, the silicide region 124 comprises TiSi.

The contacts 130 may each comprise one or more layers, such as barrier layers, diffusion layers, and fill materials. For example, in some embodiments, the contacts 130 each include a barrier layer and a conductive material, and is electrically coupled to the underlying conductive feature (e.g., the silicide region 124 in the illustrated embodiment). The contacts 130 are electrically coupled to the silicide regions 124 and may be referred to as source/drain contacts. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the third ILD 114.

Although not specifically illustrated, in some embodiments, the contacts 130 are formed without first forming the third ILD 114 and the CESL 112. For example, the fourth recesses 116 may be formed through the second ILD 106 similarly as the third recesses 108. The additional steps such as forming the dielectric liner 118, etching the dielectric liner 118, forming the epitaxial caps 120, removing the nodules 120N, 120P, forming the silicide regions 124, and forming the contacts 130 may be performed similarly as described above.

In accordance with some embodiments (not specifically illustrated), a front-side interconnect structure is formed over the structure and electrically connected to the active devices (e.g., the nano-FETs) along the front-side of the substrate 50. A carrier substrate (not specifically illustrated) may be attached to the front-side of the structure, and the structure may be flipped for back-side processing. For example, as discussed below, back-side contacts may be formed to the epitaxial source/drain regions 92. In addition, although not specifically illustrated, back-side contacts may be formed to the gate electrodes 102 or other features of the structure, a back-side interconnect structure may be formed and electrically connected to the active devices, and/or external connectors may be formed over the back-side or the front-side of the structure.

FIGS. 27A-29C illustrate back-side processing of the structure, in accordance with some embodiments. In particular, back-side contacts are formed similarly as described above in connection with the contacts 130 to the epitaxial source/drain regions 92, unless otherwise stated.

Figure 27A:
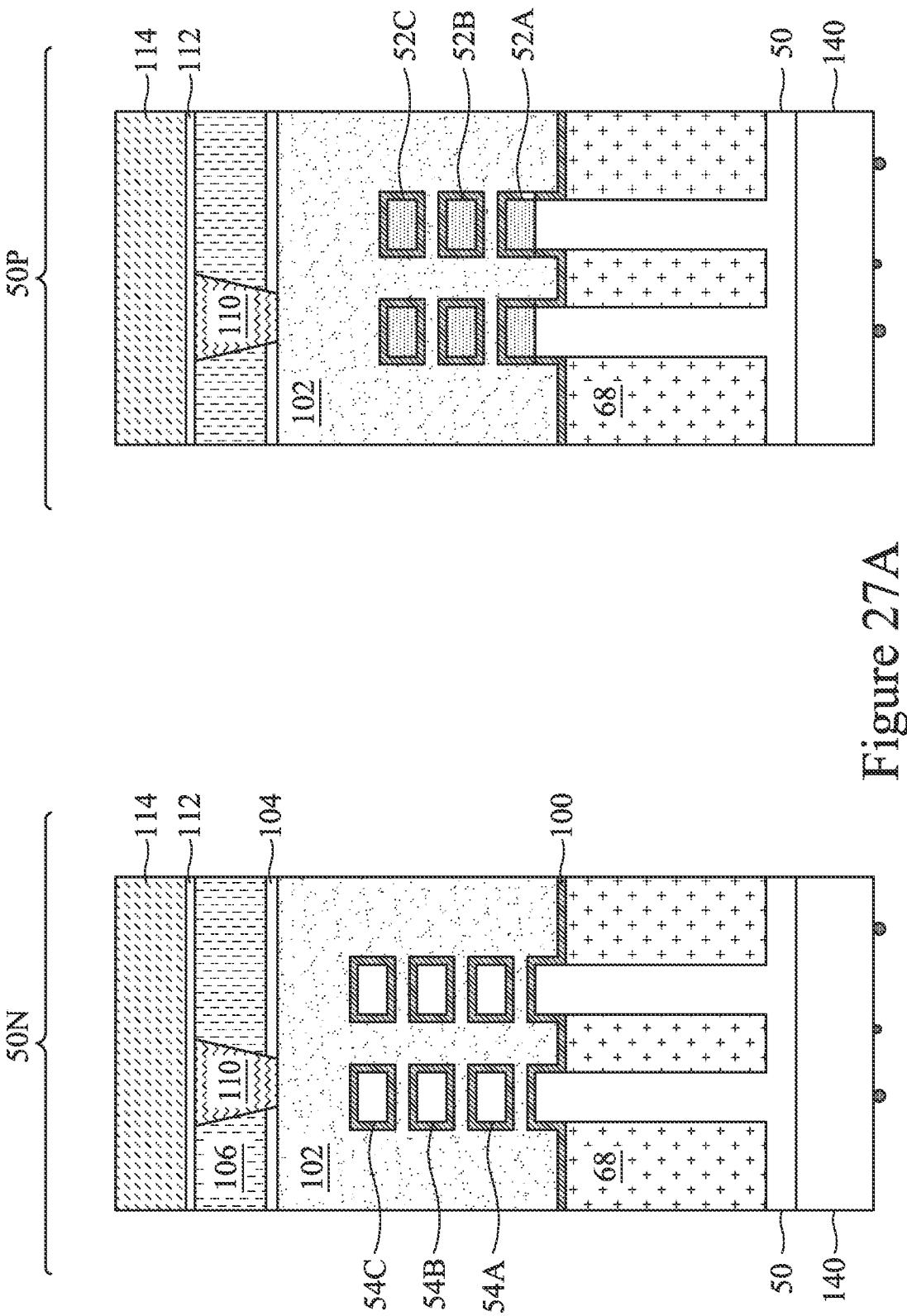
Figure 27B:
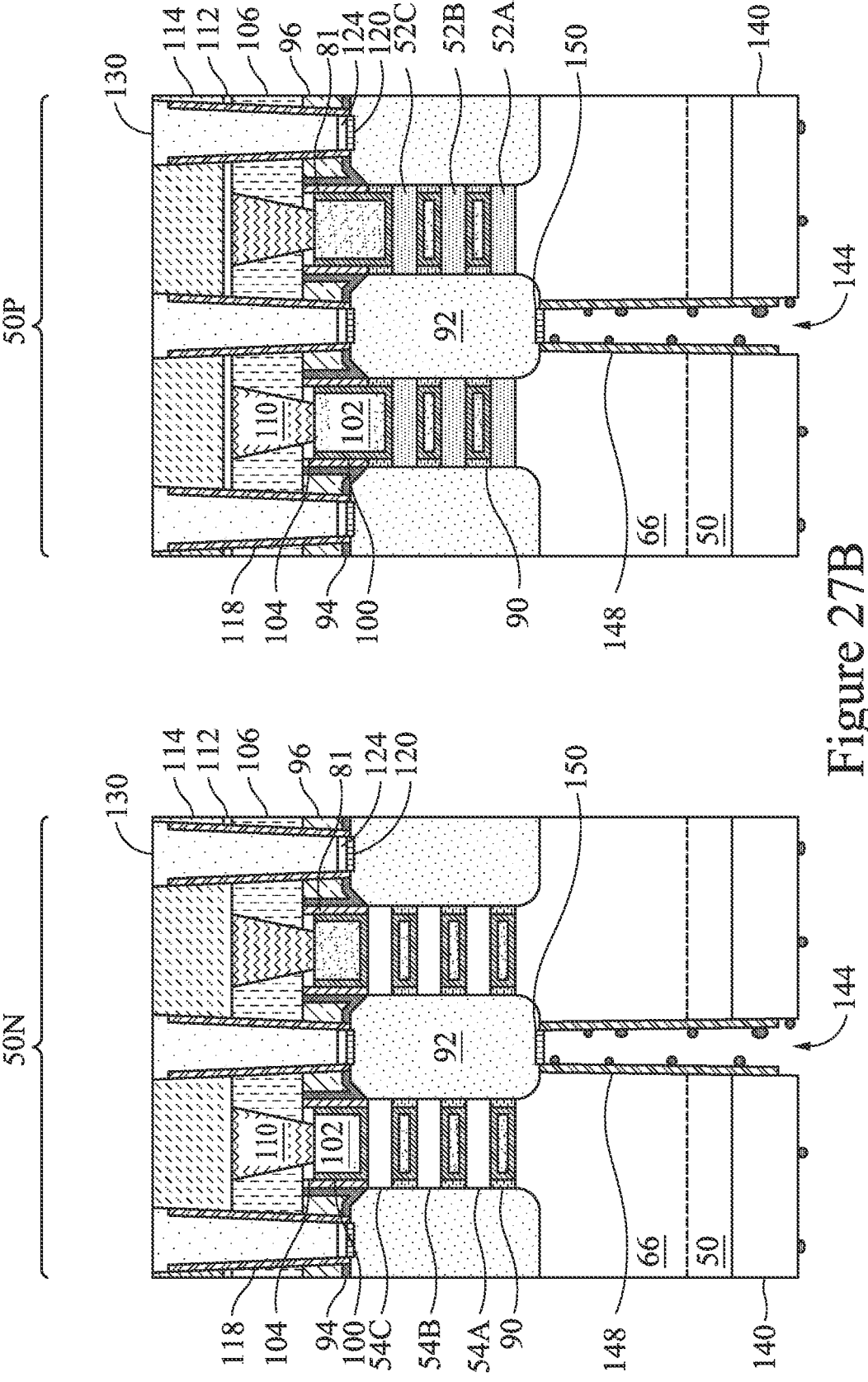
Figure 27C:
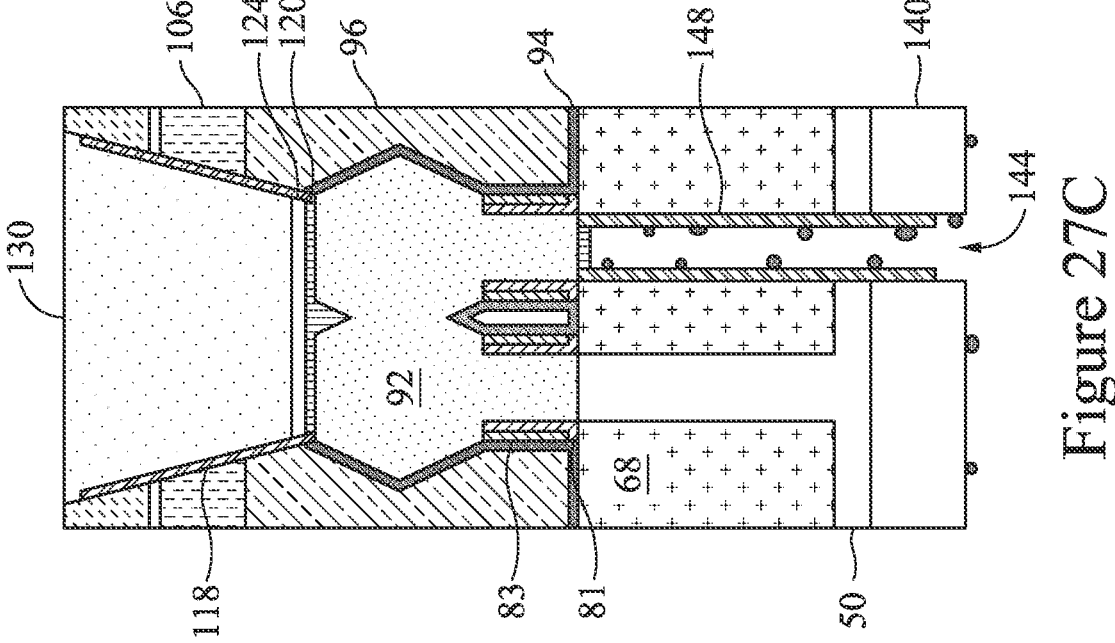

In FIGS. 27A-27C, a thinning process may be applied to the back-side of the substrate 50. In addition, an etch process may be performed to form fifth recesses 144 exposing back-sides of the epitaxial source/drain regions 92, a dielectric liner 148 may be deposited and partially etched, and epitaxial caps 150 may be formed on the exposed back-sides of the epitaxial source/drain regions 92. In some embodiments, the thinning process may comprise a planarization process (e.g., a mechanical grinding, a CMP, or the like), an etch-back process, a combination thereof, or the like. In embodiments wherein the wafer (e.g., the substrate 50) is an SOI substrate, the thinning process may expose the insulator region of the SOI. For example, as discussed above in connection with FIG. 2, the SOI substrate may include a layer of a semiconductor material (e.g., labeled as the substrate 50) formed on an insulator layer 140. The insulator layer 140 layer may be, for example, a buried oxide (BOX) layer, a silicon oxide layer, or the like. In such embodiments, the thinning process may be performed until the insulator layer 140 is exposed. In some embodiments, a dielectric layer is formed along the back-side of the thinned substrate 50, and the dielectric layer may be referred to as or included collectively with the illustrated insulator layer 140. For example, in embodiments in which the substrate 50 is entirely a semiconductor substrate, the dielectric layer formed along the thinned back-side may be the illustrated insulator layer 140 deposited by any suitable method. Further, a portion of the substrate 50 may remain adjacent the gate structures (e.g., the gate electrodes 102 and the gate dielectric layers 100) and the nanostructures 55 after the thinning process. In some embodiments (not specifically illustrated), back-side surfaces of the substrate 50, the epitaxial source/drain regions 92, the STI regions 68, and the fins 66 may be level with one another following the thinning process.

In accordance with some embodiments, fifth recesses 144 may be formed by etching using an anisotropic etching process, such as RIE, NBE, or the like. In some embodiments, the fifth recesses 144 may be etched through the insulator layer 140, the substrate 50, and fins 66 using one or more etching processes. A mask, such as a photoresist, may be formed and patterned over the insulator layer 140 to mask other portions from the etching process. In some embodiments, the etching process may over-etch, and therefore, the fifth recesses 144 extend into the back-sides of the epitaxial source/drain regions 92. As illustrated in FIG. 27B, the fifth recesses 144 may have angled sidewalls (e.g., non-parallel) through the fin 66 and the substrate 50. As illustrated in FIG. 27C, the fifth recesses 144 may have substantially parallel sidewalls taking the shape of the outer walls of the corresponding fins 66. Sidewalls of the subsequently formed dielectric liner 148 and contacts 160 (see FIGS. 29B and 29C) may have these analogous shapes.

After forming the fifth recesses 144, a dielectric liner 148 is deposited over the insulator layer 140, along sidewalls of the fifth recesses 144, and over exposed surfaces of the epitaxial source/drain regions 92, similarly as described above in connection with the dielectric liner 118. In addition, an etch process is performed to remove portions of the dielectric liner 148 and re-expose the back-sides of the epitaxial source/drain regions 92. The dielectric liner 148 may be silicon nitride or the like and may be deposited by any suitable method, such as CVD, PECVD, ALD, or the like. The etch process may be an anisotropic etch, which removes portions of the dielectric liner 148 from a surface of the insulator layer 140 and from surfaces of the epitaxial source/drain regions 92.

Still referring to FIGS. 27A-27C, back-side epitaxial caps 150 are formed on the exposed back-sides of the epitaxial source/drain regions 92, and nodules 150N may form on other surfaces within the n-type region 50N and nodules 150P may form on other surfaces within the p-type region 50P, similarly as described above in connection with the epitaxial caps 120 and the nodules 120N, 120P. In some embodiments, the back-side epitaxial caps 150 in the n-type region 50N are formed while the p-type region 50P is masked, and the back-side epitaxial caps 150 in the p-type region 50P are formed while the n-type region 50N is masked. The back-side epitaxial caps 150 may replenish material of the back-sides of the epitaxial source/drain regions 92 that may have been lost from over-etching during formation of the fifth recesses 144 and/or during etching of the dielectric liner 148. As such, the back-side epitaxial caps 150 may be considered part of the corresponding epitaxial source/drain regions 92.

In accordance with some embodiments, the back-side epitaxial caps 150 formed in the n-type region 50N may be a same or similar material as the epitaxial source/drain regions 92 in the n-type region 50N (e.g., the first semiconductor material layer 92A, see FIGS. 12A-12D), such as phosphorous-doped silicon. The back-side epitaxial caps 150 formed in the p-type region 50P may be a same or similar material as the epitaxial source/drain regions 92 in the p-type region 50P (e.g., the first semiconductor material layer 92A, see FIGS. 12A-12D), such as boron-doped silicon germanium. In some embodiments, the back-side epitaxial caps 150 are formed of a similar material with a different composition as compared with the exposed portions of the epitaxial source/drain regions 92. The back-side epitaxial caps 150 may serve to decrease resistance between the subsequently formed source/drain contacts (e.g., including a silicide portion of the source/drain contacts) and the epitaxial source/drain regions 92. The nodules 150N, 150P may be non-crystalline (e.g., amorphous and/or polycrystalline) comprising the same epitaxial material forming the back-side epitaxial caps 150 in the n-type region 50N and the p-type region 50P, respectively. For example, the epitaxial caps 150 may be formed using low temperature epitaxial processes, such as temperatures at or less than 400° C.

In accordance with some embodiments, similarly as with the nodules 92N and the nodules 120N, the nodules 150N (e.g., small clusters of the epitaxial material) may grow along the insulator layer 140 and sidewalls of the fifth recesses 144 (e.g., the dielectric liner 148) in the n-type region 50N during formation of the epitaxial caps 150 in the n-type region 50N. Similarly, the nodules 150P (e.g., small clusters of the epitaxial material) may grow along the insulator layer 140 and sidewalls of the fifth recesses 144 (e.g., the dielectric liner 148) in the p-type region 50P during formation of the epitaxial caps 150 in the p-type region 50P. For example, the nodules 150N may be silicon and/or phosphorous-doped silicon (or the like), and the nodules 150P may be silicon germanium and/or boron-doped silicon germanium (or the like). As illustrated, each of the epitaxial caps 150 forms to become one continuous material with the back-sides of the epitaxial source/drain regions 92, while the nodules 150N, 150P form as discontinuous clusters or discontinuous nodules. As discussed above, in some embodiments, some or all of the nodules 150N, 150P may be polycrystalline, amorphous, or combinations thereof.

Figure 28A:
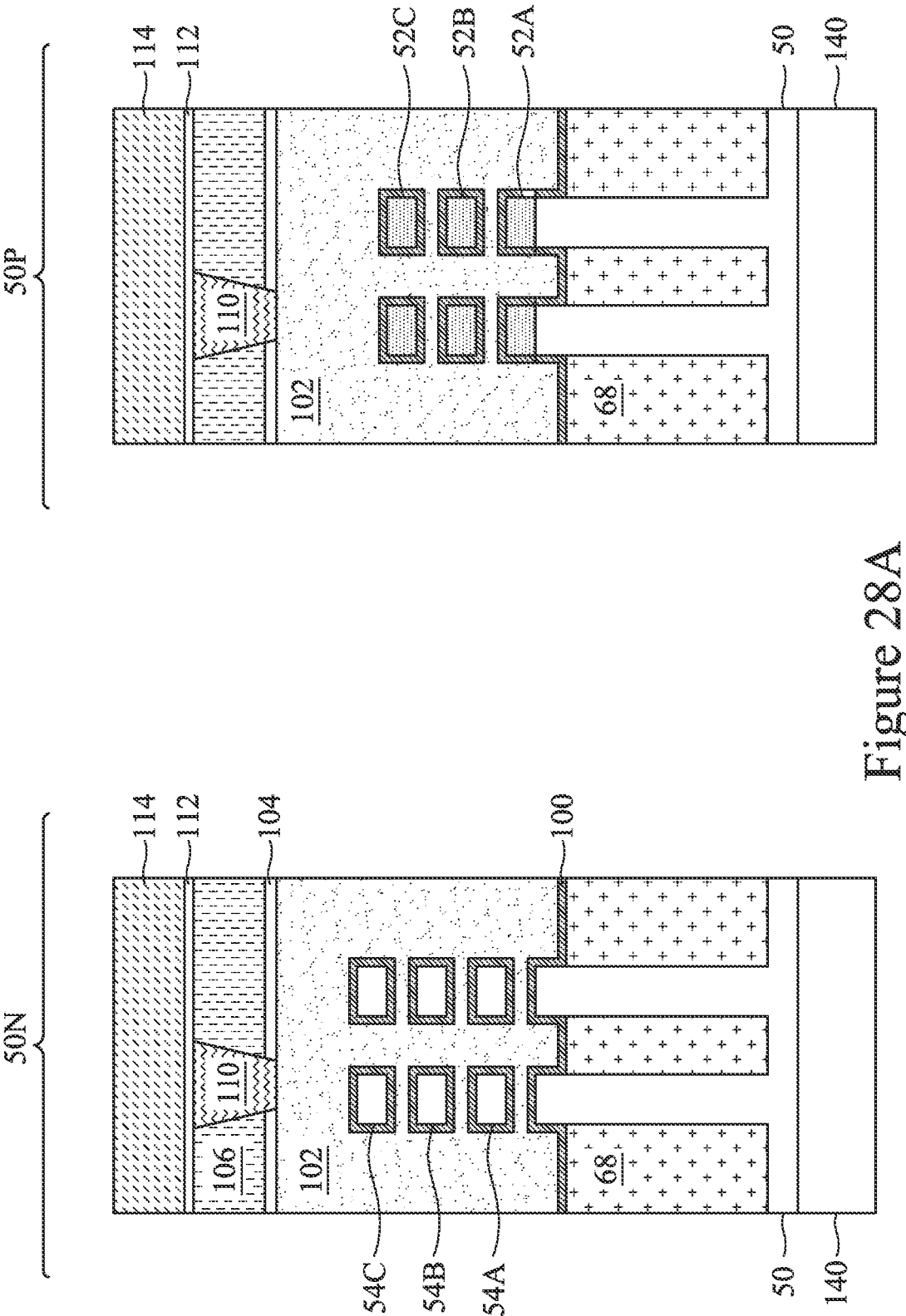
Figure 28B:
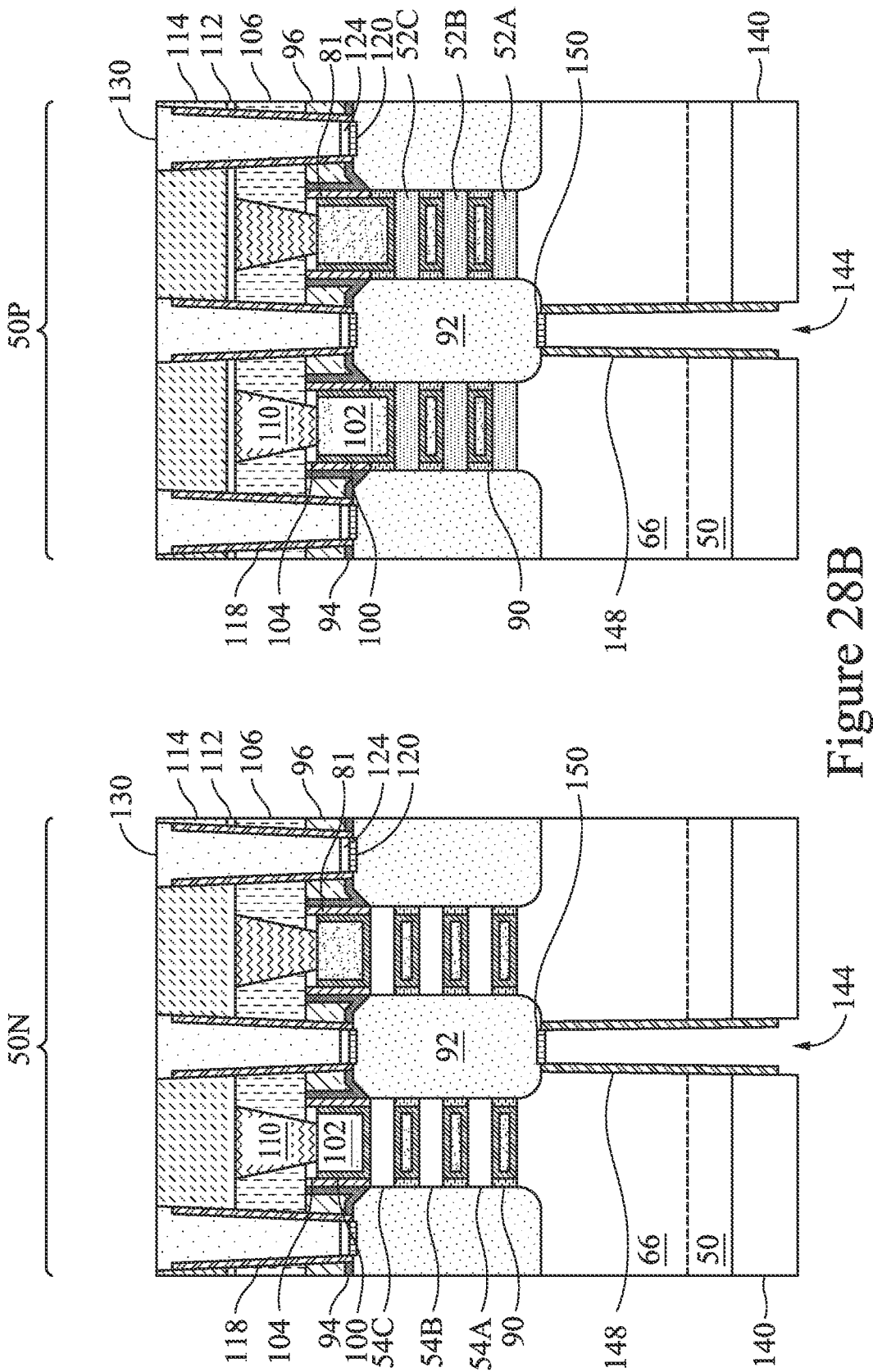
Figure 28C:
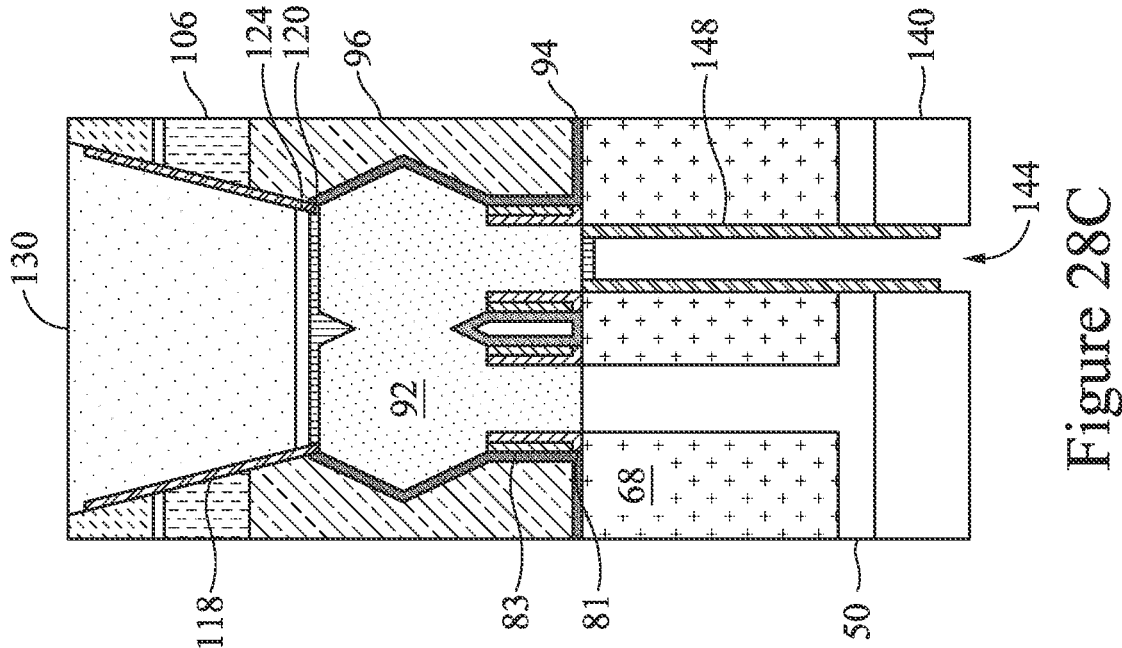

In FIGS. 28A-28C, one or more cleaning processes are performed to remove the nodules 150N, 150P, similarly as described above in connection with removing the nodules 92N, 92P (see FIGS. 13A-13D) and/or removing the nodules 120N, 120P (see FIGS. 25A-25C). For example, an NFET cleaning process is performed to remove the nodules 150N in the n-type region 50N while the p-type region 50P is masked, and a PFET cleaning process is performed to remove the nodules 150P in the p-type region 50P while the n-type region 50N is masked.

Similarly as discussed above, the NFET cleaning process includes flowing gaseous precursors fluorine ($F_2$) and ammonia ($NH_3$) to remove the nodules 150N, and the PFET cleaning process includes flowing gaseous precursors fluorine ($F_2$) and hydrogen fluoride (HF) to remove the nodules 150P. The cleaning processes may be performed according to the other parameters identified previously in regard to the cleaning processes used to remove the nodules 92N, 92P (see FIGS. 13A-13D). In some embodiments, the cleaning processes may be performed for a shorter duration (e.g., for a duration of about or less than 3 minutes) as discussed above regarding the nodules 92N, 92P due to fewer and/or smaller nodules 150N, 150P being formed as compared with the nodules 92N, 92P. Note that the process parameters may be adjusted based on quantity, total volume, individual size, and surface area of coverage of the nodules 150N, 150P.

The cleaning processes achieve similar benefits as discussed above (e.g., preventing etching or damage to the epitaxial source/drain regions 92 and other exposed features) and may also similarly increase a roughness of surfaces of certain layers by etching exposed portions of those layers while removing the nodules 150N, 150P. For example, exposed surfaces of silicon nitride (e.g., the dielectric liner 148) may increase in roughness from 1-2 Å to 4-5 Å, such as increasing in roughness by 2-3 Å or by two to five times the previous roughness. In addition, the cleaning processes may remove up to about 90% of the quantity and/or volume of the nodules 150N, 150P. Similarly, the cleaning processes may decrease the surface area coverage of the nodules 150N, 150P by up to about 90%.

Note that the quantity, total volume, individual size, and surface area coverage of the nodules 150N, 150P may be less than those corresponding metrics for the nodules 92N, 92P due to differing process conditions and durations for the formation of the epitaxial caps 150 as compared to the formation of the epitaxial source/drain regions 92. As such, in some embodiments, the dielectric liner 148 may increase in roughness from 1-2 Å to 2-3 Å, such as increasing in roughness by up to about 1 Å or by up to two times the previous roughness. For example, after the cleaning processes to remove the nodules 150N, 150P, the dielectric liner 148 may be less rough (e.g., increase in roughness by a lesser amount) than the first spacers 81 and the second spacers 83 after the cleaning processes to remove the nodules 92N, 92P. In addition, the dielectric liner 148 may increase in roughness by about the same amount as (and result in a similar roughness as) the dielectric liner 118.

Figure 29A:
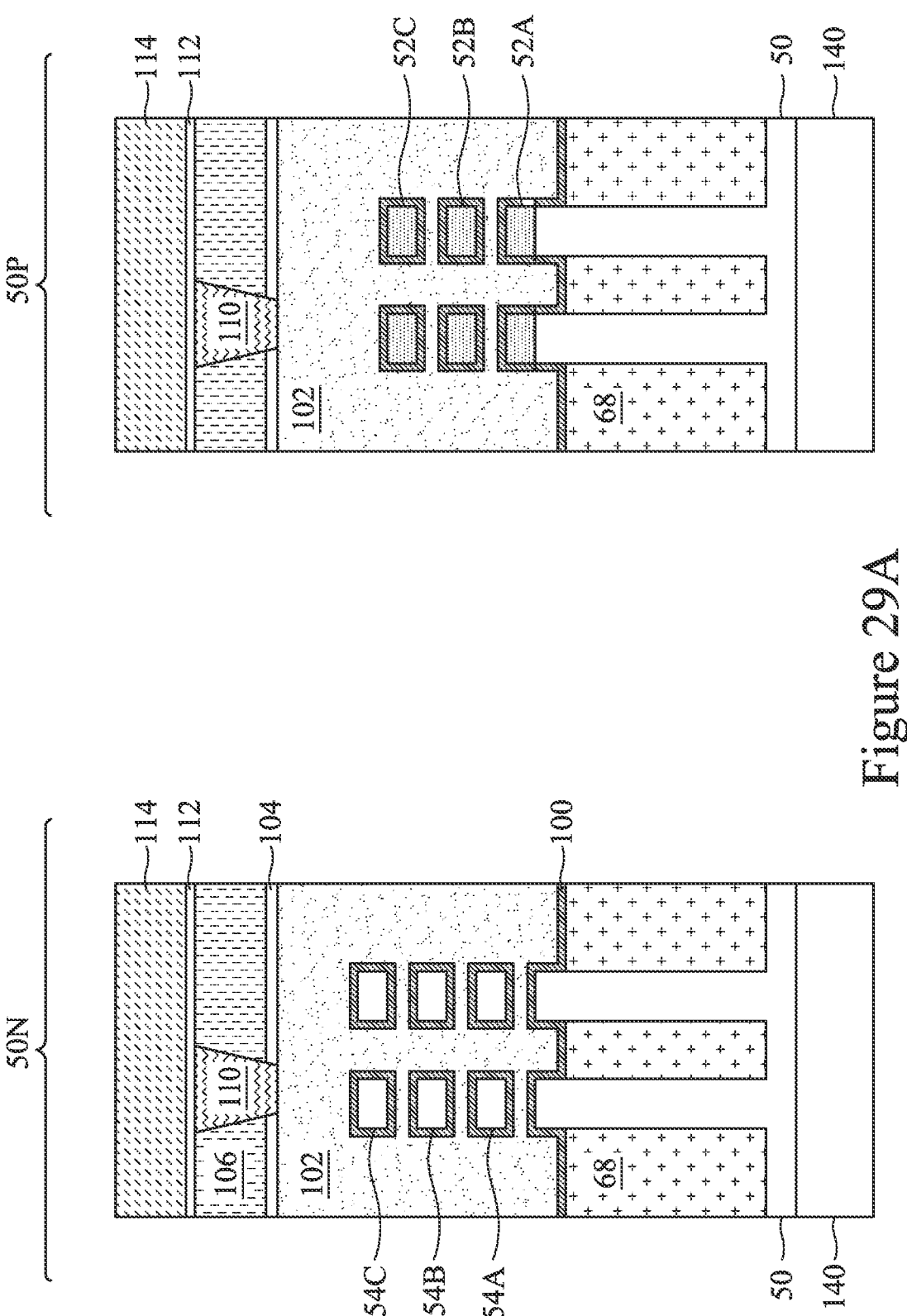
Figure 29B:
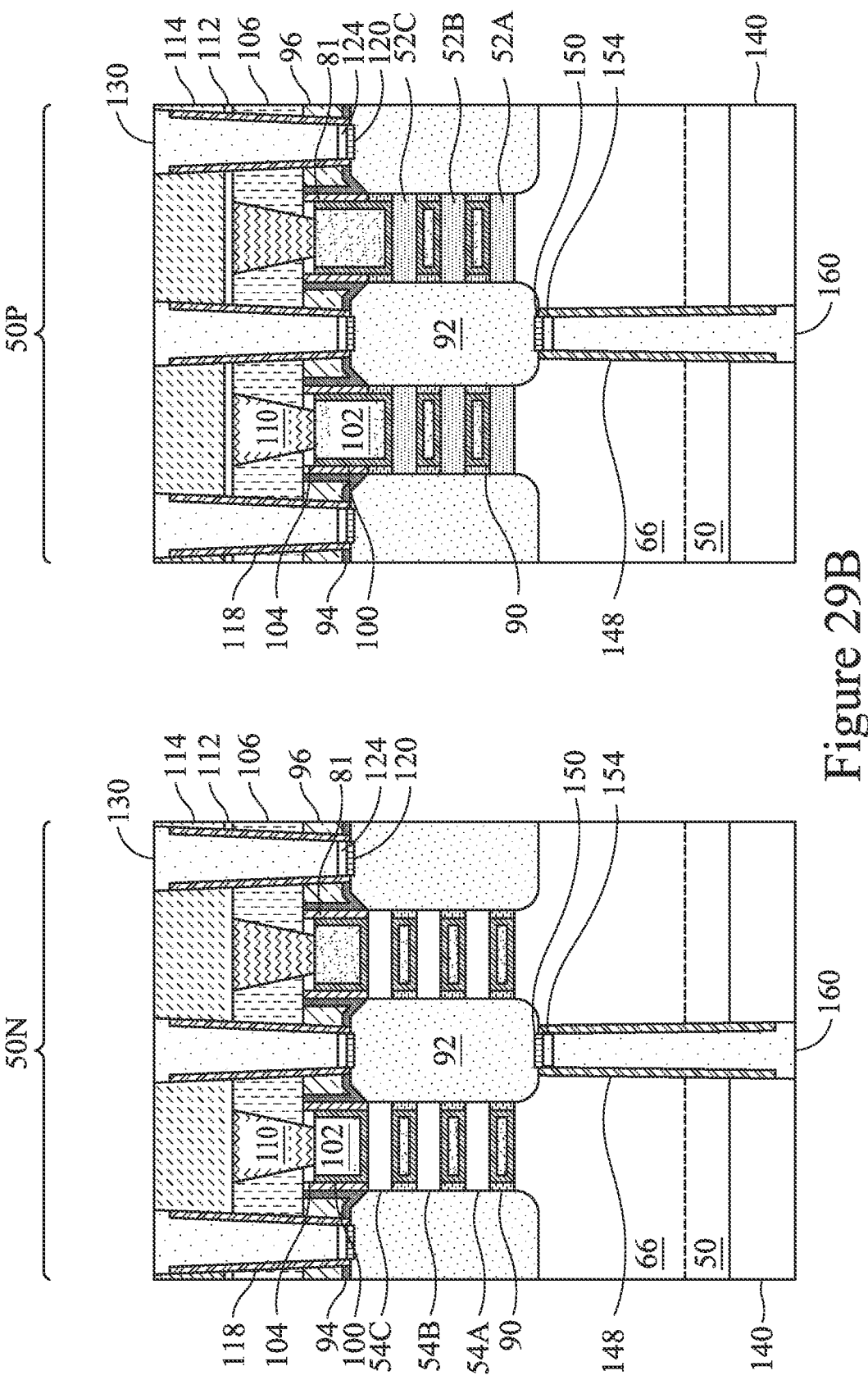
Figure 29C:
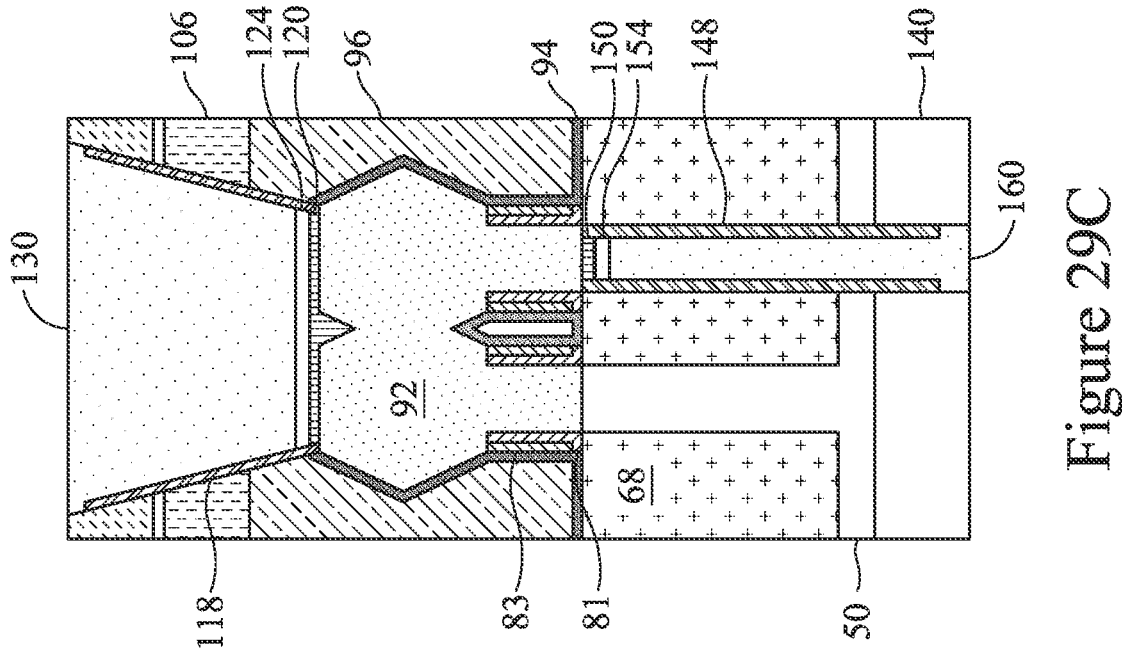

In FIGS. 29A-29C, silicide regions 154 and contacts 160 (may also be referred to as contact plugs, source/drain contacts, source/drain contact plugs, or back-side contacts) are formed in the fifth recesses 144. For example, after forming the epitaxial caps 150 and removing the nodules 150N, 150P, silicide regions 154 are formed on the epitaxial source/drain regions 92 (e.g., on the epitaxial caps 150). In some embodiments, the silicide regions 154 are formed by first depositing a metal (not specifically illustrated) capable of reacting with the semiconductor materials of the underlying epitaxial caps 150 (e.g., silicon, silicon germanium, germanium) to form silicide and/or germanide regions, such as nickel, cobalt, titanium, tantalum, platinum, tungsten, other noble metals, other refractory metals, rare earth metals or their alloys, over the exposed portions of the epitaxial source/drain regions 92 (e.g., the epitaxial caps 150), then performing a thermal anneal process to form the silicide regions 154. The unreacted portions of the deposited metal are then removed, e.g., by an etching process. Although the silicide regions 154 are referred to as silicide regions, as noted above, the silicide regions 154 may also be germanide regions, or silicon germanide regions (e.g., regions comprising silicide and germanide). In an embodiment, the silicide region 154 comprises TiSi.

The contacts 160 may each comprise one or more layers, such as barrier layers, diffusion layers, and fill materials. For example, in some embodiments, the contacts 160 each include a barrier layer and a conductive material, and is electrically coupled to the underlying conductive feature (e.g., the silicide region 154 in the illustrated embodiment). The contacts 160 are electrically coupled to the silicide regions 154 and may be referred to as source/drain contacts. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the insulator layer 140.

In accordance with some embodiments (not specifically illustrated), a back-side interconnect structure is formed over the structure and electrically connected through the contacts 160 to the active devices (e.g., the nano-FETs). In particular, although not specifically illustrated, the back-side interconnect structure may be formed similarly as the front-side interconnect structure, and external connectors may be formed over the back-side interconnect structure and/or the front-side interconnect structure.

FIGS. 30A-30C illustrate cross-sectional views of a device according to some alternative embodiments. FIG. 30A illustrates reference cross-section A-A' illustrated in FIG. 1. FIG. 30B illustrates reference cross-section B-B' illustrated in FIG. 1. FIG. 30C illustrates reference cross-section C-C' illustrated in FIG. 1. In FIGS. 30A-30C, like reference numerals indicate like elements formed by like processes as the structure of FIGS. 29A-29C. However, in FIGS. 30A-30C, channel regions in the n-type region 50N and the p-type region 50P comprise a same material. For example, the second nanostructures 54, which comprise silicon, provide channel regions for p-type nano-FETs in the p-type region 50P and for n-type nano-FETs in the n-type region 50N. The structure of FIGS. 30A-30C may be formed, for example, by removing the first nanostructures 52 from both the p-type region 50P and the n-type region 50N simultaneously; depositing the gate dielectric layers 100 and the gate electrodes 102P (e.g., gate electrode suitable for a p-type nano-FET) around the second nanostructures 54 in the p-type region 50P; and depositing the gate dielectric layers 100 and the gate electrodes 102N (e.g., a gate electrode suitable for a n-type nano-FET) around the second nanostructures 54 in the n-type region 50N. In such embodiments, materials of the epitaxial source/drain regions 92 may be different in the n-type region 50N compared to the p-type region 50P as explained above.

Embodiments may achieve advantages. For example, epitaxial processes such as formation of epitaxial source/drain regions 92 and formation of epitaxial caps 120, 150 may result in non-crystalline nodules (e.g., the nodules 92N, 92P, 120N, 120P, 150N, 150P) of epitaxial material being deposited in undesired locations. In particular, embodiment cleaning processes may be chosen and adjusted to remove the nodules based on the epitaxial material, quantity, total volume, individual size, surface area of coverage, and the like. The cleaning processes selectively etch and remove the nodules while preventing unwanted damage or etching of exposed portions of the epitaxial source/drain regions 92 and other features. The resulting semiconductor devices may be fabricated at a greater yield and efficiency and have a more robust performance and reliability.

In an embodiment, a method includes forming a first semiconductor fin and a second semiconductor fin over a front-side of a substrate; etching a first recess in the first semiconductor fin and a second recess in the second semiconductor fin; forming a first epitaxial region in the first recess and first epitaxial nodules along sidewalls of the first recess; forming a second epitaxial region in the second recess and second epitaxial nodules along sidewalls of the second recess; flowing first precursors to remove the first epitaxial nodules; depositing an interlayer dielectric over the first epitaxial region and the second epitaxial region; etching a first opening in the interlayer dielectric to expose the first epitaxial region; forming a first epitaxial cap on the first epitaxial region and third epitaxial nodules over the interlayer dielectric; and flowing second precursors to remove the third epitaxial nodules. In another embodiment, the first epitaxial region comprises a first material in crystalline form, and wherein each of the first epitaxial nodules comprise the first material in a non-crystalline form. In another embodiment, the first precursors comprise fluorine gas and ammonia. In another embodiment, the first precursors are free of chlorine. In another embodiment, the first epitaxial region comprises crystalline silicon. In another embodiment, the method further includes, after depositing the interlayer dielectric: thinning a back-side of the substrate; etching a second opening through the back-side of the substrate to expose the second epitaxial region; forming a second epitaxial cap on the second epitaxial region and fourth epitaxial nodules over the back-side of the substrate; and flowing third precursors to remove the fourth epitaxial nodules. In another embodiment, the second epitaxial region comprises silicon germanium, and wherein the second epitaxial cap comprises silicon germanium. In another embodiment, the third precursors comprise fluorine gas and hydrogen fluoride.

In an embodiment, a method includes forming a source/drain region in a fin; forming a gate structure over the fin; depositing a dielectric layer over the source/drain region and the gate structure; etching an opening in the dielectric layer to expose the source/drain region; forming a dielectric liner over the dielectric layer and over the source/drain region in the opening; etching a portion of the dielectric liner to expose the source/drain region; forming an epitaxial cap over the source/drain region, the epitaxial cap comprising a crystalline form of a first epitaxial material; flowing first precursors over the epitaxial cap, the first precursors having a higher etch selectivity to an amorphous form of the first epitaxial material than to the crystalline form of the first epitaxial material; converting at least a portion of the epitaxial cap into a silicide region; and forming a contact plug over the silicide region within the opening. In another embodiment, forming the epitaxial cap comprises forming first epitaxial nodules along a remaining portion of the dielectric liner within the opening, and wherein the first epitaxial nodules comprise the first epitaxial material in at least one of an amorphous form and a polycrystalline form. In another embodiment, the epitaxial cap comprises silicon, and wherein the first precursors comprise fluorine gas and ammonia gas. In another embodiment, the epitaxial cap comprises silicon germanium, and wherein the first precursors comprise fluorine gas and hydrogen fluoride gas. In another embodiment, the dielectric liner has a first roughness before forming the epitaxial cap, wherein the dielectric liner has a second roughness after flowing the first precursors, and wherein the second roughness is greater than the first roughness. In another embodiment, the second roughness is two to five times the first roughness. In another embodiment, forming the source/drain region includes forming a crystalline form of a second epitaxial material; and depositing second epitaxial nodules along a gate spacer, the second epitaxial nodules comprising a non-crystalline form of the second epitaxial material. In another embodiment, the method further includes flowing second precursors over the source/drain region, the second precursors having a higher etch selectivity to the second epitaxial nodules than to the source/drain region.

In an embodiment, a structure includes a source/drain region over a semiconductor fin; a gate structure over the semiconductor fin and adjacent to the source/drain region, the gate structure comprising a gate spacer layer, the gate spacer layer having a first roughness; first dielectric layers over the source/drain region; a first contact plug being electrically coupled to the source/drain region and extending through the first dielectric layers; and a first nitride liner interposed between the first contact plug and the first dielectric layers, the first nitride liner having a second roughness, the second roughness being less than the first roughness. In another embodiment, the structure further includes a second contact plug electrically coupled to the source/drain region and extending through the semiconductor fin. In another embodiment, the structure further includes a second nitride liner interposed between the second contact plug and the semiconductor fin, wherein the second nitride liner has a third roughness being less than the first roughness. In another embodiment, the second nitride liner extends along the semiconductor fin and along an isolation region adjacent to the semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first semiconductor fin and a second semiconductor fin over a front-side of a substrate;
    etching a first recess in the first semiconductor fin;
    forming a first epitaxial region in the first recess and first epitaxial nodules over the first semiconductor fin;
    flowing first precursors to remove the first epitaxial nodules;
    depositing an interlayer dielectric over the first epitaxial region;
    etching a first opening in the interlayer dielectric to expose the first epitaxial region;
    forming a first epitaxial cap on the first epitaxial region and third epitaxial nodules over the interlayer dielectric; and
    flowing second precursors to remove the third epitaxial nodules.

2. The method of claim 1, wherein the first epitaxial region comprises a first material in crystalline form, and wherein each of the first epitaxial nodules comprises the first material in a non-crystalline form.

3. The method of claim 1, wherein the first precursors comprise fluorine gas and ammonia.

4. The method of claim 3, wherein the first precursors are free of chlorine.

5. The method of claim 3, wherein the first epitaxial region comprises crystalline silicon.

6. The method of claim 1, further comprising, after depositing the interlayer dielectric:
    thinning a back-side of the substrate;
    etching a second opening through the back-side of the substrate to expose a second epitaxial region in the second semiconductor fin;
    forming a second epitaxial cap on the second epitaxial region and fourth epitaxial nodules over the back-side of the substrate; and
    flowing third precursors to remove the fourth epitaxial nodules.

7. The method of claim 6, wherein the second epitaxial region comprises silicon germanium, and wherein the second epitaxial cap comprises silicon germanium.

8. The method of claim 6, wherein the third precursors comprise fluorine gas and hydrogen fluoride.

9. A method comprising:
    forming a source/drain region in a fin;
    forming a gate structure over the fin;
    depositing a dielectric layer over the source/drain region and the gate structure;
    etching an opening in the dielectric layer to expose the source/drain region;
    forming a dielectric liner over the dielectric layer and over the source/drain region in the opening;
    etching a portion of the dielectric liner to expose the source/drain region;
    forming an epitaxial cap over the source/drain region, the epitaxial cap comprising a crystalline form of a first epitaxial material;
    flowing first precursors over the epitaxial cap, the first precursors having a higher etch selectivity to an amorphous form of the first epitaxial material than to the crystalline form of the first epitaxial material;
    converting at least a portion of the epitaxial cap into a silicide region; and
    forming a contact plug over the silicide region within the opening.

10. The method of claim 9, wherein forming the epitaxial cap comprises forming first epitaxial nodules along a remaining portion of the dielectric liner within the opening, and wherein the first epitaxial nodules comprise the first epitaxial material in at least one of an amorphous form or a polycrystalline form.

11. The method of claim 9, wherein the epitaxial cap comprises silicon, and wherein the first precursors comprise fluorine gas and ammonia gas.

12. The method of claim 9, wherein the epitaxial cap comprises silicon germanium, and wherein the first precursors comprise fluorine gas and hydrogen fluoride gas.

13. The method of claim 9, wherein the dielectric liner has a first roughness before forming the epitaxial cap, wherein the dielectric liner has a second roughness after flowing the first precursors, and wherein the second roughness is greater than the first roughness.

14. The method of claim 13, wherein the second roughness is two to five times the first roughness.

15. The method of claim 9, wherein forming the source/drain region comprises:

forming a crystalline form of a second epitaxial material; and depositing second epitaxial nodules along a gate spacer, the second epitaxial nodules comprising a non-crystalline form of the second epitaxial material.

16. The method of claim 15, further comprising flowing second precursors over the source/drain region, the second precursors having a higher etch selectivity to the second epitaxial nodules than to the source/drain region.

17. A method comprising:

forming a dummy gate structure over a fin;

forming a gate spacer over the fin and along the dummy gate structure;

etching a recess in the fin adjacent to the gate spacer;

forming an epitaxial region in the recess and epitaxial nodules along a sidewall of the gate spacer, the sidewall comprising first portions covered by the epitaxial nodules and second portions exposed between the epitaxial nodules; and performing an etch process to remove the epitaxial nodules, performing the etch process comprising etching the second portions of the sidewall of the gate spacer.

18. The method of claim 17, wherein performing the etch process comprises increasing a roughness of the sidewall.

19. The method of claim 17, wherein the epitaxial region comprises a crystalline material, and wherein the epitaxial nodules comprise a non-crystalline material.

20. The method of claim 17, wherein the etch process utilizes etchants comprising at least one of fluorine gas or ammonia.

* * * * *